(12) United States Patent
Kim et al.

(10) Patent No.: US 12,272,296 B2
(45) Date of Patent: Apr. 8, 2025

(54) DISPLAY DEVICE

(71) Applicant: Samsung Display Co., LTD., Yongin-si (KR)

(72) Inventors: Hyun Joon Kim, Hwaseong-si (KR); Kye Uk Lee, Seoul (KR); Sang Jin Jeon, Hwaseong-si (KR); Jung Hwan Hwang, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/066,111

(22) Filed: Dec. 14, 2022

(65) Prior Publication Data

US 2023/0230533 A1    Jul. 20, 2023

(30) Foreign Application Priority Data

Jan. 17, 2022 (KR) .................. 10-2022-0006646
Apr. 7, 2022 (KR) .................. 10-2022-0043383

(51) Int. Cl.
*G09G 3/32*    (2016.01)
*H01L 23/00*    (2006.01)
(Continued)

(52) U.S. Cl.
CPC ............. *G09G 3/32* (2013.01); *H01L 25/167* (2013.01); *H01L 27/124* (2013.01); *G09G 2300/026* (2013.01); *G09G 2300/0426* (2013.01); *G09G 2300/0819* (2013.01); *G09G 2300/0852* (2013.01); *G09G 2300/0861* (2013.01); *G09G 2310/0259* (2013.01); *H01L 24/05* (2013.01);
(Continued)

(58) Field of Classification Search
CPC ..... G09G 3/32–3291; G09G 2300/0804–0876
See application file for complete search history.

(56) References Cited

U.S. PATENT DOCUMENTS 9,972,248 B2 * 5/2018 Yang ..................... G09G 3/3233
10,032,411 B2 * 7/2018 Jeon ..................... G09G 3/3266
(Continued)

FOREIGN PATENT DOCUMENTS

CN    115798393 A    3/2023
EP    4 170 642 A1    4/2023
(Continued)

*Primary Examiner* — Dorothy Harris
(74) *Attorney, Agent, or Firm* — Womble Bond Dickinson (US) LLP

(57) ABSTRACT

A display device includes a scan write line configured to receive a scan write signal, a scan initialization line configured to receive a scan initialization signal, a sweep signal line configured to receive a sweep signal, a first data line configured to receive a first data voltage, a second data line configured to receive a second data voltage, and a subpixel connected to the scan write line, the scan initialization line, the sweep signal line, the first data line, and the second data line. The subpixel includes a light-emitting element, a first pixel driver including a first transistor configured to generate a control current according to the first data voltage of the first data line, and a second pixel driver including an eighth transistor configured to generate a driving current applied to the light-emitting element according to the second data voltage.

17 Claims, 22 Drawing Sheets

(51) Int. Cl.
*H01L 25/16* (2023.01)
*H01L 27/12* (2006.01)

(52) U.S. Cl.
CPC .... *H01L 24/16* (2013.01); *H01L 2224/05073* (2013.01); *H01L 2224/05124* (2013.01); *H01L 2224/05144* (2013.01); *H01L 2224/05147* (2013.01); *H01L 2224/05155* (2013.01); *H01L 2224/05166* (2013.01); *H01L 2224/05171* (2013.01); *H01L 2224/05179* (2013.01); *H01L 2224/0518* (2013.01); *H01L 2224/05561* (2013.01); *H01L 2224/05573* (2013.01); *H01L 2224/05686* (2013.01); *H01L 2224/16145* (2013.01); *H01L 2924/013* (2013.01); *H01L 2924/0549* (2013.01); *H01L 2924/12041* (2013.01)

(56) References Cited

U.S. PATENT DOCUMENTS

| | | | |
|---|---|---|---|
| 10,290,260 B2* | 5/2019 | Wu | H10K 50/81 |
| 10,706,766 B2* | 7/2020 | Kim | G09G 3/2014 |
| 10,713,996 B2* | 7/2020 | Kim | H01L 25/167 |
| 10,825,380 B2* | 11/2020 | Kim | H01L 25/0753 |
| 11,056,047 B2* | 7/2021 | Shigeta | G09G 3/2014 |
| 11,495,171 B2* | 11/2022 | Kim | G09G 3/32 |
| 11,514,842 B2* | 11/2022 | Jung | H01L 25/0753 |
| 2004/0207614 A1* | 10/2004 | Yamashita | G09G 3/3258 345/211 |
| 2016/0155385 A1* | 6/2016 | Yang | G06F 3/042 345/174 |
| 2016/0260379 A1* | 9/2016 | Jeon | G09G 3/3266 |
| 2018/0190631 A1* | 7/2018 | Kim | G06F 3/1446 |
| 2018/0261160 A1* | 9/2018 | Wu | H10K 50/81 |
| 2018/0301080 A1* | 10/2018 | Shigeta | G09G 3/32 |
| 2019/0006335 A1* | 1/2019 | Lee | H01L 33/60 |
| 2019/0371231 A1* | 12/2019 | Kim | G09G 3/2081 |
| 2020/0091273 A1 | 3/2020 | Lee et al. | |
| 2020/0111403 A1* | 4/2020 | Kim | G09G 3/32 |
| 2020/0111404 A1* | 4/2020 | Kim | G09G 3/2011 |
| 2020/0161407 A1* | 5/2020 | Ka | H01L 27/1255 |
| 2020/0265777 A1* | 8/2020 | Shigeta | G09G 3/3233 |
| 2020/0312216 A1* | 10/2020 | Kim | G09G 3/32 |
| 2020/0394953 A1* | 12/2020 | Kim | H05B 45/33 |
| 2021/0118963 A1* | 4/2021 | Bang | H10K 59/126 |
| 2021/0126070 A1 | 4/2021 | Kim | |
| 2021/0202907 A1 | 7/2021 | Lee et al. | |
| 2021/0210002 A1* | 7/2021 | Kim | G09G 3/2014 |
| 2021/0210003 A1* | 7/2021 | Kim | G09G 3/2014 |
| 2021/0241682 A1* | 8/2021 | Jung | H01L 27/156 |
| 2021/0384289 A1 | 12/2021 | Li et al. | |
| 2022/0327995 A1* | 10/2022 | Kim | G09G 3/2014 |
| 2023/0012711 A1* | 1/2023 | Kim | H01L 25/0753 |
| 2023/0018546 A1* | 1/2023 | Kim | G06F 3/14 |
| 2023/0024912 A1* | 1/2023 | Kim | G09G 3/3233 |
| 2023/0078842 A1* | 3/2023 | Kim | H10K 59/1213 257/443 |
| 2023/0082959 A1* | 3/2023 | Jeong | G06F 3/1446 345/55 |
| 2023/0107775 A1* | 4/2023 | Kim | G09G 3/2003 345/83 |
| 2023/0119036 A1* | 4/2023 | Hwang | G09G 3/2081 345/204 |
| 2023/0120477 A1* | 4/2023 | Hwang | G09G 3/2011 345/76 |
| 2023/0121681 A1* | 4/2023 | Hwang | G09G 3/32 345/55 |
| 2023/0154372 A1* | 5/2023 | Hwang | G09G 3/32 345/691 |
| 2023/0186836 A1* | 6/2023 | Jeong | G09G 3/32 345/55 |
| 2023/0216003 A1* | 7/2023 | Lee | H01L 33/42 257/79 |
| 2023/0230533 A1* | 7/2023 | Kim | H01L 25/167 345/211 |
| 2023/0230957 A1* | 7/2023 | Kim | H01L 25/167 345/690 |
| 2023/0237954 A1* | 7/2023 | Lee | H01L 25/0753 345/206 |
| 2023/0238372 A1* | 7/2023 | Lee | H01L 27/124 |
| 2023/0238398 A1* | 7/2023 | Choi | H01L 24/05 |
| 2023/0238487 A1* | 7/2023 | Hwang | H01L 33/382 257/79 |
| 2023/0238496 A1* | 7/2023 | Bok | H01L 25/167 257/79 |
| 2023/0238497 A1* | 7/2023 | Lee | H01L 25/0753 257/79 |
| 2023/0246147 A1* | 8/2023 | Bok | H01L 25/167 257/79 |

FOREIGN PATENT DOCUMENTS

| | | | | |
|---|---|---|---|---|
| KR | 20190079283 A | * | 7/2019 | ......... G02F 1/13336 |
| KR | 10-2023-0038351 A | | 3/2023 | |

* cited by examiner

ACT: AP1, AP2, AP3, AP4

ACT: AP1, AP2, AP3, AP4

DISPLAY DEVICE

CROSS-REFERENCE TO RELATED APPLICATION

This application claims priority to, and the benefit of, Korean Patent Application No. 10-2022-0006646 filed on Jan. 17, 2022, and Korean Patent Application No. 10-2022-0043383 filed on Apr. 7, 2022 in the Korean Intellectual Property Office (KIPO), the entire contents of both of which are incorporated by reference herein.

BACKGROUND

1. Field

The present disclosure relates to a display device.

2. Description of the Related Art

With the advancement of an information-oriented society, various requirements for display devices for displaying an image are increasing. The display device may be a flat panel display device, such as a liquid crystal display device, a field emission display device, or a light-emitting display panel device. A light-emitting display device may include an organic light-emitting diode (OLED) display device including OLEDs serving as light-emitting elements or an LED display device including inorganic LEDs such as LEDs serving as light-emitting elements.

SUMMARY

Aspects and features of embodiments of the present disclosure provide a display device with a reduced resistance of a line through which a driving current flows in each of subpixels.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to one or more embodiments of the present disclosure, there is provided a display device including a scan write line configured to receive a scan write signal, a scan initialization line configured to receive a scan initialization signal, a sweep signal line configured to receive a sweep signal, a first data line configured to receive a first data voltage, a second data line configured to receive a second data voltage, and a subpixel connected to the scan write line, the scan initialization line, the sweep signal line, the first data line, and the second data line. The subpixel includes a light-emitting element, a first pixel driver including a first transistor configured to generate a control current according to the first data voltage of the first data line, a second pixel driver including an eighth transistor configured to generate a driving current applied to the light-emitting element according to the second data voltage of the second data line, and a third pixel driver configured to control a period in which the driving current is applied to the light-emitting element according to the control current of the first pixel driver, the third pixel driver includes a fifteenth transistor electrically connected to one electrode of the eighth transistor, and the display device further includes a bridge electrode connecting the one electrode of the eighth transistor and one electrode of the fifteenth transistor that are spaced from each other.

The display device may further include a scan control line configured to receive a scan control signal, and a gate-off voltage line configured to receive a gate-off voltage. The scan control line, the sweep signal line, and the gate-off voltage line may be located between the one electrode of the eighth transistor and the one electrode of the fifteenth transistor.

The first pixel driver may further include a seventh transistor configured to connect the sweep signal line to the gate-off voltage line according to the scan control signal. The bridge electrode may overlap the sweep signal line, the gate-off voltage line, and the scan control line.

The scan write line and the scan initialization line may extend in a first direction, the first data line and the second data line may extend in a second direction intersecting the first direction, and the bridge electrode may extend in the second direction.

The one electrode of the eighth transistor may be connected to the bridge electrode through a first bridge connection electrode, and the one electrode of the fifteenth transistor may be connected to the bridge electrode through a fourth bridge connection electrode.

The first bridge connection electrode may be located between the sweep signal line and the scan write line.

The display device may further include a second emission line configured to receive a second emission signal, and a scan control line configured to receive a scan control signal. The third pixel driver may include a seventeenth transistor including a gate electrode connected to the second emission line and an eighteenth transistor configured to connect a first electrode of the light-emitting element to an initialization voltage line according to the scan control signal. One electrode of the seventeenth transistor may be spaced from one electrode of the eighteenth transistor.

The display device may further include a seventh connection electrode electrically connecting the one electrode of the seventeenth transistor and the one electrode of the eighteenth transistor.

The seventh connection electrode nay be electrically connected to the first electrode of the light-emitting element.

The display device may further include an eighth connection electrode connecting the other electrode of the fifteenth transistor and the one electrode of the seventeenth transistor.

The display device may further include a first emission line configured to receive a first emission signal, a second power line configured to receive a second power voltage, a fifth connection electrode connected to the second power line to receive the second power voltage, and a twelfth transistor configured to connect the second power line to the eighth transistor according to the first emission signal. One electrode of the twelfth transistor may be connected to the fifth connection electrode through a plurality of contact holes.

The first emission line may extend in a first direction. The other electrode of the twelfth transistor may extend in a second direction intersecting the first direction to overlap the first emission line.

The light-emitting element may be a flip chip type micro light-emitting diode element.

According to one or more embodiments of the present disclosure, there is provided a display device including a substrate, a first active pattern including an eighth channel, an eighth source electrode, and an eighth drain electrode that are on the substrate, a second active pattern including a fifteenth channel, a fifteenth source electrode, and a fifteenth drain electrode, a first insulating film on the first active pattern and the second active pattern, an eighth gate electrode and a third capacitor electrode on the first insulating film and overlapping the eighth channel, a second insulating film on the eighth gate electrode, a bridge electrode on the second insulating film, a fourth capacitor electrode overlapping the third capacitor electrode, a third insulating film on the bridge electrode and the fourth capacitor electrode, a first bridge connection electrode connecting the eighth drain electrode and the bridge electrode, and a fourth bridge connection electrode connecting the fifteenth source electrode and the bridge electrode, wherein the first bridge connection electrode and the fourth bridge connection electrode are on the third insulating film.

The first bridge connection electrode may be connected to the bridge electrode through a first bridge contact hole passing through the third insulating film and may be connected to the first active pattern through a second bridge contact hole passing through the third insulating film, the second insulating film, and the first insulating film. The fourth bridge connection electrode may be connected to the bridge electrode through a third bridge contact hole passing through the third insulating film and may be connected to the second active pattern through a fourth bridge contact hole passing through the third insulating film, the second insulating film, and the first insulating film.

The display device may further include a first emission line configured to receive a first emission signal, a sweep signal line configured to receive a sweep signal, and a second emission line configured to receive a second emission signal, the first emission line, the sweep signal line, and the second emission line being disposed on the third insulating film. The bridge electrode may cross the first emission line, the sweep signal line, and the second emission line.

The first active pattern may include a twelfth drain electrode connected to the eighth source electrode, a twelfth channel, and a twelfth source electrode. The display device may further include a fifth connection electrode on the third insulating film and connected to the twelfth source electrode through a contact hole. The number of contact holes of the fifth connection electrode may be greater than the number of first bridge contact holes of the first bridge connection electrode.

The second active pattern may further include a seventeenth source electrode connected to the fifteenth drain electrode, a seventeenth channel, and a seventeenth drain electrode.

The first active pattern may further include an eighteenth channel, an eighteenth source electrode, and an eighteenth drain electrode. The display device may further include a seventh connection electrode on the third insulating film and connecting the eighteenth drain electrode and the seventeenth drain electrode.

An overlapping area of the seventeenth connection electrode and the seventeenth drain electrode may be greater than an overlapping area of the seventh connection electrode and the eighteenth drain electrode.

The display device may further include an eighth connection electrode on the third insulating film and having contact holes for connecting the fifteenth drain electrode and the seventeenth source electrode.

The light-emitting element may be a flip chip type micro light-emitting diode element.

The substrate includes glass. The display device may further include a pad on a first surface of the substrate, and a side line on the first surface of the substrate, a second surface opposite to the first surface, and one side surface between the first surface and the second surface and connected to the pad.

According to one or more embodiments of the present disclosure, there is provided a tiled display device including a plurality of display devices, and a connection member between the plurality of display devices. A first display device of the plurality of display devices includes a substrate, a scan write line configured to receive a scan write signal, a scan initialization line configured to receive a scan initialization signal, a sweep signal line configured to receive a sweep signal, a first data line configured to receive a first data voltage, a second data line a second data voltage, and a subpixel connected to the scan write line, the scan initialization line, the sweep signal line, the first data line, and the second data line, wherein the scan write line, the scan initialization line, the sweep signal line, the first data line, and the second data line are on a first surface of the substrate. The subpixel includes light-emitting elements, a first pixel driver including a first transistor configured to generate a control current according to the first data voltage of the first data line, a second pixel driver including an eighth transistor configured to generate a driving current applied to the light-emitting element according to the second data voltage of the second data line, and a third pixel driver configured to control a period in which the driving current is applied to the light-emitting element according to the control current of the first pixel driver, wherein the third pixel driver includes a fifteenth transistor electrically connected to one electrode of the eighth transistor. The display device further includes a bridge electrode connecting the one electrode of the eighth transistor and one electrode of the fifteenth transistor that are spaced from each other.

Each of the light-emitting elements may be a flip chip type micro light-emitting diode element.

The substrate includes glass.

The first display device may further include a pad on the first surface of the substrate, and a side line on the first surface of the substrate, a second surface opposite to the first surface, and one side surface between the first surface and the second surface and connected to the pad.

The first display device may further include a connection line on the second surface of the substrate and a flexible film connected to the connection line through a conductive adhesive member. The side line may be connected to the connection line.

The plurality of display devices may be arranged in a matrix form in M rows and N columns.

According to the aforementioned and other embodiments of the present disclosure, an active layer is connected through a metal electrode having a lower sheet resistance than the active layer, thereby minimizing a resistance of a line through which a driving current flows.

BRIEF DESCRIPTION OF THE DRAWINGS

The above and other embodiments and features of the present disclosure will become more apparent by describing embodiments thereof with reference to the attached drawings, in which.

DETAILED DESCRIPTION

Figure 1:
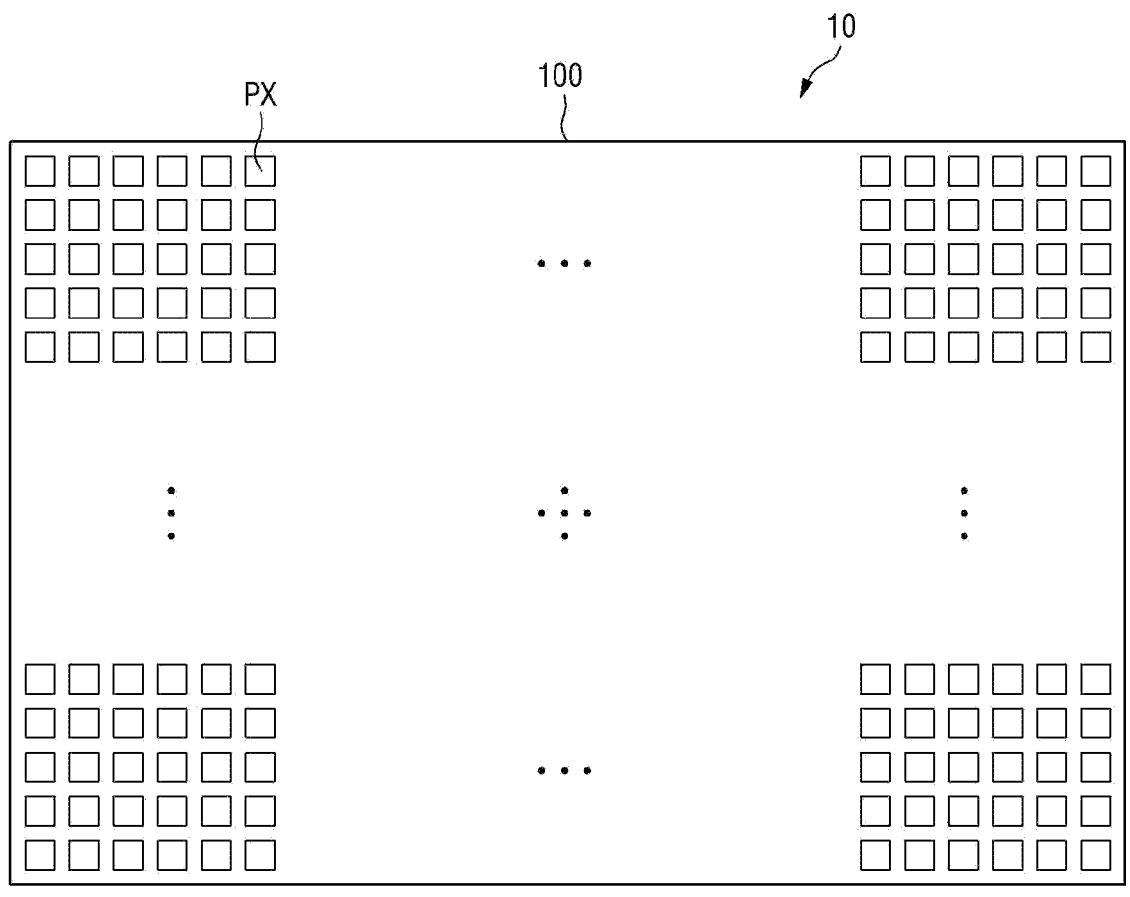
FIG. 1 is a plan view illustrating a display device according to one or more embodiments.
Figure 1:
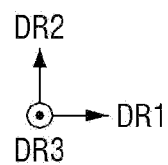

Aspects and features of embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure might not be described.

Unless otherwise noted, like reference numerals, characters, or combinations thereof denote like elements throughout the attached drawings and the written description, and thus, descriptions thereof will not be repeated. Further, parts not related to the description of one or more embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
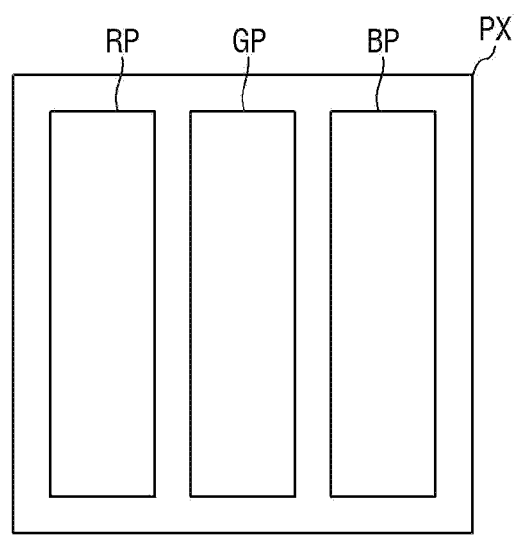
FIG. 2 is a view illustrating an example of a pixel of FIG. 1.
Figure 2:
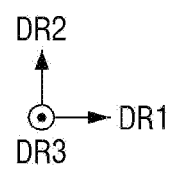
Figure 3:
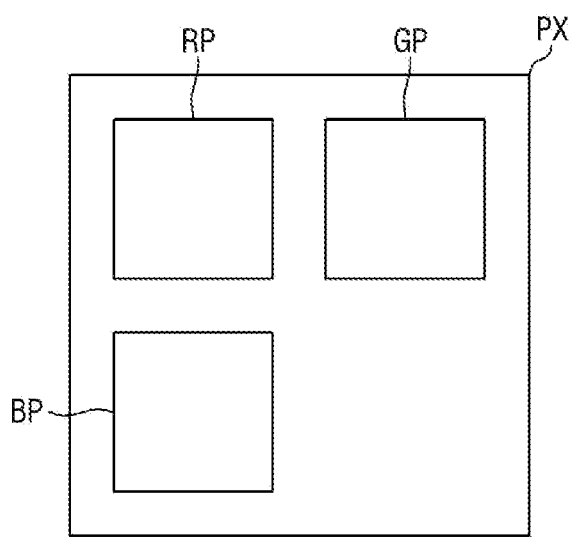
FIG. 3 is a view illustrating another example of a pixel of FIG. 1.
Figure 3:
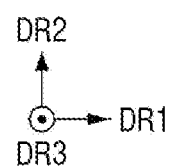

FIG. 1 is a plan view illustrating a display device according to one or more embodiments. FIG. 2 is a view illustrating an example of a pixel of FIG. 1. FIG. 3 is a view illustrating another example of a pixel of FIG. 1.

Referring to FIGS. 1 to 3, a display device 10 is a device that displays a video or a still image. The display device 10 may be used in portable electronic devices such as a mobile phone, a smartphone, a tablet personal computer (PC), a smart watch, a watch phone, a mobile communication terminal, an electronic notebook, an electronic book reader, a portable multimedia player (PMP), a navigation device, and an ultra-mobile PC (UMPC) and may also be used as a display screen of various products such as a television (TV), a laptop computer, a monitor, a billboard, and a device for the Internet of Things (IoT).

A display panel 100 may be formed in a rectangular planar shape having long sides in a first direction DR1 and short sides in a second direction DR2 intersecting the first direction DR1. A corner at which the long side in the first direction DR1 meets the short side in the second direction DR2 may be rounded to have a certain curvature or may be formed to have a right angle. A planar shape of the display panel 100 is not limited to a quadrangular shape, and the display panel 100 may be formed in other polygonal, circular, or oval shapes. The display panel 100 may be formed to be flat, but the present disclosure is not limited thereto. For example, the display panel 100 may include curved portions that are formed at left and right end portions and have a constant curvature or a variable curvature. In addition, the display panel 100 may be flexibly formed to be bendable, foldable, and/or rollable.

The display panel 100 may further include pixels PX, scan lines extending in the first direction DR1, and data lines extending in the second direction DR2 to display an image. The pixels PX may be arranged in a matrix form in the first direction DR1 and the second direction DR2. For example, the pixels PX may be arranged along rows and columns of a matrix.

Each of the pixels PX may include a plurality of subpixels RP, GP, and BP as shown in FIGS. 2 and 3. In FIGS. 2 and 3, each of the pixels PX is illustrated as including three subpixels RP, GP, and BP, that is, a first subpixel RP, a second subpixel GP, and a third subpixel BP, but embodiments of the present specification are not limited thereto.

The first subpixel RP, the second subpixel GP, and the third subpixel BP may be connected to any one data line of the data lines and at least one scan line of the scan lines.

Each of the first subpixel RP, the second subpixel GP, and the third subpixel BP may have a rectangular, square, or rhombic planar shape. For example, as shown in FIG. 2, each of the first subpixel RP, the second subpixel GP, and the third subpixel BP may have a rectangular planar shape having short sides in the first direction DR1 and long sides in the second direction DR2. Alternatively, as shown in FIG. 3, each of the first subpixel RP, the second subpixel GP, and the third subpixel BP may have a square, or rhombic planar shape which has sides having the same length in the first direction DR1 and the second direction DR2.

As shown in FIG. 2, the first subpixel RP, the second subpixel GP, and the third subpixel BP may be arranged along the first direction DR1. Alternatively, the first subpixel RP and any one of the second subpixel GP and the third subpixel BP may be arranged along the first direction DR1, and the other one thereof and the first subpixel RP may be arranged along the second direction DR2. For example, as shown in FIG. 3, the first subpixel RP and the second subpixel GP may be arranged along the first direction DR1, and the first subpixel RP and the third subpixel BP may be arranged along the second direction DR2.

Alternatively, the second subpixel GP and any one of the first subpixel RP and the third subpixel BP may be arranged along the first direction DR1, and the other one thereof and the second subpixel GP may be arranged along the second direction DR2. Alternatively, the third subpixel BP and any one of the first subpixel RP and the second subpixel GP may be arranged along the first direction DR1, and the other one thereof and the third subpixel BP may be arranged along the second direction DR2.

The first subpixel RP may include a first light-emitting element that emits first light, the second subpixel GP may include a second light-emitting element that emits second light, and the third subpixel BP may include a third light-emitting element that emits third light. Here, the first light may be light in a red wavelength band, the second light may be light in a green wavelength band, and the third light may be light in a blue wavelength band. The red wavelength band may be a wavelength band of about 600 nm to 750 nm, the green wavelength band may be a wavelength band of about 480 nm to 560 nm, and the blue wavelength band may be a wavelength band of about 370 nm to 460 nm, but embodiments of the present specification are not limited thereto.

Each of the first subpixel RP, the second subpixel GP, and the third subpixel BP may include an inorganic light-emitting element including an inorganic semiconductor as a light-emitting element that emits light. For example, the inorganic light-emitting element may be a flip chip type micro light-emitting diode (LED), but embodiments of the present specification are not limited thereto.

As shown in FIGS. 2 and 3, an area of the first subpixel RP, an area of the second subpixel GP, and an area of the third subpixel BP may be substantially the same, but embodiments of the present specification are not limited thereto. At least one of the area of the first subpixel RP, the area of the second subpixel GP, and the area of the third subpixel BP may be different from another one thereof. Alternatively, any two of the area of the first subpixel RP, the area of the second subpixel GP, and the area of the third subpixel BP may be substantially the same, and the other one thereof may be different from the two. Alternatively, the area of the first subpixel RP, the area of the second subpixel GP, and the area of the third subpixel BP may be different.

Figure 4:
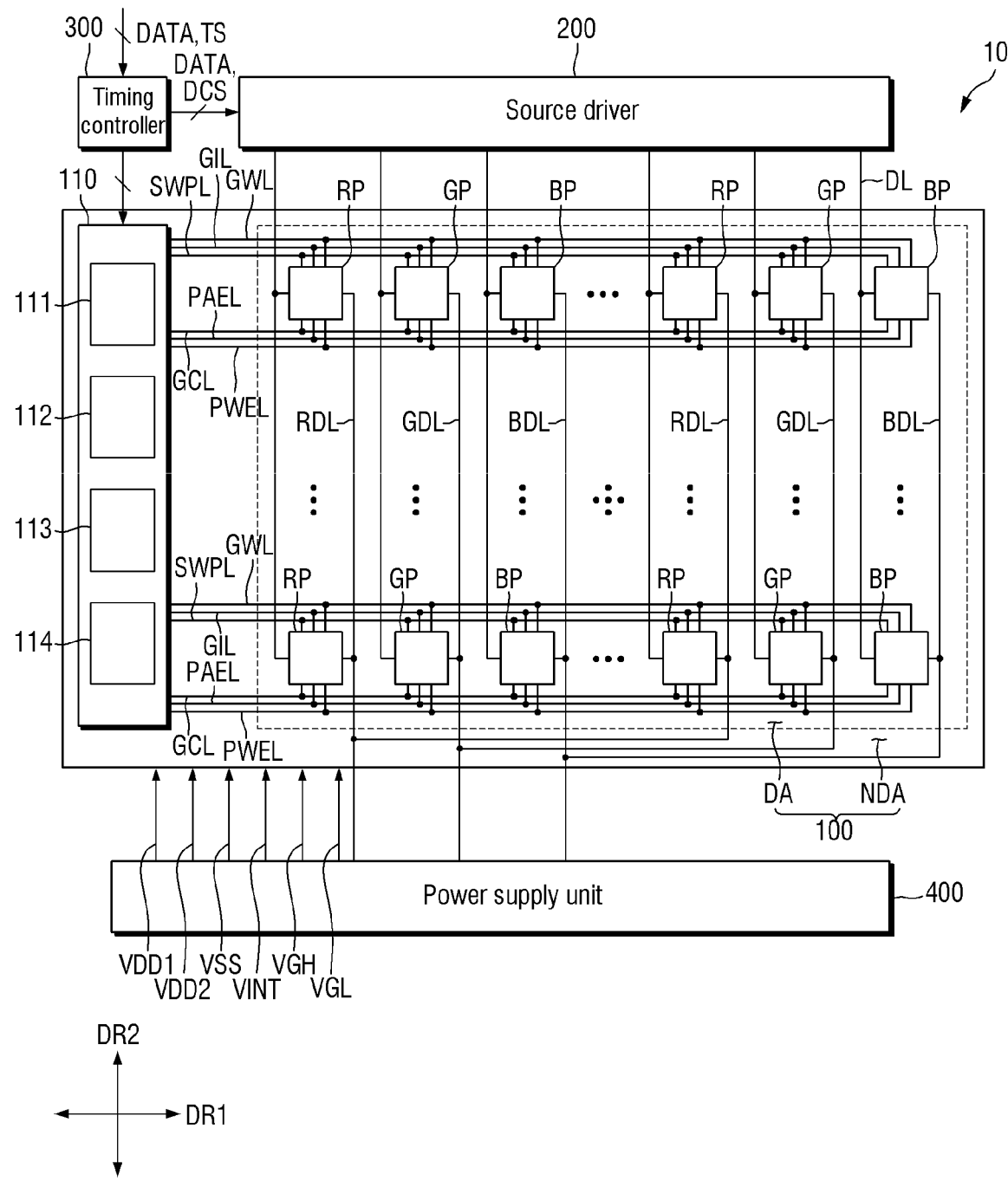
FIG. 4 is a block diagram illustrating a display device according to one or more embodiments.

FIG. 4 is a block diagram illustrating a display device according to one or more embodiments.

Referring to FIG. 4, a display device 10 includes a display panel 100, a scan driver 110, a source driver 200, a timing controller 300, and a power supply unit 400.

A display area DA of the display panel 100 may include subpixels RP, GP, and BP for displaying an image, scan write lines GWL connected to the subpixels RP, GP, and BP, scan initialization lines GIL, scan control lines GCL, sweep signal lines SWPL, pulse-width modulated (PWM) emission lines PWEL, pulse-amplitude modulated (PAM) emission lines PAEL, PWM data lines DL, first PAM data lines RDL, second PAM data lines GDL, and third PAM data lines BDL.

The scan write lines GWL, the scan initialization lines GIL, the scan control lines GCL, the sweep signal lines SWPL, the PWM emission lines PWEL, and the PAM emission lines PAEL may extend in a first direction DR1 and may be disposed along a second direction DR2 intersecting the first direction DR1. The PWM data lines DL, the first PAM data lines RDL, the second PAM data lines GDL, and the third PAM data lines BDL may extend in the second direction DR2 and may be disposed along the direction DR1. The first PAM data lines RDL are electrically connected to each other, the second PAM data lines GDL may be electrically connected to each other, and the third PAM data lines BDL may be electrically connected to each other.

Each of the subpixels RP, GP, and BP may be connected to any one of the scan write lines GWL, any one of the scan initialization lines GIL, any one of the scan control lines GCL, any one of the sweep signal lines SWPL, any one of the PWM emission lines PWEL, and any one of the PAM emission lines PAEL. In addition, each of first subpixels RP may be connected to any one of the PWM data lines DL and any one of the first PAM data lines RDL. Furthermore, each of second subpixels GP may be connected to any one of the PWM data lines DL and any one of the second PAM data lines GDL. In addition, each of third subpixels BP may be connected to any one of the PWM data lines DL and any one of the third PAM data lines BDL.

The scan driver 110 may be disposed in a non-display area of the display panel 100 to apply signals to the scan write lines GWL, the scan initialization lines GIL, the scan control lines GCL, the sweep signal lines SWPL, the PWM emission lines PWEL, and the PAM emission lines PAEL. In FIG. 4, the scan driver 110 is illustrated as being disposed at one side edge of the display panel 100, but the present disclosure is not limited thereto. The scan driver 110 may be disposed on each side edge of the display panel 100.

The scan driver 110 may include a first scan signal driver 111, a second scan signal driver 112, a sweep signal driver 113, and an emission signal driver 114.

The first scan signal driver 111 may receive a first scan driving control signal from the timing controller 300. The first scan signal driver 111 may output scan initialization signals to the scan initialization lines GIL and output scan write signals to the scan write lines GWL according to the first scan driving control signal. That is, the first scan signal driver 111 may output two types of scan signals, that is, scan initialization signals and scan write signals, together.

The second scan signal driver 112 may receive a second scan driving control signal from the timing controller 300. The second scan signal driver 112 may output scan control signals to the scan control lines GCL according to the second scan driving control signal.

The sweep signal driver 113 may receive a first emission control signal and a sweep control signal from the timing controller 300. The sweep signal driver 113 may output PWM emission signals to the PWM emission lines PWEL and output sweep signals to the sweep signal lines SWPL according to the first emission control signal. That is, the sweep signal driver 113 may output the PWM emission signals and the sweep signals together.

The emission signal driver 114 may receive a second emission control signal from the timing controller 300. The emission signal driver 114 may output PAM emission signals to the PAM emission lines PAEL according to the second emission control signal.

The timing controller 300 receives digital video data DATA and timing signals TS. The timing controller 300 may generate a scan timing control signal for controlling an operation timing of the scan driver 110 according to the timing signals TS. The scan timing control signal may generate the first scan driving control signal, the second scan driving control signal, the first emission control signal, the second emission control signal, and the sweep control signal. In addition, the timing controller 300 may generate a source control signal for controlling an operation timing of the source driver 200.

The timing controller 300 outputs the first scan driving control signal, the second scan driving control signal, the first emission control signal, the second emission control signal, and the sweep control signal to the scan driver 110. The timing controller 300 outputs the digital video data DATA and a PWM control signal DCS to the source driver 200.

The source driver 200 converts the digital video data DATA into analog PWM data voltages to output the analog PWM data voltages to the PWM data lines DL. Accordingly, the subpixels RP, GP, and BP may be selected by the scan write signals of the scan driver 110, and the PWM data voltages may be supplied to the selected subpixels RP, GP, and BP.

The power supply unit 400 may commonly output a first PAM data voltage to the first PAM data lines RDL, may commonly output a second PAM data voltage to the second PAM data lines GDL, and may commonly output a third PAM data voltage to the third PAM data lines BDL. In addition, the power supply unit 400 may generate a plurality of power voltages to output the plurality of power voltages to the display panel 100.

The power supply unit 400 may output a first power voltage VDD1, a second power voltage VDD2, a third power voltage VSS, an initialization voltage VINT, a gate-on voltage VGL, and a gate-off voltage VGH to the display panel 100. The first power voltage VDD1 and the second power voltage VDD2 may be high potential driving voltages for driving a light-emitting element of each of the subpixels RP, GP, and BP. The third power voltage VSS may be a low potential driving voltage for driving the light-emitting element of each of the subpixels RP, GP, and BP. The initialization voltage VINT and the gate-off voltage VGH may be applied to each of the subpixels RP, GP, and BP, and the gate-on voltage VGL and the gate-off voltage VGH may be applied to the scan driver 110.

Each of the source driver 200, the timing controller 300, and the power supply unit 400 may be formed as an integrated circuit. In addition, the source driver 200 may be formed as a plurality of integrated circuits.

Figure 5:
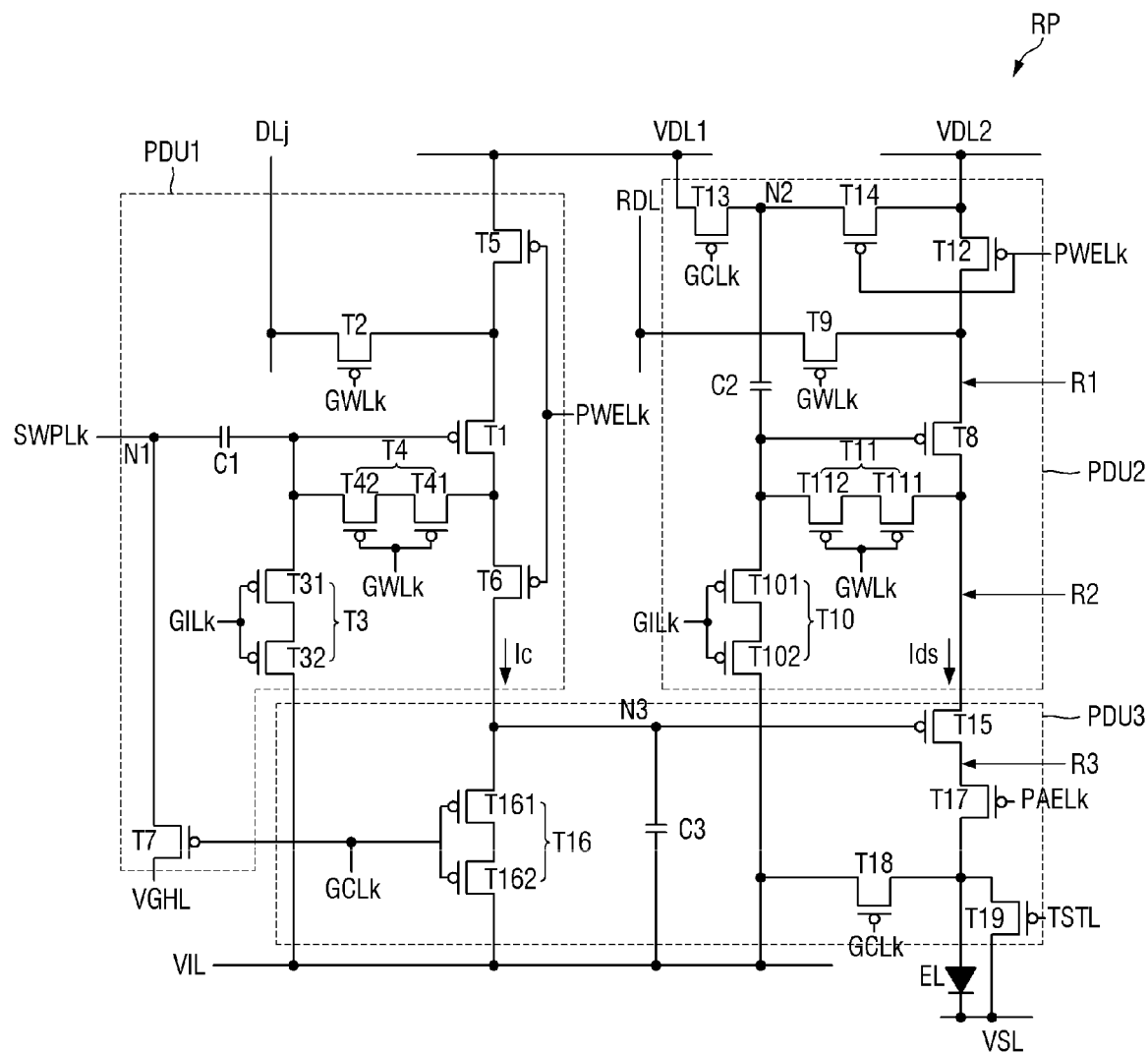
FIG. 5 is a circuit diagram illustrating a first subpixel according to one or more embodiments.

FIG. 5 is a circuit diagram illustrating a first subpixel according to one or more embodiments.

Referring to FIG. 5, a first subpixel RP according to one or more embodiments may be connected to a $k^{th}$ scan write line GWLk, a $k^{th}$ scan initialization line GILk, a $k^{th}$ scan control line GCLk, a $k^{th}$ sweep signal line SWPLk, a $k^{th}$ PWM emission line PWELk, and a $k^{th}$ PAM emission line PAELk (here, k is a positive integer). In addition, the first subpixel RP may be connected to a $j^{th}$ PWM data line DLj and a first PAM data line RDL. Furthermore, the first subpixel RP may be connected to a first power line VDL1 to which a first power voltage VDD1 is applied, a second power line VDL2 to which a second power voltage VDD2 is applied, a third power line VSL to which a third power voltage VSS is applied, an initialization voltage line VIL to which an initialization voltage VINT is applied, and a gate-off voltage line VGHL to which a gate-off voltage VGH is applied. For convenience of description, the $j^{th}$ PWM data line DLj may be referred to as a first data line, and the first PAM data line RDL may be referred to as a second data line.

The first subpixel RP may include a light-emitting element EL, a first pixel driver PDU1, a second pixel driver PDU2, and a third pixel driver PDU3.

The light-emitting element EL emits light according to a driving current Ids generated by the second pixel driver PDU2. The light-emitting element EL may be disposed between a seventeenth transistor T17 and the third power line VSL. A first electrode of the light-emitting element EL may be connected to a second electrode of the seventeenth transistor T17, and a second electrode thereof may be connected to the third power line VSL. The first electrode of the light-emitting element EL may be an anode, and the second electrode thereof may be a cathode. The light-emitting element EL may be an inorganic light-emitting element including a first electrode, a second electrode, and an inorganic semiconductor disposed between the first electrode and the second electrode. For example, the light-emitting element EL may be a micro LED made of an inorganic semiconductor but is not limited thereto.

The first pixel driver PDU1 generates a control current Ic according to a $j^{th}$ PWM data voltage of the $j^{th}$ PWM data line DLj to control a voltage of a third node N3 of the third pixel driver PDU3. A pulse width of the driving current Ids flowing in the light-emitting element EL may be adjusted by the control current Ic of the first pixel driver PDU1, and thus, the first pixel driver PDU1 may be a pulse width modulator (or a PWM unit) that performs pulse width modulation on the driving current Ids flowing in the light-emitting element EL.

The first pixel driver PDU1 may include first to seventh transistors T1 to T7 and a first capacitor C1.

The first transistor T1 controls the control current Ic flowing between a second electrode and a first electrode thereof according to a PWM data voltage applied to a gate electrode thereof.

The second transistor T2 is turned on by a $k^{th}$ scan-write signal of the $k^{th}$ scan write line GWLk to apply the PWM data voltage of the $j^{th}$ PWM data line DLj to the first electrode of the first transistor T1. A gate electrode of the second transistor T2 may be connected to the $k^{th}$ scan write line GWLk, a first electrode thereof may be connected to the $j^{th}$ PWM data line DLj, and a second electrode thereof may be connected to the first electrode of the first transistor T1.

The third transistor T3 is turned on by a $k^{th}$ scan initialization signal of the $k^{th}$ scan initialization line GILk to connect the initialization voltage line VIL to the gate electrode of the first transistor T1. Accordingly, during a period in which the third transistor T3 is turned on, the gate electrode of the first transistor T1 may be discharged by the initialization voltage VINT of the initialization voltage line VIL. In this case, a gate-on voltage VGL of the $k^{th}$ scan initialization signal may be different from the initialization voltage VINT of the initialization voltage line VIL. In particular, because a voltage difference between the gate-on voltage VGL and the initialization voltage VINT is greater than a threshold voltage of the third transistor T3, even after the initialization voltage VINT is applied to the gate electrode of the first transistor T1, the third transistor T3 may be stably turned on. Accordingly, when the third transistor T3 is turned on, the initialization voltage VINT may be stably applied to the gate electrode of the first transistor T1 irrespective of the threshold voltage of the third transistor T3.

The third transistor T3 may include a plurality of transistors connected in series. For example, the third transistor T3 may include a first sub-transistor T31 and a second sub-transistor T32. Accordingly, it is possible to prevent a voltage of the gate electrode of the first transistor T1 from leaking through the third transistor T3. A gate electrode of the first sub-transistor T31 may be connected to the $k^{th}$ scan initialization line GILk, a first electrode thereof may be connected to the gate electrode of the first transistor T1, and a second electrode thereof may be connected to a first electrode of the second sub-transistor T32. A gate electrode of the second sub-transistor T32 may be connected to the $k^{th}$ scan initialization line GILk, the first electrode thereof may be connected to the second electrode of the first sub-transistor T31, and a second electrode thereof may be connected to the initialization voltage line VIL.

The fourth transistor T4 is turned on by a $k^{th}$ scan write signal of the $k^{th}$ scan write line GWLk to connect the gate electrode and the second electrode of the first transistor T1. Accordingly, during a period in which the fourth transistor T4 is turned on, the first transistor T1 may operate as a diode (e.g., the first transistor T1 may be diode-connected).

The fourth transistor T4 may include a plurality of transistors connected in series. For example, the fourth transistor T4 may include a third sub-transistor T41 and a fourth sub-transistor T42. Accordingly, it is possible to prevent the voltage of the gate electrode of the first transistor T1 from leaking through the fourth transistor T4. A gate electrode of the third sub-transistor T41 may be connected to the $k^{th}$ scan write line GWLk, a first electrode thereof may be connected to the second electrode of the first transistor T1, and a second electrode thereof may be connected to a first electrode of the fourth sub-transistor T42. A gate electrode of the fourth sub-transistor T42 may be connected to the $k^{th}$ scan write line GWLk, the first electrode thereof may be connected to the second electrode of the third sub-transistor T41, and a second electrode thereof may be connected to the gate electrode of the first transistor T1.

The fifth transistor T5 is turned on by a $k^{th}$ PWM emission signal of the $k^{th}$ PWM emission line PWELk to connect the first electrode of the first transistor T1 to the first power line VDL1. A gate electrode of the fifth transistor T5 may be connected to the $k^{th}$ PWM emission line PWELk, a first electrode thereof may be connected to the first power line VDL1, and a second electrode thereof may be connected to the first electrode of the first transistor T1.

The sixth transistor T6 is turned on by the $k^{th}$ PWM emission signal of the $k^{th}$ PWM emission line PWELk to connect the second electrode of the first transistor T1 to the third node N3 of the third pixel driver PDU3. A gate electrode of the sixth transistor T6 may be connected to the $k^{th}$ PWM emission line PWELk, a first electrode thereof may be connected to the second electrode of the first transistor T1, and a second electrode thereof may be connected to the third node N3 of the third pixel driver PDU3.

The seventh transistor T7 is turned on by a $k^{th}$ scan control signal of the $k^{th}$ scan control line GCLk to supply the gate-off voltage VGH of the gate-off voltage line VGHL to a first node N1 connected to the $k^{th}$ sweep signal line SWPLk. Therefore, during a period in which the initialization voltage VINT is applied to the gate electrode of the first transistor T1 and during a period in which the PWM data voltage of the $j^{th}$ PWM data line DLj and a threshold voltage Vth1 of the first transistor T1 are programmed, a voltage change of the gate electrode of the first transistor T1 can be prevented from being reflected in a $k^{th}$ sweep signal of the $k^{th}$ sweep signal line SWPLk by the first capacitor C1. A gate electrode of the seventh transistor T7 may be connected to the $k^{th}$ scan control line GCLk, a first electrode thereof may be connected to the gate-off voltage line VGHL, and a second electrode thereof may be connected to the first node N1.

The first capacitor C1 may be disposed between the gate electrode of the first transistor T1 and the first node N1. One electrode of the first capacitor C1 may be connected to the gate electrode of the first transistor T1, and the other electrode thereof may be connected to the first node N1.

The first node N1 may be a contact point between the $k^{th}$ sweep signal line SWPLk, the second electrode of the seventh transistor T7, and the other electrode of the first capacitor C1.

The second pixel driver PDU2 generates the driving current Ids applied to the light-emitting element EL according to a first PAM data voltage of the first PAM data line RDL. The second pixel driver PDU2 may be a pulse amplitude modulator (or a PAM unit) that performs pulse amplitude modulation. The second pixel driver PDU2 may be a constant current generator that generates the constant driving current Ids according to the first PAM data voltage.

In addition, the second pixel driver PDU2 of each first subpixel RP may receive the same first PAM data voltage to generate the same driving current Ids irrespective of luminance of the first subpixel RP. Similarly, the second pixel driver PDU2 of each second subpixel GP may receive the same second PAM data voltage to generate the same driving current Ids irrespective of luminance of the second subpixel GP. The second pixel driver PDU2 of each third subpixel BP may receive the same third PAM data voltage to generate the same driving current Ids irrespective of luminance of the third subpixel BP.

The second pixel driver PDU2 may include eighth to fourteenth transistors T8 to T14 and a second capacitor C2.

The eighth transistor T8 controls the driving current Ids flowing in the light-emitting element EL according to a voltage applied to a gate electrode thereof.

The ninth transistor T9 is turned on by the $k^{th}$ scan write signal of the $k^{th}$ scan write line GWLk to supply the first PAM data voltage of the first PAM data line RDL to a first electrode of the eighth transistor T8. A gate electrode of the ninth transistor T9 may be connected to the $k^{th}$ scan write line GWLk, a first electrode thereof may be connected to the first PAM data line RDL, and a second electrode thereof may be connected to the first electrode of the eighth transistor T8.

The tenth transistor T10 is turned on by the $k^{th}$ scan initialization signal of the $k^{th}$ scan initialization line GILk to connect the initialization voltage line VIL to the gate electrode of the eighth transistor T8. Accordingly, during a period in which the tenth transistor T10 is turned on, the gate electrode of the eighth transistor T8 may be discharged by the initialization voltage VINT of the initialization voltage line VIL. In this case, the gate-on voltage VGL of the $k^{th}$ scan initialization signal may be different from the initialization voltage VINT of the initialization voltage line VIL. In particular, because a voltage difference between the gate-on voltage VGL and the initialization voltage VINT is greater than a threshold voltage of the tenth transistor T10, even after the initialization voltage VINT is applied to the gate electrode of the eighth transistor T8, the tenth transistor T10 may be stably turned on. Accordingly, when the tenth transistor T10 is turned on, the initialization voltage VINT may be stably applied to the gate electrode of the eighth transistor T8 irrespective of the threshold voltage of the tenth transistor T10.

The tenth transistor T10 may include a plurality of transistors connected in series. For example, the tenth transistor T10 may include a fifth sub-transistor T101 and a sixth sub-transistor T102. Accordingly, it is possible to prevent a voltage of the gate electrode of the eighth transistor T8 from leaking through the tenth transistor T10. A gate electrode of the fifth sub-transistor T101 may be connected to the $k^{th}$ scan initialization line GILk, a first electrode thereof may be connected to the gate electrode of the eighth transistor T8, and a second electrode thereof may be connected to a first electrode of the sixth sub-transistor T102. A gate electrode of the sixth sub-transistor T102 may be connected to the $k^{th}$ scan initialization line GILk, the first electrode thereof may be connected to the second electrode of the fifth sub-transistor T101, and a second electrode thereof may be connected to the initialization voltage line VIL.

The eleventh transistor T11 is turned on by the $k^{th}$ scan write signal of the $k^{th}$ scan write line GWLk to connect the gate electrode and a second electrode of the eighth transistor T8. Accordingly, during a period in which the eleventh transistor T11 is turned on, the eighth transistor T8 may operate as a diode.

The eleventh transistor T11 may include a plurality of transistors connected in series. For example, the eleventh transistor T11 may include a seventh sub-transistor T111 and an eighth sub-transistor T112. Accordingly, it is possible to prevent the voltage of the gate electrode of the eighth transistor T8 from leaking through the eleventh transistor T11. A gate electrode of the seventh sub-transistor T111 may be connected to the $k^{th}$ scan write line GWLk, a first electrode thereof may be connected to the second electrode of the eighth transistor T8, and a second electrode thereof may be connected to a first electrode of the eighth sub-transistor T112. A gate electrode of the eighth sub-transistor T112 may be connected to the $k^{th}$ scan write line GWLk, the first electrode thereof may be connected to the second electrode of the seventh sub-transistor T111, and a second electrode thereof may be connected to the gate electrode of the eighth transistor T8.

The twelfth transistor T12 is turned on by the $k^{th}$ PWM emission signal of the $k^{th}$ PWM emission line PWELk to connect the first electrode of the eighth transistor T8 to the second power line VDL2. A gate electrode of the twelfth transistor T12 may be connected to the $k^{th}$ PWM emission line PWELk, a first electrode thereof may be connected to the second power line VDL2, and a second electrode thereof may be connected to the first electrode of the eighth transistor T8.

The thirteenth transistor T13 is turned on by the $k^{th}$ scan control signal of the $k^{th}$ scan control line GCLk to connect the first power line VDL1 to a second node N2. A gate electrode of the thirteenth transistor T13 may be connected to the $k^{th}$ scan control line GCLk, a first electrode thereof may be connected to the first power line VDL1, and a second electrode thereof may be connected to the second node N2.

The fourteenth transistor T14 is turned on by the $k^{th}$ PWM emission signal of the $k^{th}$ PWM emission line PWELk to connect the second power line VDL2 to the second node N2.

Accordingly, when the fourteenth transistor T14 is turned on, the second power voltage VDD2 of the second power line VDL2 may be supplied to the second node N2. A gate electrode of the fourteenth transistor T14 may be connected to the k$^{th}$ PWM emission line PWELk, a first electrode thereof may be connected to the second power line VDL2, and a second electrode thereof may be connected to the second node N2.

The second capacitor C2 may be disposed between the gate electrode of the eighth transistor T8 and the second node N2. One electrode of the second capacitor C2 may be connected to the gate electrode of the eighth transistor T8, and the other electrode thereof may be connected to the second node N2.

The second node N2 may be a contact point between the second electrode of the thirteenth transistor T13, the second electrode of the fourteenth transistor T14, and the other electrode of the second capacitor C2.

The third pixel driver PDU3 adjusts a period in which the driving current Ids is applied to the light-emitting element EL according to a voltage of the third node N3.

The third pixel driver PDU3 may include fifteenth to nineteenth transistors T15 to T19 and a third capacitor C3.

The fifteenth transistor T15 is turned on or turned off according to the voltage of the third node N3. When the fifteenth transistor T15 is turned on, the driving current Ids of the eighth transistor T8 may be supplied to the light-emitting element EL, and when the fifteenth transistor T15 is turned off, the driving current Ids of the eighth transistor T8 may not be supplied to the light-emitting element EL. Therefore, a turn-on period of the fifteenth transistor T15 may be substantially the same as an emission period of the light-emitting element EL. A gate electrode of the fifteenth transistor T15 may be connected to the third node N3, a first electrode thereof may be connected to the second electrode of the eighth transistor T8, and a second electrode thereof is connected to the second electrode of the seventeenth transistor T17.

The sixteenth transistor T16 is turned on by the k$^{th}$ scan control signal of the k$^{th}$ scan control line GCLk to connect the initialization voltage line VIL to the third node N3. Accordingly, during a period in which the sixteenth transistor T16 is turned on, the third node N3 may be discharged by the initialization voltage of the initialization voltage line VIL.

The sixteenth transistor T16 may include a plurality of transistors connected in series. For example, the sixteenth transistor T16 may include a ninth sub-transistor T161 and a tenth sub-transistor T162. Accordingly, it is possible to prevent the voltage of the third node N3 from leaking through the sixteenth transistor T16. A gate electrode of the ninth sub-transistor T161 may be connected to the k$^{th}$ scan control line GCLk, a first electrode thereof may be connected to the third node N3, and a second electrode thereof may be connected to a first electrode of the tenth sub-transistor T162. A gate electrode of the tenth sub-transistor T162 may be connected to the k$^{th}$ scan control line GCLk, the first electrode thereof may be connected to the second electrode of the ninth sub-transistor T161, and a second electrode thereof may be connected to the initialization voltage line VIL.

The seventeenth transistor T17 is turned on by the k$^{th}$ PAM emission signal of the k$^{th}$ PAM emission line PAELk to connect the second electrode of the fifteenth transistor T15 to the first electrode of the light-emitting element EL. A gate electrode of the seventeenth transistor T17 may be connected to the k$^{th}$ PAM emission line PAELk, a first electrode thereof may be connected to the second electrode of the fifteenth transistor T15, and the second electrode thereof may be connected to the first electrode of the light-emitting element EL.

The eighteenth transistor T18 is turned on by the k$^{th}$ scan control signal of the k$^{th}$ scan control line GCLk to connect the initialization voltage line VIL to the first electrode of the light-emitting element EL. Accordingly, during a period in which the eighteenth transistor T18 is turned on, the first electrode of the light-emitting element EL may be discharged by the initialization voltage of the initialization voltage line VIL. A gate electrode of the eighteenth transistor T18 may be connected to the k$^{th}$ scan control line GCLk, a first electrode thereof may be connected to the first electrode of the light-emitting element EL, and a second electrode thereof may be connected to the initialization voltage line VIL.

The nineteenth transistor T19 is turned on by a test signal of a test signal line TSTL to connect the first electrode of the light-emitting element EL to the third power line VSL. A gate electrode of the nineteenth transistor T19 may be connected to the test signal line TSTL, a first electrode thereof may be connected to the first electrode of the light-emitting element EL, and a second electrode thereof may be connected to the third power line VSL.

The third capacitor C3 may be disposed between the third node N3 and the initialization voltage line VIL. One electrode of the third capacitor C3 may be connected to the third node N3, and the other electrode thereof may be connected to the initialization voltage line VIL.

The third node N3 may be a contact point between the second electrode of the sixth transistor T6, the gate electrode of the fifteenth transistor T15, the first electrode of the ninth sub-transistor T161, and one electrode of the third capacitor C3.

In one or more embodiments, the driving current Ids of the first subpixel RP may flow from the second power line VDL2 to the first electrode of the light-emitting element EL through the twelfth transistor T12, the eighth transistor T8, the fifteenth transistor T15, and the seventeenth transistor T17. In this case, as a value of a first resistance R1 between a drain electrode of the twelfth transistor T12 and a source electrode of the eighth transistor T8, a value of a second resistance R2 between a drain electrode of the eighth transistor T8 and a source electrode of the fifteenth transistor T15, and a value of a third resistance R3 between a drain electrode of the fifteenth transistor T15 and a source electrode of the seventeenth transistor T17 decrease, a voltage drop of a driving voltage Vds may be reduced or minimized.

Any one of the first and second electrodes of each of the first to nineteenth transistors T1 to T19 may be a source electrode, and the other thereof may be a drain electrode. An active layer of each of the first to nineteenth transistors T1 to T19 may be made of any one selected from among polysilicon, amorphous silicon, and an oxide semiconductor. When the active layer of each of the first to nineteenth transistors T1 to T19 is made of polysilicon, the active layer may be formed through a low temperature polysilicon (LTPS) process.

In addition, in FIG. 5, each of the first to nineteenth transistors T1 to T19 has been mainly described as being formed as a P-type metal oxide silicon field effect transistor (MOSFET), but embodiments of the present specification are not limited thereto. For example, each of the first to nineteenth transistors T1 to T19 may be formed as an N-type MOSFET.

Alternatively, in order to increase a black expression ability of the light-emitting element EL by blocking a leakage current, in the first subpixel RP, the first sub-transistor T31 and the second sub-transistor T32 of the third transistor T3, the third sub-transistor T41 and the fourth sub-transistor T42 of the fourth transistor T4, the fifth sub-transistor T101 and the sixth sub-transistor T102 of the tenth transistor T10, and the seventh sub-transistor T111 and the eighth sub-transistor T112 of the eleventh transistor T11 may be formed as N-type MOSFETs. In this case, a $k^{th}$ control signal may be applied to the gate electrodes of the third sub-transistor T41 and the fourth sub-transistor T42 of the fourth transistor T4, and the gate electrodes of the seventh sub-transistor T111 and the eighth sub-transistor T112 of the eleventh transistor T11. The $k^{th}$ scan initialization signal of the $k^{th}$ scan initialization line GILk and the $k^{th}$ control signal may have pulses generated as the gate-off voltage VGH. In addition, active layers of the first sub-transistor T31 and the second sub-transistor T32 of the third transistor T3, the third sub-transistor T41 and the fourth sub-transistor T42 of the fourth transistor T4, the fifth sub-transistor T101 and the sixth sub-transistor T102 of the tenth transistor T10, and the seventh sub-transistor T111 and the eighth sub-transistor T112 of the eleventh transistor T11 may be made of an oxide semiconductor, and the remaining transistors may be made of polysilicon.

Alternatively, any one of the first sub-transistor T31 and the second sub-transistor T32 of the third transistor T3 may be formed as an N-type MOSFET, and the other thereof may be formed as a P-type MOSFET. In this case, among the first sub-transistor T31 and the second sub-transistor T32 of the third transistor T3, the transistor formed as the N-type MOSFET may be made of an oxide semiconductor, and the transistor formed as the P-type MOSFET may be made of polysilicon.

Alternatively, any one of the third sub-transistor T41 and the fourth sub-transistor T42 of the fourth transistor T4 may be formed as an N-type MOSFET and the other thereof may be formed as a P-type MOSFET. In this case, among the third sub-transistor T41 and the fourth sub-transistor T42 of the fourth transistor T4, the transistor formed as the N-type MOSFET may be made of an oxide semiconductor, and the transistor formed as the P-type MOSFET may be made of polysilicon.

Alternatively, any one of the fifth sub-transistor T101 and the sixth sub-transistor T102 of the tenth transistor T10 may be formed as an N-type MOSFET, and the other thereof may be formed as a P-type MOSFET. In this case, among the fifth sub-transistor T101 and the sixth sub-transistor T102 of the tenth transistor T10, the transistor formed as the N-type MOSFET may be made of an oxide semiconductor, and the transistor formed as the P-type MOSFET may be made of polysilicon.

Alternatively, any one of the seventh sub-transistor T111 and the eighth sub-transistor T112 of the eleventh transistor T11 may be formed as an N-type MOSFET, and the other thereof may be formed as a P-type MOSFET. In this case, among the seventh sub-transistor T111 and the eighth sub-transistor T112 of the eleventh transistor T11, the transistor formed as the N-type MOSFET may be made of an oxide semiconductor, and the transistor formed as the P-type MOSFET may be made of polysilicon.

In one or more embodiments, the second subpixel GP and the third subpixel BP may be substantially the same as the first subpixel RP described with reference to FIG. 5. Therefore, descriptions of the second subpixel GP and the third subpixel BP according to one or more embodiments will be omitted.

Figure 6:
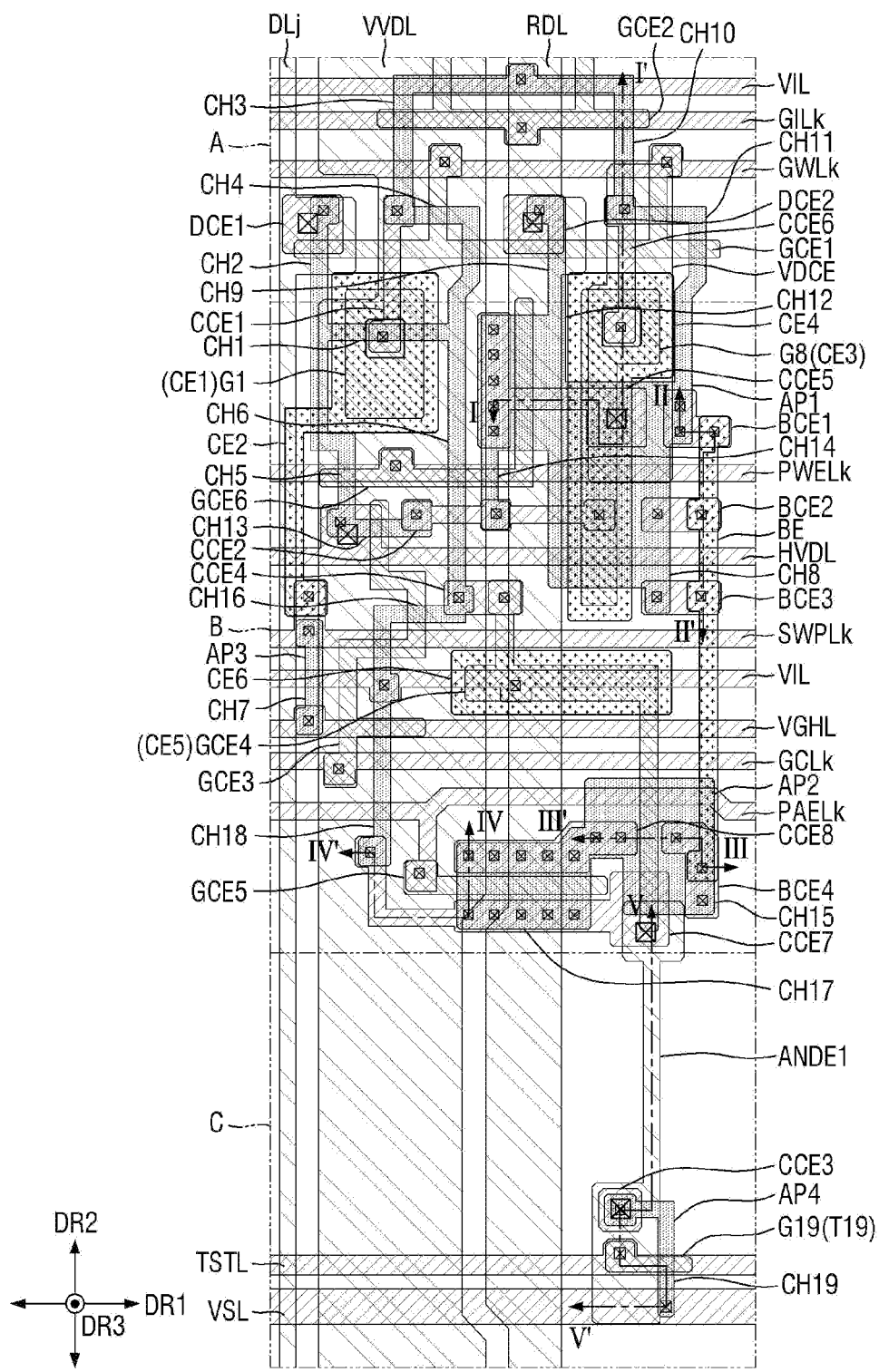
FIG. 6 is a layout illustrating an active layer, a first gate metal layer, a second gate metal layer, a first source metal layer, and a second source metal layer of a first subpixel according to one or more embodiments.
Figure 7:
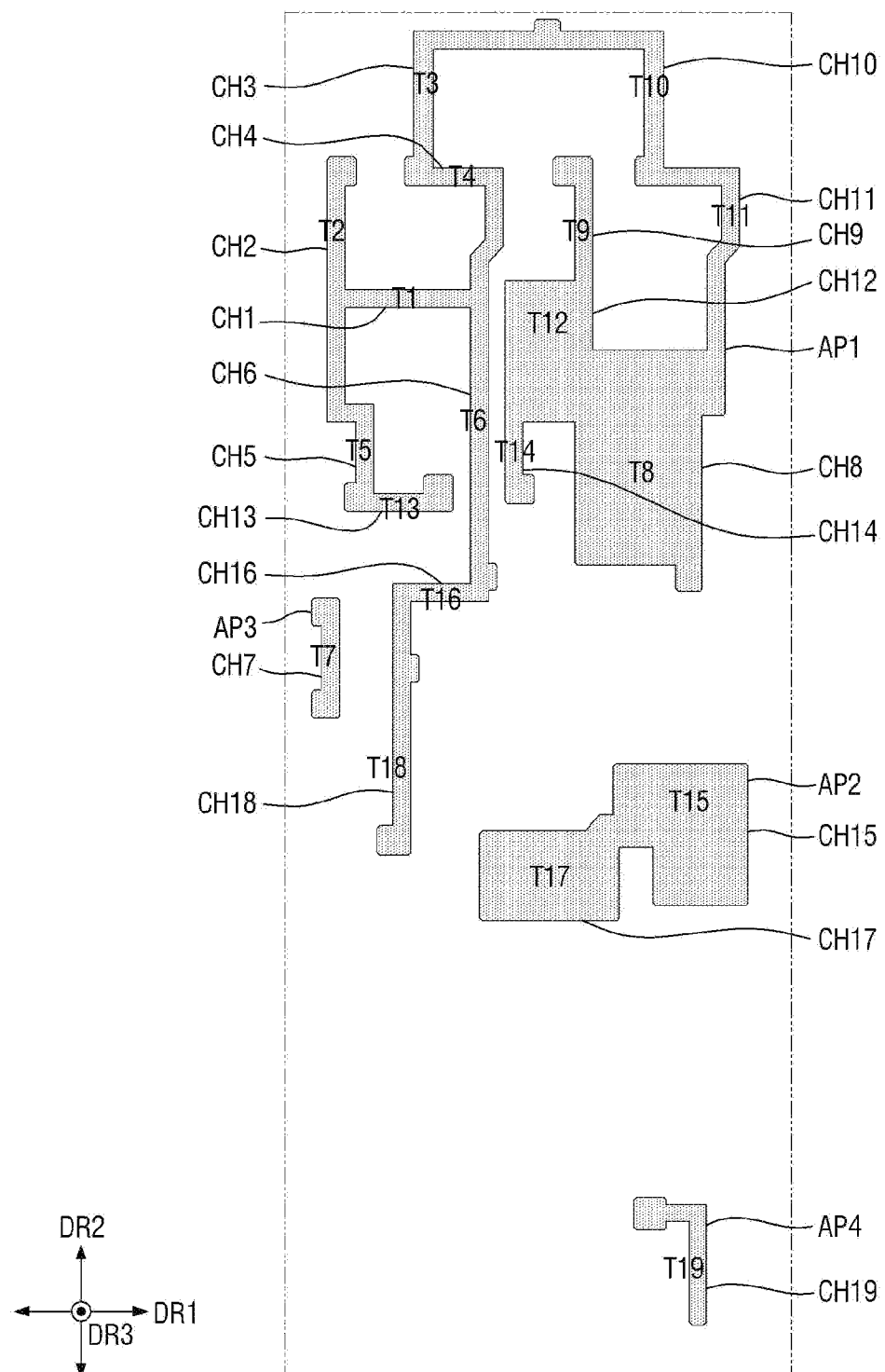
FIG. 7 is a layout illustrating the active layer of FIG. 6.
Figure 8:
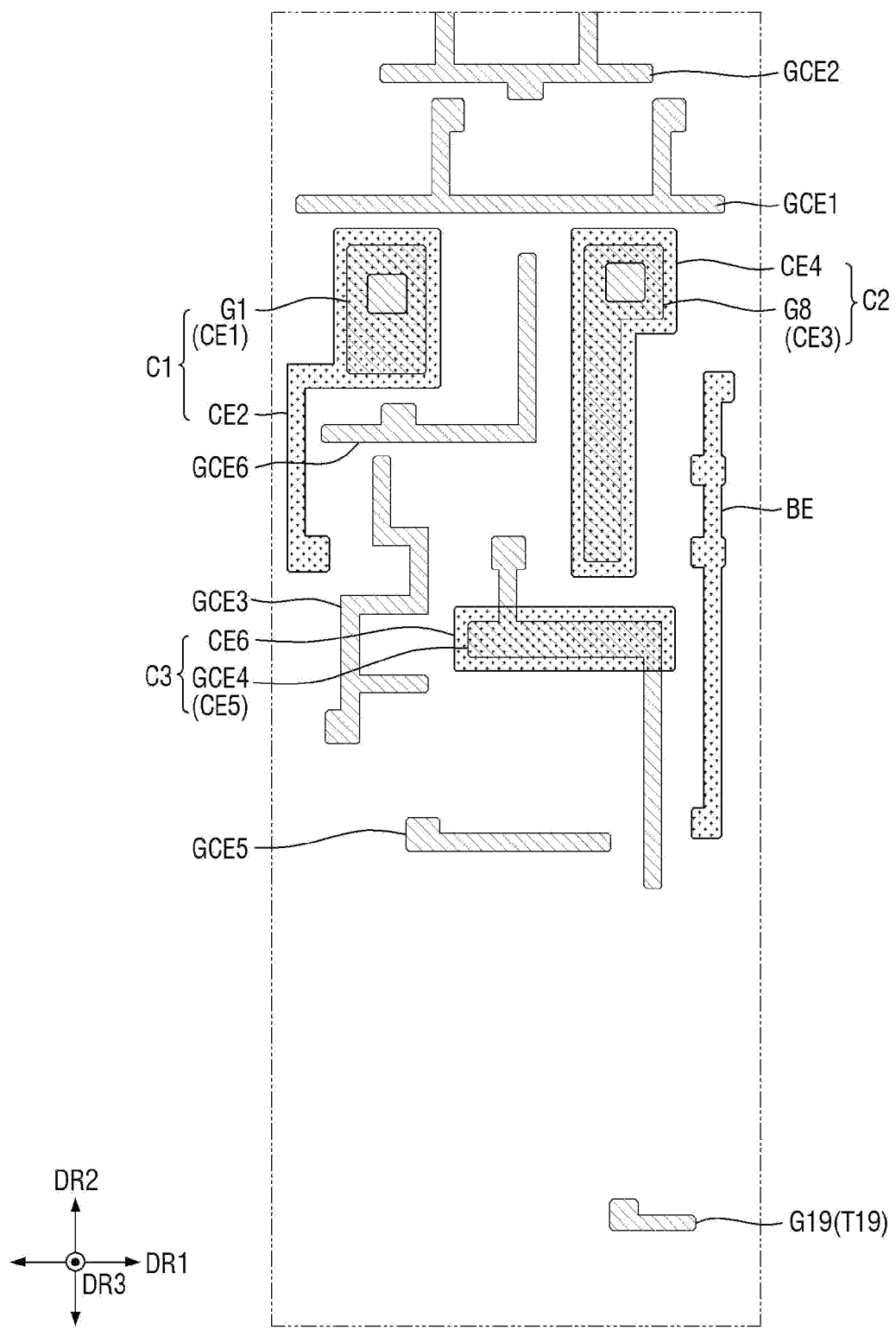
FIG. 8 is a layout illustrating the first gate metal layer and the second gate metal layer of FIG. 6.
Figure 9:
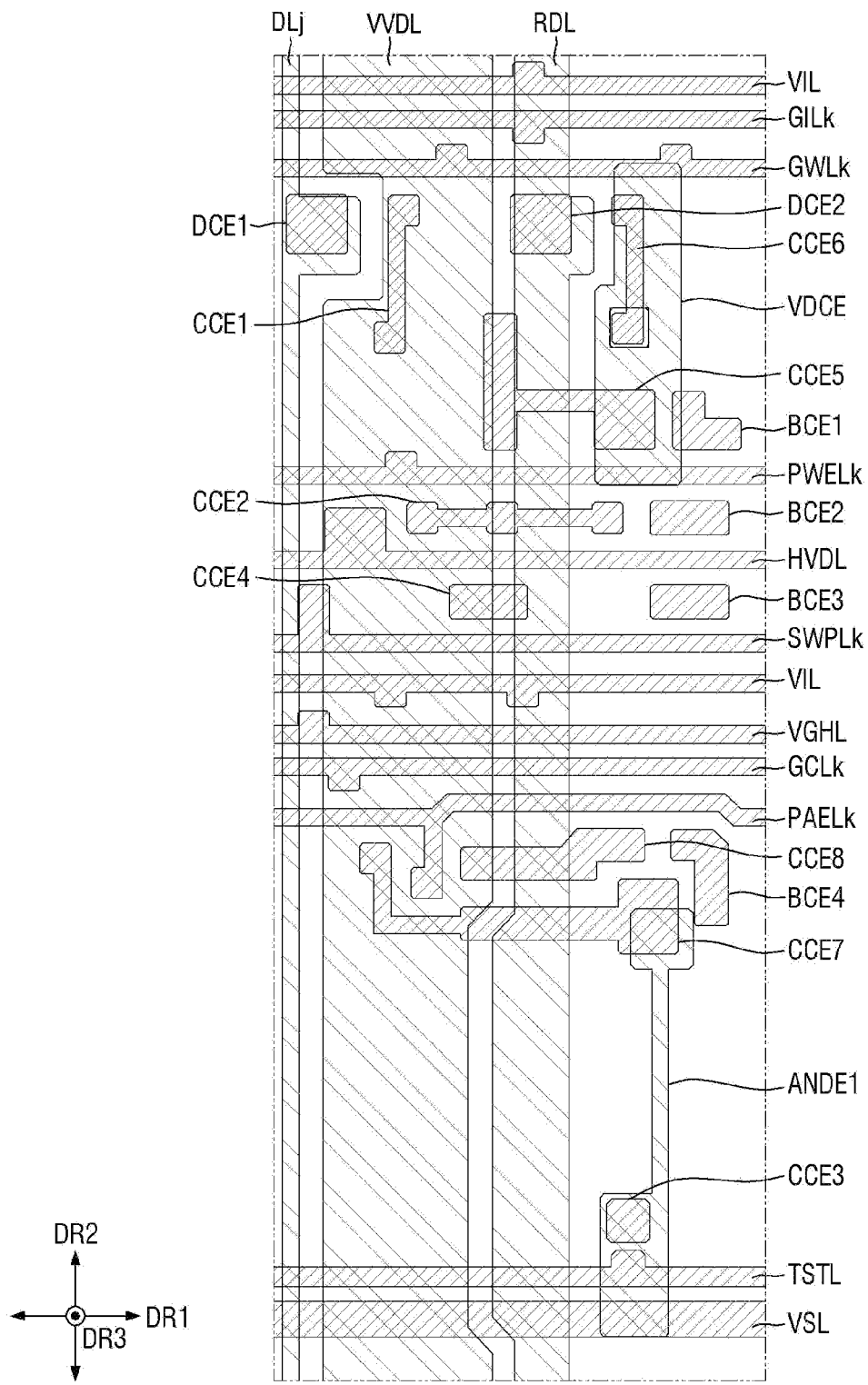
FIG. 9 is a layout illustrating the first source metal layer and the second source metal layer of FIG. 6.

FIG. 6 is a layout illustrating an active layer, a first gate metal layer, a second gate metal layer, a first source metal layer, and a second source metal layer of a first subpixel according to one or more embodiments. FIG. 7 is a layout illustrating the active layer of FIG. 6. FIG. 8 is a layout illustrating the first gate metal layer and the second gate metal layer of FIG. 6. FIG. 9 is a layout illustrating the first source metal layer and the second source metal layer of FIG. 6.

Referring to FIGS. 6 to 9, a first subpixel RP includes an active layer ACT, the first gate metal layer, the second gate metal layer, the first source metal layer, and the second source metal layer.

Referring to FIGS. 6 and 7, the active layer ACT may include channels CH1 to CH19, source electrodes (reference numerals omitted), and drain electrodes (reference numerals omitted) of first to nineteenth transistors T1 to T19.

The active layer ACT may include a plurality of island-shaped patterns in one first subpixel RP, and each of the plurality of island-shaped patterns may be disposed physically apart from each other. The active layer ACT may include first to fourth active patterns AP1, AP2, AP3, and AP4 disposed apart from each other. Each of the first to fourth active patterns AP1, AP2, AP3, and AP4 may include channels, source electrodes, and drain electrodes of transistors in the first subpixel RP.

For example, the first active pattern AP1 may include the channels CH1, CH2, CH3, CH4, CH5, CH6, CH8, CH9, CH10, CH11, CH12, CH13, CH14, CH16, and CH18, the source electrodes, and the drain electrodes of the first to sixth transistors T1, T2, T3, T4, T5, and T6, the eighth to fourteenth transistors T8, T9, T10, T11, T12, T13, and T14, the sixteenth transistor T16, and the eighteenth transistor T18. The second active pattern AP2 may include channels CH15 and CH17, the source electrodes, and the drain electrodes of the fifteenth transistor T15 and the seventeenth transistor T17. The third active pattern AP3 may include the channel CH7, the source electrode, and the drain electrode of the seventh transistor T7. The fourth active pattern AP4 may include the channel CH19, the source electrode, and the drain electrode of the nineteenth transistor T19.

A sixth capacitor electrode CE6, and a $k^{th}$ sweep signal line SWPLk, an initialization voltage line VIL, a gate-off voltage line VGHL, and a $k^{th}$ scan control line GCLk extending in a first direction DR1 may be disposed between the first active pattern AP1 and the second active pattern AP2.

Referring to FIGS. 6, 8 and 10-12, the first gate metal layer may include gate electrodes G1 to G19 of the first to nineteenth transistors T1 to T19, a first capacitor electrode CE1, a third capacitor electrode CE3, a fifth capacitor electrode CE5, and first to fifth gate connection electrodes GCE1 to GCE5. A first gate electrode G1 of the first transistor T1 may be formed integrally with the first capacitor electrode CE1. An eighth gate electrode G8 of the eighth transistor T8 may be integrally formed with the third capacitor electrode CE3. The fourth gate connection electrode GCE4 may be formed integrally with the fifth capacitor electrode CE5.

The second gate metal layer may include a second capacitor electrode CE2, a fourth capacitor electrode CE4, the sixth capacitor electrode CE6, and a bridge electrode BE. The second capacitor electrode CE2 may overlap the first capacitor electrode CE1 in a third direction DR3 (e.g., a thickness direction) to form a first capacitor C1, the fourth capacitor electrode CE4 may overlap the third capacitor electrode CE3 in the third direction DR3 to form a second capacitor C2, and the sixth capacitor electrode CE6 may overlap the fifth capacitor electrode CE5 in the third direction DR3 to form a third capacitor C3.

In one or more embodiments, the bridge electrode BE may extend in a second direction DR2. As will be described below with reference to FIGS. 10 to 12, the bridge electrode BE may electrically connect the first active pattern AP1 and the second active pattern AP2 that are spaced from each other. The bridge electrode BE may be connected to the first active pattern AP1 and the second active pattern AP2 through a plurality of bridge connection electrodes BCE1, BCE2, BCE3, and BCE4. Because the bridge electrode BE has a lower sheet resistance than the first active pattern AP1 and the second active pattern AP2, a voltage drop of a driving current Ids flowing along the first active pattern AP1, the bridge electrode BE, and the second active pattern AP2 may be reduced or minimized. That is, a second resistance "R2" (see FIG. 5) between an eighth drain electrode D8 of the eighth transistor T8 and a fifteenth source electrode S15 of the fifteenth transistor T15 may decrease.

Referring to FIGS. 6 and 9, the first source metal layer may include the initialization voltage line VIL, a $k^{th}$ scan initialization line GILk, a $k^{th}$ scan write line GWLk, a $k^{th}$ PWM emission line PWELk, a first horizontal power line HVDL, the gate-off voltage line VGHL, the $k^{th}$ sweep signal line SWPLk, the $k^{th}$ scan control line GCLk, a $k^{th}$ PAM emission line PAELk, a test signal line TSTL, and a third power line VSL that extend in the first direction DR1. The initialization voltage line VIL, the $k^{th}$ scan initialization line GILk, the $k^{th}$ scan write line GWLk, the $k^{th}$ PWM emission line PWELk, the first horizontal power line HVDL, the gate-off voltage line VGHL, the $k^{th}$ sweep signal line SWPLk, the $k^{th}$ scan control line GCLk, the $k^{th}$ PAM emission line PAELk, the test signal line TSTL, and the third power line VSL may be disposed apart from each other along the second direction DR2. In addition, the first source metal layer may further include first and second data connection electrodes DCE1 and DCE2, first to eighth connection electrodes CCE1 to CCE8, and first to fourth bridge connection electrodes BCE1 to BCE4.

The second source metal layer may include a $j^{th}$ data line DLj, a first vertical power line VVDL, and a first PAM data line RDL that extend in the second direction DR2. In addition, in one or more embodiments, the second PAM data line GDL and the third PAM data line BDL of FIG. 4 may extend in the second direction DR2. The $j^{th}$ data line DLj, the first vertical power line VVDL, the first PAM data line RDL, the second PAM data line GDL, and the third PAM data line BDL may be disposed apart from each other along the first direction DR1. In addition, the second source metal layer may further include a first anode connection electrode ANDE1 and a second power connection electrode VDCE.

In one or more embodiments, the driving current Ids of the first subpixel RP may flow from the second power connection electrode VDCE and a fifth connection electrode CCE5, to which a second power voltage VDD2 is applied, to a first electrode of a light-emitting element EL through the twelfth transistor T12, the eighth transistor T8, the fifteenth transistor T15, and the seventeenth transistor T17. An area of the active layer to which a twelfth drain electrode D12 of the twelfth transistor T12 and an eighth source electrode S8 of the eighth transistor T8 are connected may be increased to reduce a first resistance "R1" (see in FIG. 5). The eighth connection electrode CCE8 connecting a fifteenth drain electrode D15 of the fifteenth transistor T15 and a seventeenth source electrode S17 of the seventeenth transistor T17 may be included to reduce a third resistance "R3" (see FIG. 5).

Figure 10:
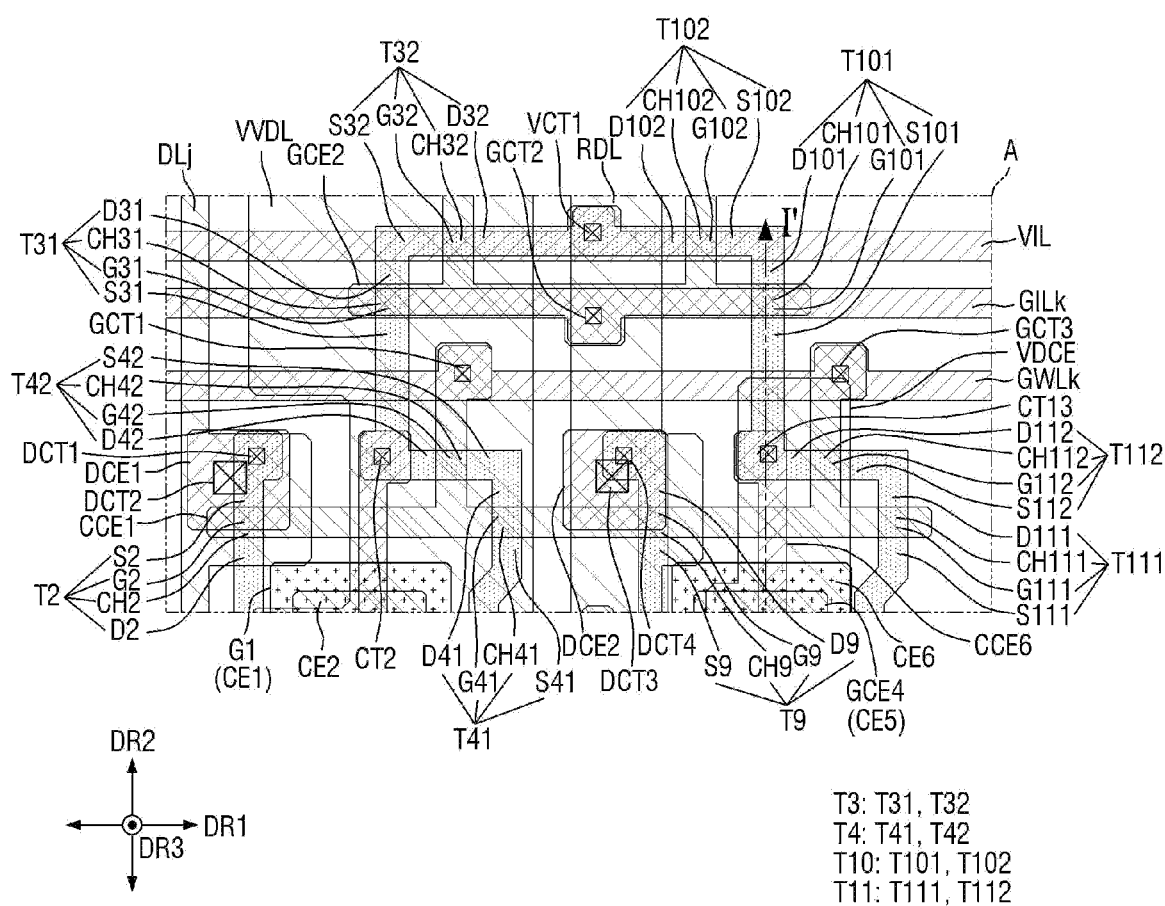
FIG. 10 is an enlarged layout illustrating an area A of FIG. 6 in detail.
Figure 11:
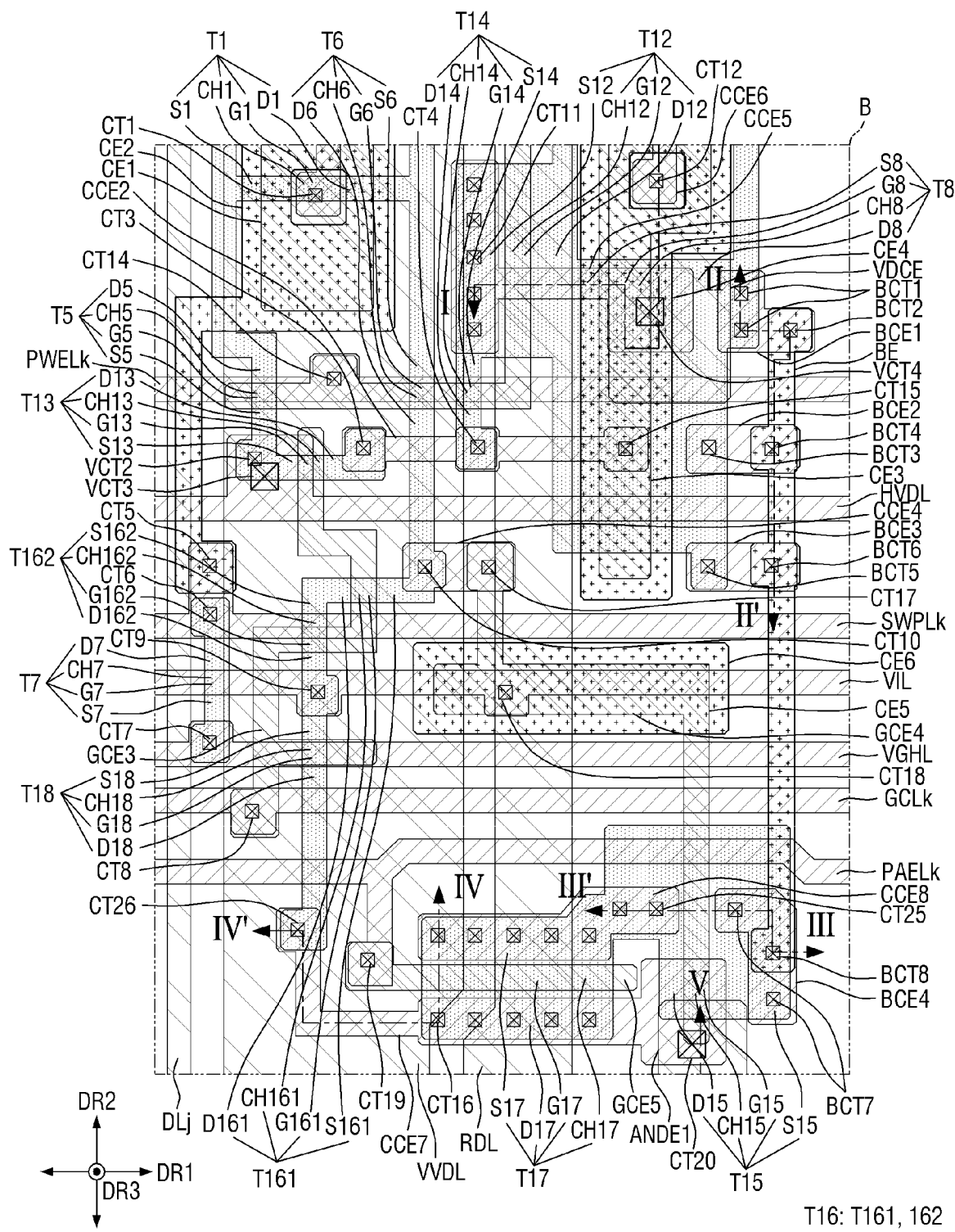
FIG. 11 is an enlarged layout illustrating an area B of FIG. 6 in detail.
Figure 12:
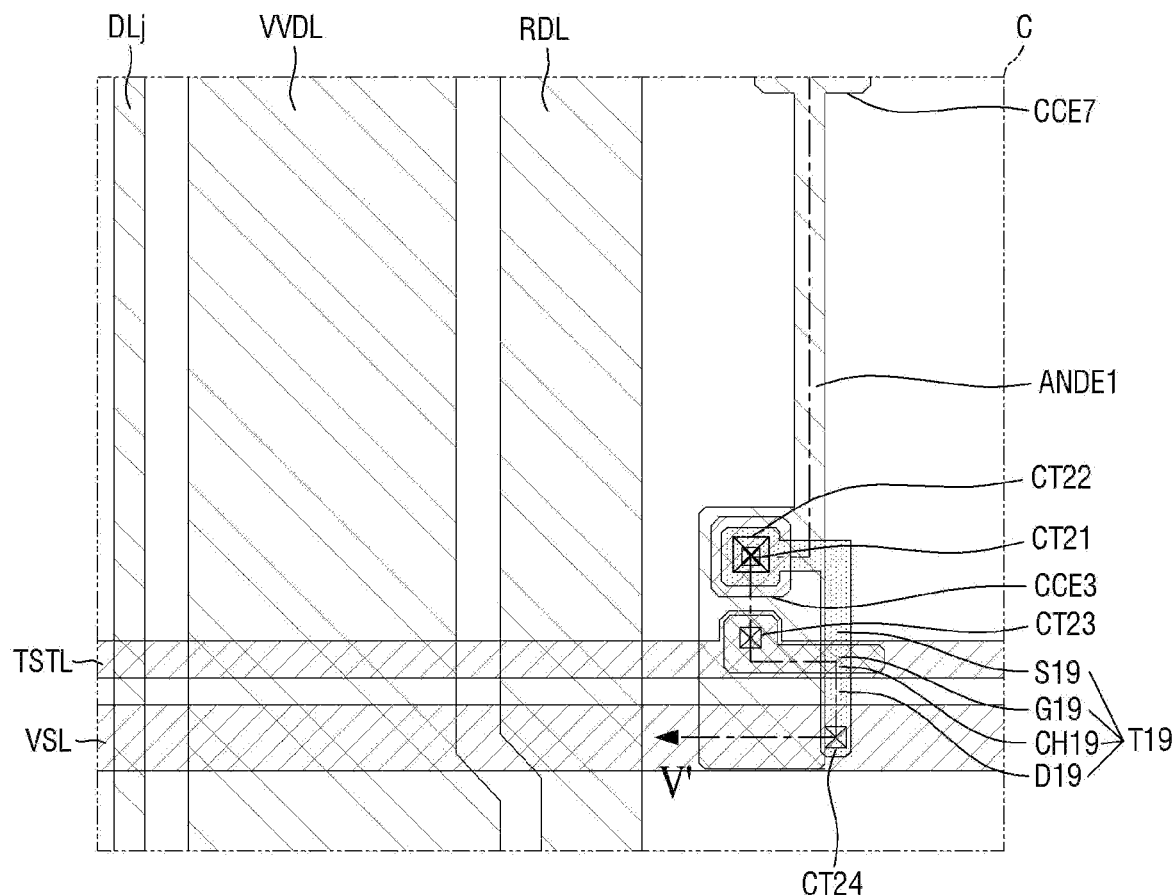
FIG. 12 is an enlarged layout illustrating an area C of FIG. 6 in detail.
Figure 12:
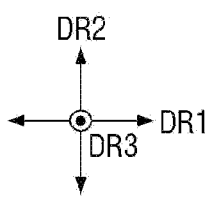

FIG. 10 is an enlarged layout illustrating an area A of FIG. 6 in detail. FIG. 11 is an enlarged layout illustrating an area B of FIG. 6 in detail. FIG. 12 is an enlarged layout illustrating an area C of FIG. 6 in detail.

Referring to FIGS. 10 to 12, the first subpixel RP includes the first to nineteenth transistors T1 to T19, the first to sixth capacitor electrodes CE1 to CE6, the bridge electrode BE, the first to fifth gate connection electrodes GCE1 to GCE5, the first and second data connection electrodes DCE1 and DCE2, the first to eighth connection electrodes CCE1 to CCE8, the first to fourth bridge connection electrodes BCE1 to BCE4, the first anode connection electrode ANDE1, and the light-emitting element EL.

The first transistor T1 includes a first channel CH1, the first gate electrode G1, a first source electrode S1, and a first drain electrode D1. The first channel CH1 may extend in the first direction DR1. The first channel CH1 may overlap the first gate electrode G1 in the third direction DR3. The first gate electrode G1 may be connected to the first connection electrode CCE1 through a first contact hole CT1. The first gate electrode G1 may be formed integrally with the first capacitor electrode CE1. The first gate electrode G1 may overlap the second capacitor electrode CE2 in the third direction DR3. The first source electrode S1 may be disposed at one side of the first channel CH1, and the first drain electrode D1 may be disposed at the other side of the first channel CH1. The first source electrode S1 may be connected to a second drain electrode D2 and a fifth drain electrode D5. The first drain electrode D1 may be connected to a third sub-source electrode S41 and a sixth source electrode S6. The first source electrode S1 and the first drain electrode D1 may not overlap the first gate electrode G1 in the third direction DR3. The first source electrode S1 and the first drain electrode D1 may overlap the second capacitor electrode CE2 in the third direction DR3.

The second transistor T2 includes a second channel CH2, a second gate electrode G2, a second source electrode S2, and the second drain electrode D2. The second channel CH2 may overlap the second gate electrode G2 in the third direction DR3. The second gate electrode G2 may be formed integrally with the first gate connection electrode GCE1. The second source electrode S2 may be disposed at one side of the second channel CH2, and the second drain electrode D2 may be disposed at the other side of the second channel CH2. The second source electrode S2 may be connected to the first data connection electrode DCE1 through a first data contact hole DCT1. The second drain electrode D2 may be connected to the first source electrode S1. The second source electrode S2 and the second drain electrode D2 may not overlap the second gate electrode G2 in the third direction DR3. The second drain electrode D2 may extend in the second direction DR2. The second drain electrode D2 may be connected to the first source electrode S1.

A first sub-transistor T31 of the third transistor T3 includes a first sub-channel CH31, a first sub-gate electrode G31, a first sub-source electrode S31, and a first sub-drain electrode D31. The first sub-channel CH31 may overlap the first sub-gate electrode G31 in the third direction DR3. The first sub-gate electrode G31 may be formed integrally with the second gate connection electrode GCE2. The first sub-source electrode S31 may be disposed at one side of the first sub-channel CH31, and the first sub-drain electrode D31 may be disposed at the other side of the first sub-channel CH31. The first sub-source electrode S31 may be connected to a fourth sub-drain electrode D42, and the first sub-drain electrode D31 may be connected to a second sub-source electrode S32. The first sub-source electrode S31 and the first sub-drain electrode D31 may not overlap the first sub-gate electrode G31. The first sub-source electrode S31 may overlap the k$^{th}$ scan write line GWLk in the third direction DR3. The first sub-drain electrode D31 may overlap the initialization voltage line VIL in the third direction DR3.

A second sub-transistor T32 of the third transistor T3 includes a second sub-channel CH32, a second sub-gate electrode G32, the second sub-source electrode S32, and a second sub-drain electrode D32. The second sub-channel CH32 may overlap the second sub-gate electrode G32 in the third direction DR3. The second sub-gate electrode G32 may be formed integrally with the second gate connection electrode GCE2. The second sub-source electrode S32 may be disposed at one side of the second sub-channel CH32, and the second sub-drain electrode D32 may be disposed at the other side of the second sub-channel CH32. The second sub-source electrode S32 may be connected to the first sub-drain electrode D31, and the second sub-drain electrode D32 may be connected to the initialization voltage line VIL through a first power contact hole VCT1. The second sub-source electrode S32 and the second sub-drain electrode D32 may not overlap the second sub-gate electrode G32. The second sub-source electrode S32 and the second sub-drain electrode D32 may overlap the initialization voltage line VIL in the third direction DR3.

A third sub-transistor T41 of the fourth transistor T4 includes a third sub-channel CH41, a third sub-gate electrode G41, the third sub-source electrode S41, and a third sub-drain electrode D41. The third sub-channel CH41 may overlap the third sub-gate electrode G41 in the third direction DR3. The third sub-gate electrode G41 may be formed integrally with the first gate connection electrode GCE1. The third sub-source electrode S41 may be disposed at one side of the third sub-channel CH41, and the first sub-drain electrode D31 may be disposed at the other side of the third sub-channel CH41. The third sub-source electrode S41 may be connected to the first drain electrode D1, and the third sub-drain electrode D41 may be connected to a fourth sub-source electrode S42. The third sub-source electrode S41 and the third sub-drain electrode D41 may not overlap the third sub-gate electrode G41.

A fourth sub-transistor T42 of the fourth transistor T4 includes a fourth sub-channel CH42, a fourth sub-gate electrode G42, the fourth sub-source electrode S42, and the fourth sub-drain electrode D42. The fourth sub-channel CH42 may overlap the fourth sub-gate electrode G42 in the third direction DR3. The fourth sub-gate electrode G42 may be formed integrally with the second gate connection electrode GCE2. The fourth sub-source electrode S42 may be disposed at one side of the fourth sub-channel CH42, and the fourth sub-drain electrode D42 may be disposed at the other side of the fourth sub-channel CH42. The fourth sub-source electrode S42 may be connected to the third sub-drain electrode D41, and the fourth sub-drain electrode D42 may be connected to the first sub-source electrode S31. The fourth sub-source electrode S42 and the fourth sub-drain electrode D42 may not overlap the fourth sub-gate electrode G42.

The fifth transistor T5 includes a fifth channel CH5, a fifth gate electrode G5, a fifth source electrode S5, and the fifth drain electrode D5. The fifth channel CH5 may overlap the fifth gate electrode G5 in the third direction DR3. The fifth gate electrode G5 may be formed integrally with a sixth gate connection electrode GCE6. The fifth source electrode S5 may be disposed at one side of the fifth channel CH5, and the fifth drain electrode D5 may be disposed at the other side of the fifth channel CH5. The fifth source electrode S5 may be connected to the first horizontal power line HVDL through a second power contact hole VCT2. The fifth drain electrode D5 may be connected to the first source electrode S1. The fifth source electrode S5 and the fifth drain electrode D5 may not overlap the fifth gate electrode G5 in the third direction DR3. The fifth drain electrode D5 may overlap an extension portion of the second capacitor electrode CE2 in the third direction DR3.

The sixth transistor T6 includes a sixth channel CH6, a sixth gate electrode G6, the sixth source electrode S6, and a sixth drain electrode D6. The sixth channel CH6 may overlap the sixth gate electrode G6 in the third direction DR3. The sixth gate electrode G6 may be formed integrally with the third gate connection electrode GCE3. The sixth source electrode S6 may be disposed at one side of the sixth channel CH6, and the sixth drain electrode D6 may be disposed at the other side of the sixth channel CH6. The sixth source electrode S6 may be connected to the first drain electrode D1. The sixth drain electrode D6 may be connected to the fourth connection electrode CCE4 through a tenth contact hole CT10. The sixth source electrode S6 and the sixth drain electrode D6 may not overlap the sixth gate electrode G6 in the third direction DR3. The sixth drain electrode D6 may overlap the second connection electrode CCE2 and the first horizontal power line HVDL in the third direction DR3.

The seventh transistor T7 includes a seventh channel CH7, a seventh gate electrode G7, a seventh source electrode S7, and a seventh drain electrode D7. The seventh channel CH7 may overlap the seventh gate electrode G7 in the third direction DR3. The seventh gate electrode G7 may be formed integrally with the third gate connection electrode GCE3. The seventh gate electrode G7 may overlap the initialization voltage line VIL in the third direction DR3. The seventh source electrode S7 may be disposed at one side of the seventh channel CH7, and the seventh drain electrode D7 may be disposed at the other side of the seventh channel CH7. The seventh source electrode S7 may be connected to the gate-off voltage line VGHL through a seventh contact hole CT7. The seventh drain electrode D7 may be connected to the k$^{th}$ sweep signal line SWPLk through a sixth contact hole CT6. The seventh source electrode S7 and the seventh drain electrode D7 may not overlap the seventh gate electrode G7 in the third direction DR3.

The eighth transistor T8 includes an eighth channel CH8, the eighth gate electrode G8, an eighth source electrode S8, and the eighth drain electrode D8. The eighth channel CH8 may overlap the eighth gate electrode G8 in the third direction DR3. The eighth gate electrode G8 may extend in the second direction DR2. The eighth gate electrode G8 may be formed integrally with the third capacitor electrode CE3. The eighth source electrode S8 may be disposed at one side of the eighth channel CH8, and the eighth drain electrode D8 may be disposed at the other side of the eighth channel CH8. The eighth source electrode S8 may be connected to a ninth drain electrode D9 and the twelfth drain electrode D12. The eighth drain electrode D8 may be connected to a seventh sub-source electrode S111. The eighth drain electrode D8 may be connected to the seventh sub-source electrode S111. The eighth source electrode S8 and the eighth drain electrode D8 may not overlap the eighth gate electrode G8 in the third direction DR3.

In one or more embodiments, the eighth drain electrode D8 may be physically spaced from the fifteenth source electrode S15 of the fifteenth transistor T15. The eighth drain electrode D8 may be connected to the first bridge connection electrode BCE1 through first bridge contact holes BCT1, may be connected to the second bridge connection electrode BCE2 through a third bridge contact hole BCT3, and may be connected to a third bridge connection electrode BCE3 through a fifth bridge contact hole BCT5. The eighth drain electrode D8 may be connected to the bridge electrode BE through the first to third bridge connection electrodes BCE1, BCE2, and BCE3.

The ninth transistor T9 includes a ninth channel CH9, a ninth gate electrode G9, a ninth source electrode S9, and the ninth drain electrode D9. The ninth channel CH9 may overlap the ninth gate electrode G9 in the third direction DR3. The ninth gate electrode G9 may extend in the second direction DR2. The ninth gate electrode G9 may be formed integrally with the first gate connection electrode GCE1. The ninth source electrode S9 may be disposed at one side of the ninth channel CH9, and the ninth drain electrode D9 may be disposed at the other side of the ninth channel CH9. The ninth source electrode S9 may be connected to the second data connection electrode DCE2 through a third data contact hole DCT3. The ninth drain electrode D9 may be connected to the eighth source electrode S8. The ninth source electrode S9 and the ninth drain electrode D9 may not overlap the ninth gate electrode G9 in the third direction DR3.

A fifth sub-transistor T101 of the tenth transistor T10 includes a fifth sub-channel CH101, a fifth sub-gate electrode G101, a fifth sub-source electrode S101, and a fifth sub-drain electrode D101. The fifth sub-channel CH101 may overlap the fifth sub-gate electrode G101 in the third direction DR3. The fifth sub-gate electrode G101 may be formed integrally with the second gate connection electrode GCE2. The fifth sub-source electrode S101 may be disposed at one side of the fifth sub-channel CH101, and the fifth sub-drain electrode D101 may be disposed at the other side of the fifth sub-channel CH101. The fifth sub-source electrode S101 may be connected to an eighth sub-drain electrode D112, and the fifth sub-drain electrode D101 may be connected to a sixth sub-source electrode S102. The fifth sub-source electrode S101 and the fifth sub-drain electrode D101 may not overlap the fifth sub-gate electrode G101. The fifth sub-source electrode S101 may overlap the kkth scan write line GWLk in the third direction DR3. The fifth sub-drain electrode D101 may overlap the initialization voltage line VIL in the third direction DR3.

A sixth sub-transistor T102 of the tenth transistor T10 includes a sixth sub-channel CH102, a sixth sub-gate electrode G102, the sixth sub-source electrode S102, and a sixth sub-drain electrode D102. The sixth sub-channel CH102 may overlap the sixth sub-gate electrode G102 in the third direction DR3. The sixth sub-gate electrode G102 may be formed integrally with the second gate connection electrode GCE2. The sixth sub-source electrode S102 may be disposed at one side of the sixth sub-channel CH102, and the sixth sub-drain electrode D102 may be disposed at the other side of the sixth sub-channel CH102. The sixth sub-source electrode S102 may be connected to the fifth sub-drain electrode D101, and the sixth sub-drain electrode D102 may be connected to the initialization voltage line VIL through the first power contact hole VCT1. The sixth sub-source electrode S102 and the sixth sub-drain electrode D102 may not overlap the sixth sub-gate electrode G102. The sixth sub-source electrode S102 and the sixth sub-drain electrode D102 may overlap the initialization voltage line VIL in the third direction DR3.

A seventh sub-transistor T111 of the eleventh transistor T11 includes a seventh sub-channel CH111, a seventh sub-gate electrode G111, the seventh sub-source electrode S111, and a seventh sub-drain electrode D111. The seventh sub-channel CH111 may overlap the seventh sub-gate electrode G111 in the third direction DR3. The seventh sub-gate electrode G111 may be formed integrally with the first gate connection electrode GCE1. The seventh sub-source electrode S111 may be disposed at one side of the seventh sub-channel CH111, and the seventh sub-drain electrode D111 may be disposed at the other side of the seventh sub-channel CH111. The seventh sub-source electrode S111 may be connected to the eighth drain electrode D8, and the seventh sub-drain electrode D111 may be connected to an eighth sub-source electrode S112. The seventh sub-source electrode S111 and the seventh sub-drain electrode D111 may not overlap the seventh sub-gate electrode G111.

An eighth sub-transistor T112 of the eleventh transistor T11 includes an eighth sub-channel CH112, an eighth sub-gate electrode G112, the eighth sub-source electrode S112, and the eighth sub-drain electrode D112. The eighth sub-channel CH112 may overlap the eighth sub-gate electrode G112 in the third direction DR3. The eighth sub-gate electrode G112 may be formed integrally with the second gate connection electrode GCE2. The eighth sub-source electrode S112 may be disposed at one side of the eighth sub-channel CH112, and the eighth sub-drain electrode D112 may be disposed at the other side of the eighth sub-channel CH112. The eighth sub-source electrode S112 may be connected to the seventh sub-drain electrode D111, and the eighth sub-drain electrode D112 may be connected to the fifth sub-source electrode S101. The eighth sub-source electrode S112 and the eighth sub-drain electrode D112 may not overlap the eighth sub-gate electrode G112.

The twelfth transistor T12 includes a twelfth channel CH12, a twelfth gate electrode G12, a twelfth source electrode S12, and the twelfth drain electrode D12. The twelfth channel CH12 may overlap the twelfth gate electrode G12 in the third direction DR3. The twelfth gate electrode G12 may be formed integrally with the third gate connection electrode GCE3. The twelfth source electrode S12 may be disposed at one side of the twelfth channel CH12, and the twelfth drain electrode D12 may be disposed at the other side of the twelfth channel CH12. The twelfth source electrode S12 and the twelfth drain electrode D12 may not overlap the twelfth gate electrode G12 in the third direction DR3.

In one or more embodiments, the twelfth source electrode S12 may be connected to the fifth connection electrode CCE5 through an eleventh contact holes CT11. In FIG. 11, the fifth connection electrode CCE5 is illustrated as having five eleventh contact holes CT11, but the present disclosure is not limited thereto. The fifth connection electrode CCE5 may transmit a second power voltage "VDD2" (see FIG. 4) of the second power connection electrode VDCE to the twelfth source electrode S12 of the twelfth transistor T12 through the eleventh contact holes CT11. In other words, as the number of the eleventh contact holes CT11 increases, the second power voltage VDD2 may be smoothly transmitted to the twelfth source electrode S12 of the twelfth transistor T12.

In one or more embodiments, the twelfth drain electrode D12 of the twelfth transistor T12 may be connected to the eighth source electrode S8 and the ninth drain electrode D9. The twelfth drain electrode D12 may extend in the second direction DR2 to overlap the k$^{th}$ PWM emission line PWELk, the second connection electrode CCE2, and the first horizontal power line HVDL in the third direction DR3. An area of the twelfth drain electrode D12 may be increased to increase a first resistance "R1" (see FIG. 5) between the twelfth drain electrode D12 of the twelfth transistor T12 and the eighth source electrode S8 of the eighth transistor T8.

The thirteenth transistor T13 includes a thirteenth channel CH13, a thirteenth gate electrode G13, a thirteenth source electrode S13, and a thirteenth drain electrode D13. The thirteenth channel CH13 may overlap the thirteenth gate electrode G13 in the third direction DR3. The thirteenth gate electrode G13 may be formed integrally with the third gate connection electrode GCE3. The thirteenth source electrode S13 may be disposed at one side of the thirteenth channel CH13, and the thirteenth drain electrode D13 may be disposed at the other side of the thirteenth channel CH13. The thirteenth source electrode S13 may be connected to the first horizontal power line HVDL through a second power contact hole VCT2. The thirteenth drain electrode D13 may be connected to the second connection electrode CCE2 through a third contact hole CT3. The thirteenth source electrode S13 and the thirteenth drain electrode D13 may not overlap the thirteenth gate electrode G13 in the third direction DR3.

The fourteenth transistor T14 includes a fourteenth channel CH14, a fourteenth gate electrode G14, a fourteenth source electrode S14, and a fourteenth drain electrode D14. The fourteenth channel CH14 may overlap the fourteenth gate electrode G14 in the third direction DR3. The fourteenth gate electrode G14 may be formed integrally with the third gate connection electrode GCE3. The fourteenth source electrode S14 may be disposed at one side of the fourteenth channel CH14, and the fourteenth drain electrode D14 may be disposed at the other side of the fourteenth channel CH14. The fourteenth source electrode S14 may be connected to the fifth connection electrode CCE5 through the eleventh contact holes CT11. The fourteenth drain electrode D14 may be connected to the second connection electrode CCE2 through a fourth contact hole CT4. The fourteenth source electrode S14 and the fourteenth drain electrode D14 may not overlap the fourteenth gate electrode G14 in the third direction DR3.

The fifteenth transistor T15 includes a fifteenth channel CH15, a fifteenth gate electrode G15, the fifteenth source electrode S15, and the fifteenth drain electrode D15. The fifteenth channel CH15 may overlap the fifteenth gate electrode G15 in the third direction DR3. The fifteenth gate electrode G15 may be formed integrally with the fifth capacitor electrode CE5. The fifteenth source electrode S15 may be disposed at one side of the fifteenth channel CH15, and the fifteenth drain electrode D15 may be disposed at the other side of the fifteenth channel CH15. The fifteenth source electrode S15 and the fifteenth drain electrode D15 may not overlap the fifteenth gate electrode G15 in the third direction DR3.

In one or more embodiments, the fifteenth source electrode S15 may be connected to the fourth bridge connection electrode BCE4 through a seventh bridge contact hole BCT7. The fifteenth source electrode S15 may be connected to the bridge electrode BE through the fourth bridge connection electrode BCE4. The fifteenth source electrode S15 may overlap the bridge electrode BE in the third direction DR3, but the present disclosure is not limited thereto.

In one or more embodiments, the fifteenth drain electrode D15 may be physically connected to the seventeenth source electrode S17. The fifteenth drain electrode D15 and the seventeenth source electrode S17 may be connected to the eighth connection electrode CCE8 through twenty-fifth contact holes CT25. That is, the fifteenth drain electrode D15 and the seventeenth source electrode S17 may be physically connected to each other and may also be electrically connected to each other through the eighth connection electrode CCE8. In FIG. 11, the fifth connection electrode CCE5 is illustrated as having seven twenty-fifth contact holes CT25, but the present disclosure is not limited thereto. That is, as the number of the twenty-fifth contact holes CT25 increases, a third resistance "R3" (see FIG. 5) between the fifteenth drain electrode D15 and the seventeenth source electrode S17 may decrease.

A ninth sub-transistor T161 of the sixteenth transistor T16 includes a ninth sub-channel CH161, a ninth sub-gate electrode G161, a ninth sub-source electrode S161, and a ninth sub-drain electrode D161. The ninth sub-channel CH161 may overlap the ninth sub-gate electrode G161 in the third direction DR3. The ninth sub-gate electrode G161 may be formed integrally with the third gate connection electrode GCE3. The ninth sub-source electrode S161 may be disposed at one side of the ninth sub-channel CH161, and the ninth sub-drain electrode D161 may be disposed at the other side of the ninth sub-channel CH161. The ninth sub-source electrode S161 may be connected to the fourth connection electrode CCE4 through the tenth contact hole CT10, and the ninth sub-drain electrode D161 may be connected to a tenth sub-source electrode S162. The ninth sub-source electrode S161 and the ninth sub-drain electrode D161 may not overlap the ninth sub-gate electrode G161.

A tenth sub-transistor T162 of the sixteenth transistor T16 includes a tenth sub-channel CH162, a tenth sub-gate electrode G162, the tenth sub-source electrode S162, and a tenth sub-drain electrode D162. The tenth sub-channel CH162 may overlap the tenth sub-gate electrode G162 in the third direction DR3. The tenth sub-gate electrode G162 may be formed integrally with the third gate connection electrode GCE3. The tenth sub-source electrode S162 may be disposed at one side of the tenth sub-channel CH162, and the tenth sub-drain electrode D162 may be disposed at the other side of the tenth sub-channel CH162. The tenth sub-source electrode S162 may be connected to the ninth sub-drain electrode D161, and the tenth sub-drain electrode D162 may be connected to the initialization voltage line VIL through a ninth contact hole CT9. The tenth sub-source electrode S162 and the tenth sub-drain electrode D162 may not overlap the tenth sub-gate electrode G162.

The seventeenth transistor T17 includes a seventeenth channel CH17, a seventeenth gate electrode G17, the seventeenth source electrode S17, and a seventeenth drain electrode D17. The seventeenth channel CH17 may overlap the seventeenth gate electrode G17 in the third direction DR3. The seventeenth gate electrode G17 may be formed integrally with the fifth gate connection electrode GCE5. The seventeenth source electrode S17 may be disposed at one side of the seventeenth channel CH17, and the seventeenth drain electrode D17 may be disposed at the other side of the seventeenth channel CH17. The seventeenth source electrode S17 and the seventeenth drain electrode D17 may not overlap the seventeenth gate electrode G17 in the third direction DR3.

In one or more embodiments, the seventeenth source electrode S17 may be connected to the fifteenth drain electrode D15. The seventeenth source electrode S17 may be connected to the eighth connection electrode CCE8 through the twenty-fifth contact holes CT25. The seventeenth drain electrode D17 may be connected to the seventh connection electrode CCE7 through sixteenth contact holes CT16. The seventeenth drain electrode D17 may be physically spaced from an eighteenth drain electrode D18 of the eighteenth transistor T18. The seventeenth drain electrode D17 may be connected to the eighteenth drain electrode D18 through the seventh connection electrode CCE7. In FIG. 11, the seventh connection electrode CCE7 is illustrated as having five sixteenth contact holes CT16, but the present disclosure is not limited thereto. As the number of the sixteenth contact holes CT16 increases, the driving current flowing to the first electrode of the light-emitting element EL may flow smoothly.

The eighteenth transistor T18 includes an eighteenth channel CH18, an eighteenth gate electrode G18, an eighteenth source electrode S18, and the eighteenth drain electrode D18. The eighteenth channel CH18 may overlap the eighteenth gate electrode G18 in the third direction DR3. The eighteenth gate electrode G18 may be formed integrally with the third gate connection electrode GCE3. The eighteenth source electrode S18 may be disposed at one side of the eighteenth channel CH18, and the eighteenth drain electrode D18 may be disposed at the other side of the eighteenth channel CH18. The eighteenth source electrode S18 and the eighteenth drain electrode D18 may not overlap the eighteenth gate electrode G18 in the third direction DR3.

In one or more embodiments, the eighteenth source electrode S18 may be connected to the initialization voltage line VIL through the ninth contact hole CT9. The eighteenth drain electrode D18 may be connected to the seventh connection electrode CCE7 through a twenty-sixth contact hole CT26. The eighteenth drain electrode D18 may be physically spaced from the seventeenth drain electrode D17. The eighteenth drain electrode D18 may be connected to the seventeenth drain electrode D17 through the seventh connection electrode CCE7.

The nineteenth transistor T19 includes a nineteenth channel CH19, a nineteenth gate electrode G19, a nineteenth source electrode S19, and a nineteenth drain electrode D19. The nineteenth channel CH19 may overlap the nineteenth gate electrode G19 in the third direction DR3. The nineteenth gate electrode G19 may be connected to the test signal line TSTL through a twenty-third contact hole CT23. The nineteenth source electrode S19 may be disposed at one side of the nineteenth channel CH19, and the nineteenth drain electrode D19 may be disposed at the other side of the nineteenth channel CH19. The nineteenth source electrode S19 may be connected to the third connection electrode CCE3 through a twenty-first contact hole CT21. The nineteenth drain electrode D19 may be connected to the third power line VSL through a twenty-fourth contact hole CT24. The nineteenth source electrode S19 and the nineteenth drain electrode D19 may not overlap the nineteenth gate electrode G19 in the third direction DR3.

The first capacitor electrode CE1 may be formed integrally with the first gate electrode G1. The second capacitor electrode CE2 may overlap the first capacitor electrode CE1 in the third direction DR3. The first capacitor electrode CE1 may be one electrode of the first capacitor C1, and the second capacitor electrode CE2 may be the other electrode of the first capacitor C1.

The second capacitor electrode CE2 may include a hole exposing the first gate electrode G1, and the first connection electrode CCE1 may be connected to the first gate electrode G1 through the first contact hole CT1 in the hole.

The second capacitor electrode CE2 may include an extension portion extending in the second direction DR2. The extension portion of the second capacitor electrode CE2 may intersect the $k^{th}$ PWM emission line PWELk and the first horizontal power line HVDL. The extension portion of the second capacitor electrode CE2 may be connected to the $k^{th}$ sweep signal line SWPLk through a fifth contact hole CT5.

The third capacitor electrode CE3 may be formed integrally with the eighth gate electrode G8. The fourth capacitor electrode CE4 may overlap the third capacitor electrode CE3 in the third direction DR3. The third capacitor electrode CE3 may be one electrode of the second capacitor C2, and the fourth capacitor electrode CE4 may be the other electrode of the second capacitor C2.

The fourth capacitor electrode CE4 may include a hole exposing the eighth gate electrode G8, and the sixth connection electrode CCE6 may be connected to the eighth gate electrode G8 through a twelfth contact hole CT12 in the hole.

The fifth capacitor electrode CE5 may be formed integrally with the fourth gate connection electrode GCE4 and the fifteenth gate electrode G15. The sixth capacitor electrode CE6 may overlap the fifth capacitor electrode CE5 in the third direction DR3. The fifth capacitor electrode CE5 may be one electrode of the third capacitor C3, and the sixth capacitor electrode CE6 may be the other electrode of the third capacitor C3. The sixth capacitor electrode CE6 may be connected to the initialization voltage line VIL through an eighteenth contact hole CT18.

The first gate connection electrode GCE1 may be connected to the $k^{th}$ scan write line GWLk through a first gate contact hole GCT1 and a third gate contact hole GCT3. The second gate connection electrode GCE2 may be connected to the $k^{th}$ scan initialization line GILk through a second gate contact hole GCT2. The third gate connection electrode GCE3 may be connected to the $k^{th}$ scan control line GCLk through an eighth contact hole CT8. The fourth gate connection electrode GCE4 may be connected to the fourth connection electrode CCE4 through a seventeenth contact hole CT17. The fifth gate connection electrode GCE5 may be connected to the $k^{th}$ PAM emission line PAELk through a nineteenth contact hole CT19. The sixth gate connection electrode GCE6 may be connected to the $k^{th}$ PWM emission line PWELk through a fourteenth contact hole CT14.

The bridge electrode BE may extend in the second direction DR2. The bridge electrode BE may intersect and overlap the $k^{th}$ PWM emission line PWELk, the first horizontal power line HVDL, the gate-off voltage line VGHL, the $k^{th}$ sweep signal line SWPLk, the $k^{th}$ scan control line GCLk, and the $k^{th}$ PAM emission line PAELk which extend in the first direction DR1. The bridge electrode BE may be connected to the first bridge connection electrode BCE1 through a second bridge contact hole BCT2, may be connected to the second bridge connection electrode BCE2 through a fourth bridge contact hole BCT4, and may be connected to the third bridge connection electrode BCE3 through a sixth bridge contact hole BCT6. The bridge electrode BE may be connected to the fourth bridge connection electrode BCE4 through an eighth bridge contact hole BCT8.

The first data connection electrode DCE1 may be connected to the second source electrode S2 through the first data contact hole DCT1 and may be connected to the $j^{th}$ data line DLj through the second data contact hole DCT2. The second data connection electrode DCE2 may be connected to the ninth source electrode S9 through the third data contact hole DCT3 and may be connected to the first PAM data line RDL through a fourth data contact hole DCT4.

The first connection electrode CCE1 may extend in the second direction DR2. The first connection electrode CCE1 may be connected to the first gate electrode G1 through the first contact hole CT1 and may be connected to the first sub-source electrode S31 and the fourth sub-drain electrode D42 through a second contact hole CT2.

The second connection electrode CCE2 may extend in the first direction DR1. The second connection electrode CCE2 may be connected to the thirteenth drain electrode D13 through the third contact hole CT3, may be connected to the fourteenth drain electrode D14 through the fourth contact hole CT4, and may be connected to the fourth capacitor electrode CE4 through a fifteenth contact hole CT15.

The third connection electrode CCE3 may be connected to the nineteenth source electrode S19 through the twenty-first contact hole CT21 and may be connected to the first anode connection electrode ANDE1 through a twenty-second contact hole CT22.

The fourth connection electrode CCE4 may extend in the first direction DR1. The fourth connection electrode CCE4 may be connected to the sixth drain electrode D6 and the ninth sub-source electrode S161 through the tenth contact hole CT10 and may be connected to the fourth gate connection electrode GCE4 through the seventeenth contact hole CT17.

The fifth connection electrode CCE5 may include a first extension portion extending in the first direction DR1 and a second extension portion extending in the second direction DR2. The first extension portion of the fifth connection electrode CCE5 may be connected to the second power connection electrode VDCE through a fourth power contact hole VCT4. The second extension portion of the fifth connection electrode CCE5 may be connected to the twelfth source electrode S12 and the fourteenth source electrode S14 through the eleventh contact holes CT11.

The sixth connection electrode CCE6 may extend in the second direction DR2. The sixth connection electrode CCE6 may be connected to the third capacitor electrode CE3 through the twelfth contact hole CT12 and may be connected to the fifth sub-source electrode S101 and the eighth sub-drain electrode D112 through a thirteenth contact hole CT13.

The seventh connection electrode CCE7 may extend in the first direction DR1. The seventh connection electrode CCE7 may be connected to the seventeenth drain electrode D17 through the sixteenth contact holes CT16 and may be connected to the eighteenth drain electrode D18 through the twenty-sixth contact hole CT26. The seventh connection electrode CCE7 may electrically connect the eighteenth drain electrode D18 of the first active pattern "AP1" (see FIG. 7) and the seventeenth drain electrode D17 of the second active pattern "AP2" (see FIG. 7) that are physically spaced from each other. An overlapping area of the seventh connection electrode CCE7 and the seventeenth drain electrode D17 may be greater than an overlapping area of the seventh connection electrode CCE7 and the eighteenth drain electrode D18. The seventh connection electrode CCE7 may be connected to the first anode connection electrode ANDE1 through a twentieth contact hole CT20.

A length of the seventh connection electrode CCE7 in the first direction DR1 may be greater than a length of the seventeenth drain electrode D17, which overlaps the seventh connection electrode CCE7, in the third direction DR3.

The eighth connection electrode CCE8 may extend in the first direction DR1. The eighth connection electrode CCE8 may be connected to the seventeenth source electrode S17 and the fifteenth drain electrode D15 through the twenty-fifth contact holes CT25.

The first bridge connection electrode BCE1 may be connected to the eighth drain electrode D8 of the eighth transistor T8 through the first bridge contact holes BCT1 and may be connected to the bridge electrode BE through the second bridge contact hole BCT2.

The second bridge connection electrode BCE2 may be connected to the eighth drain electrode D8 of the eighth transistor T8 through the third bridge contact hole BCT3 and may be connected to the bridge electrode BE through the fourth bridge contact hole BCT4.

The third bridge connection electrode BCE3 may be connected to the eighth drain electrode D8 of the eighth transistor T8 through the fifth bridge contact hole BCT5 and may be connected to the bridge electrode BE through the sixth bridge contact hole BCT6.

The fourth bridge connection electrode BCE4 may be connected to the fifteenth source electrode S15 of the fifteenth transistor T15 through the seventh bridge contact hole BCT7 and may be connected to the bridge electrode BE through an eighth bridge contact hole BCT8.

The first bridge connection electrode BCE1 may be disposed between the $k^{th}$ scan write line GWLk and the $k^{th}$ PWM emission line PWELk. The second bridge connection electrode BCE2 may be disposed between the $k^{th}$ PWM emission line PWELk and the first horizontal power line HVDL. The third bridge connection electrode BCE3 may be disposed between the first horizontal power line HVDL and the $k^{th}$ sweep signal line SWPLk. The fourth bridge connection electrode BCE4 may be disposed between the $k^{th}$ PAM emission line PAELk and the initialization voltage line VIL of a $(k+1)^{th}$ subpixel.

The first anode connection electrode ANDE1 may extend in the second direction DR2. The first anode connection electrode ANDE1 may be connected to the seventh connection electrode CCE7 through the twentieth contact hole CT20 and may be connected to the third connection electrode CCE3 through the twenty-second contact hole CT22.

The second power connection electrode VDCE may extend in the second direction DR2. The second power connection electrode VDCE may be connected to the fifth connection electrode CCE5 through the fourth power contact hole VCT4.

In one or more embodiments, the bridge electrode BE may be connected to the eighth drain electrode D8 of the eighth transistor T8 through the first to third bridge connection electrodes BCE1 to BCE3 and may be connected to the fifteenth source electrode S15 of the fifteenth transistor T15 through the fourth bridge connection electrode BCE4. The bridge electrode BE may serve as a bridge that transmits the driving current Ids generated from the eighth transistor T8 to the fifteenth transistor T15. Because the bridge electrode BE is made of the second gate metal layer, a sheet resistance thereof may be 0.4Ω per unit area. The sheet resistance of the bridge electrode BE is about 10,000 times smaller than that of the active layer ACT that has a sheet resistance of 3,000Ω per unit area, thereby reducing or minimizing the second resistance R2 between the eighth transistor T8 and the fifteenth transistor T15 and reducing or minimizing a voltage drop of the driving current Ids flowing between the eighth transistor T8 and the fifteenth transistor T15.

In addition, the first resistance R1 between the twelfth drain electrode D12 of the twelfth transistor T12 and the eighth source electrode S8 of the eighth transistor T8 can be decreased, and the third resistance R3 between the fifteenth drain electrode D15 and the seventeenth source electrode S17 can be decreased.

Accordingly, even when the driving current is several hundreds pA, a voltage drop defined by the product of a line resistance S2 and a driving current pA may be decreased to about several to several hundreds mV to V. That is, according to the decrease in voltage drop, power consumption of the light-emitting element EL can be reduced and, a decrease in luminance can be reduced or minimized.

Figure 13:
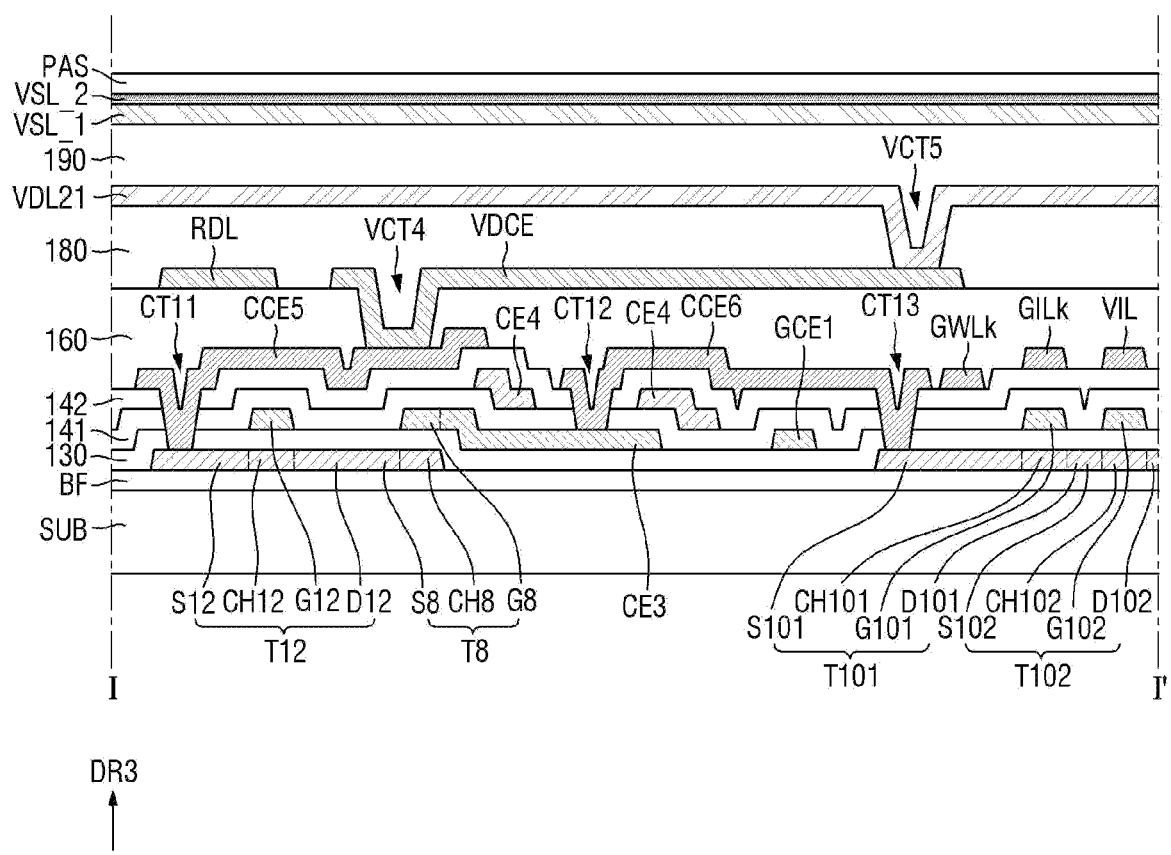
FIG. 13 is a cross-sectional view taken along the line I-I' of FIGS. 6 and 10.
Figure 14:
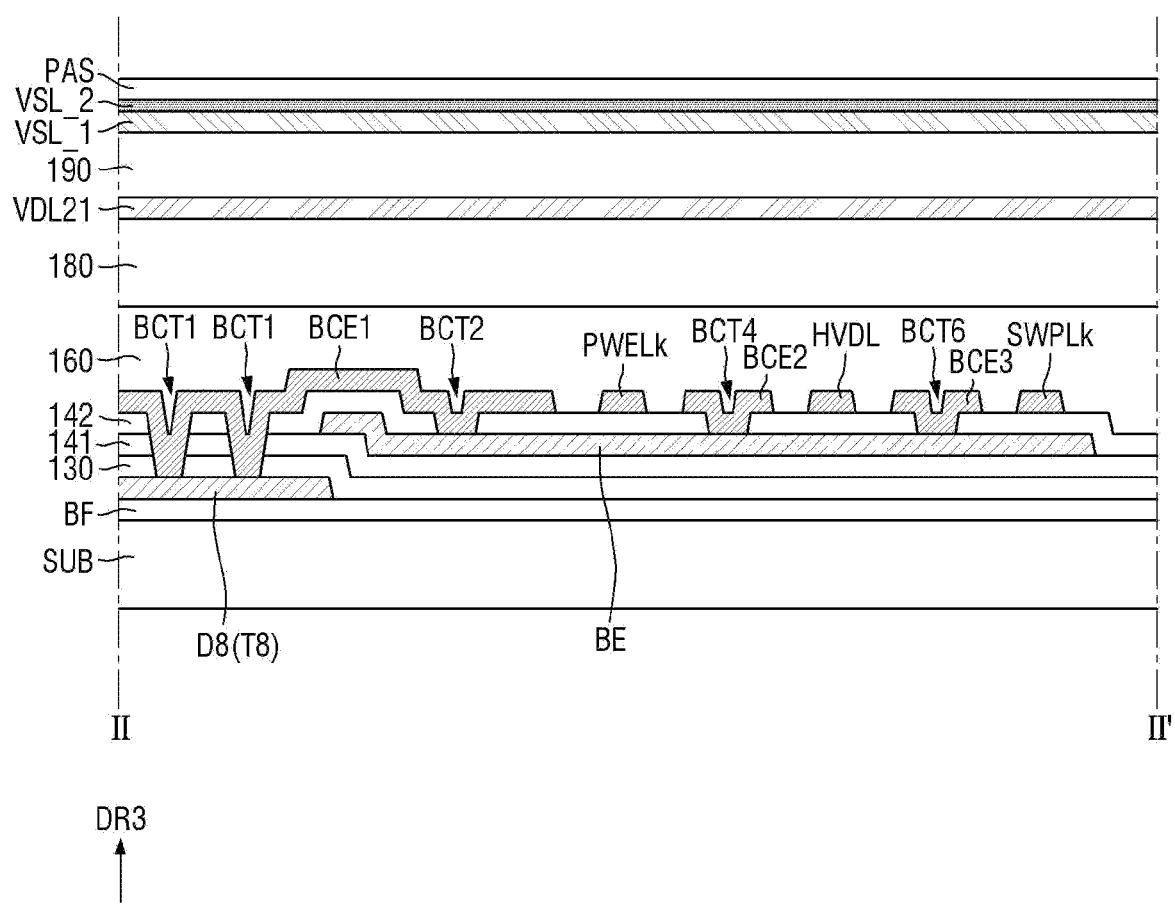
FIG. 14 is a cross-sectional view taken along the line II-II' of FIGS. 6 and 11.
Figure 15:
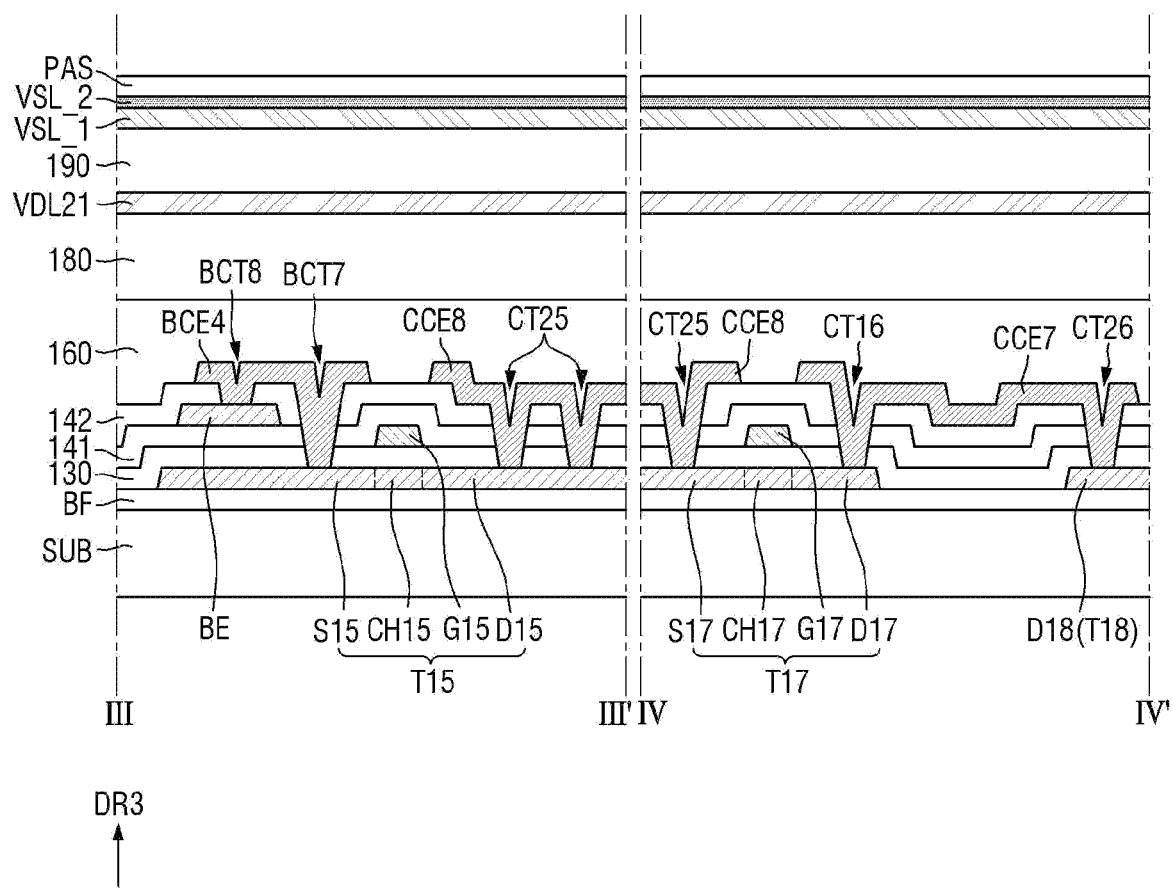
FIG. 15 shows cross-sectional views taken along the lines III-III' and IV-IV' of FIGS. 6 and 11.
Figure 16:
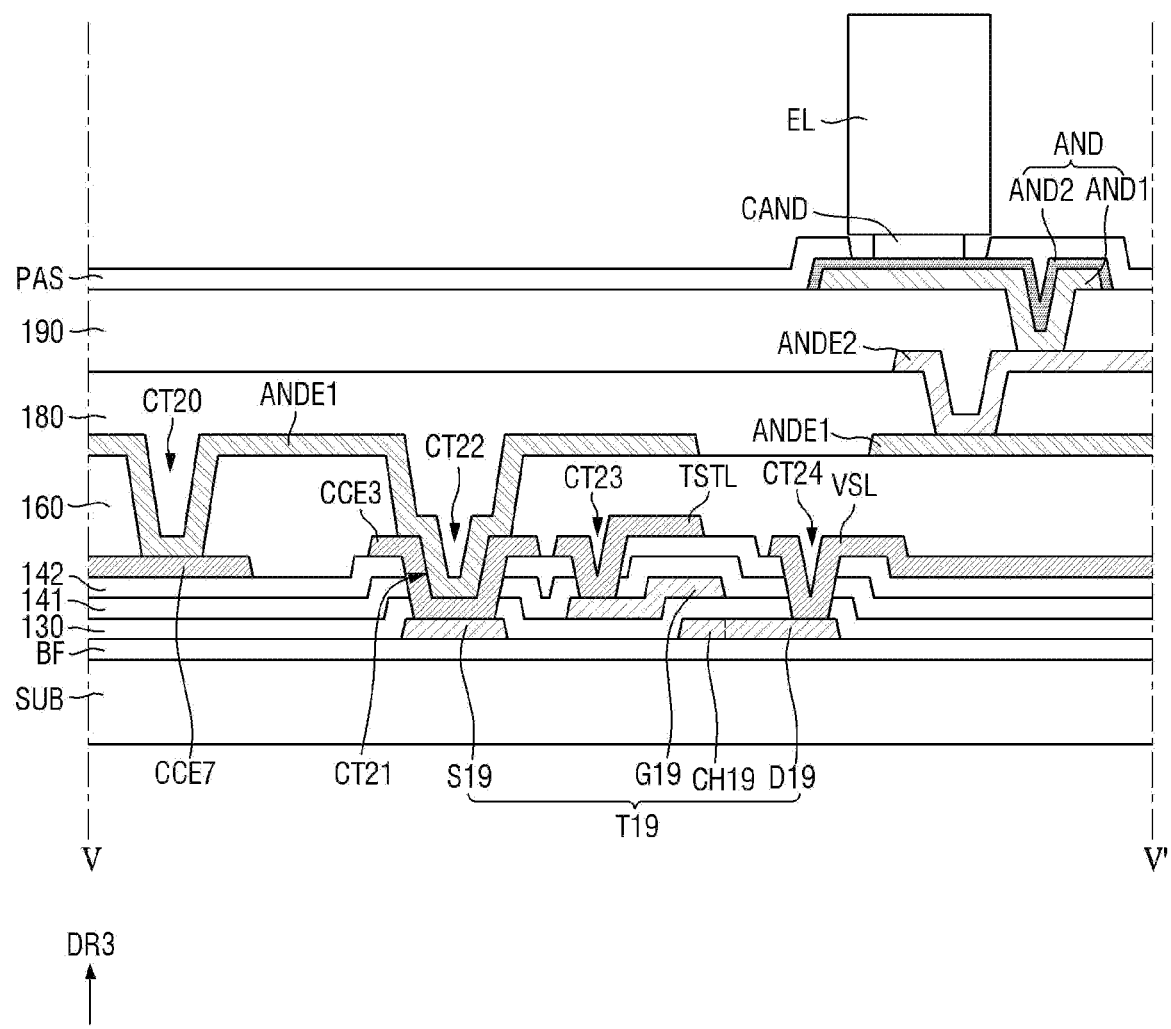
FIG. 16 is a cross-sectional view taken along the line V-V' of FIGS. 6 and 12.

FIG. 13 is a cross-sectional view taken along the line I-I' of FIGS. 6 and 10. FIG. 14 is a cross-sectional view taken along the line II-II' of FIGS. 6 and 11. FIG. 15 shows cross-sectional views taken along the lines III-III' and IV-IV' of FIGS. 6 and 11. FIG. 16 a cross-sectional view along the line V-V' of FIGS. 6 and 12.

Referring to FIGS. 13 to 16, a buffer film BF may be disposed on a substrate SUB. The substrate SUB may be made of an insulating material such as glass or a polymer resin. For example, when the substrate SUB is made of a polymer resin, the substrate SUB may include polyimide. The substrate SUB may be a flexible substrate that is bendable, foldable, and/or rollable.

The buffer film BF is a film for protecting transistors of a thin film transistor layer TFTL and an active layer of a light-emitting element EL from moisture permeating through the substrate SUB that is vulnerable to moisture permeation. The buffer film BF may be provided as a plurality of inorganic films that are alternately stacked. For example, the buffer film BF may be formed as a multi-film in which one or more inorganic films of a silicon nitride layer, a silicon oxynitride layer, a silicon oxide layer, a titanium oxide layer, and an aluminum oxide layer are alternately stacked.

An active layer may be disposed on the buffer film BF. The active layer includes first to nineteenth channels CH1 to CH19, first to nineteenth source electrodes S1 to S19, and first to nineteenth drain electrodes D1 to D19 of first to nineteenth transistors T1 to T19. The active layer may include polycrystalline silicon, single crystalline silicon, low-temperature polycrystalline silicon, amorphous silicon, or an oxide semiconductor.

For example, in FIG. 13, the twelfth channel CH12 of the twelfth transistor T12, the eighth channel CH8 of the eighth transistor T8, and the tenth channel CH10 (e.g., CH101, CH102) of the tenth transistor T10 may overlap a twelfth gate electrode G12, an eighth gate electrode G8, and a tenth gate electrode G10 (e.g., G101, G102) in a third direction DR3, respectively. In FIGS. 15 and 16, the fifteenth channel CH15 of the fifteenth transistor T15, the seventeenth channel CH17 of the seventeenth transistor T17, and the nineteenth channel CH19 of the nineteenth transistor T19 may overlap a fifteenth gate electrode G15, a seventeenth gate electrode G17, and a nineteenth gate electrode G19 in the third direction DR3, respectively. The first to nineteenth source electrodes S1 to S19 and the first to nineteenth drain electrodes D1 to D19 may be regions having conductivity by doping a silicon semiconductor or an oxide semiconductor with ions or impurities.

A gate insulating film 130 may be disposed on the active layer. The gate insulating film 130 may be formed as an inorganic film, for example, a silicon nitride layer, a silicon oxynitride layer, a silicon oxide layer, a titanium oxide layer, or an aluminum oxide layer. The gate insulating film 130 may be referred to as a first insulating film.

A first gate metal layer may be disposed on the gate insulating film 130. For example, in FIG. 13, the first gate metal layer may include the twelfth gate electrode G12, the eighth gate electrode G8, tenth gate electrodes G101 and G102, a third capacitor electrode CE3, and a first gate connection electrode GCE1. In FIG. 15, the first gate metal layer may include the fifteenth gate electrode G15 and the seventeenth gate electrode G17, and in FIG. 16, the first gate metal layer may include the nineteenth gate electrode G19. The first gate metal layer may be formed as a single layer or a multi-layer made of any one selected from among molybdenum (Mo), aluminum (Al), chromium (Cr), gold (Au), titanium (Ti), nickel (Ni), neodymium (Nd), and copper (Cu), or an alloy thereof.

In one or more embodiments, a first interlayer insulating film 141 may be disposed on the first gate metal layer. The first interlayer insulating film 141 may be formed as an inorganic film, for example, a silicon nitride layer, a silicon oxynitride layer, a silicon oxide layer, a titanium oxide layer, or an aluminum oxide layer. The first interlayer insulating film 141 may be referred to as a second insulating film.

In one or more embodiments, a second gate metal layer may be disposed on the first interlayer insulating film 141. The second gate metal layer may include a second capacitor electrode CE2, a fourth capacitor electrode CE4, a sixth capacitor electrode CE6, and a bridge electrode BE. The second gate metal layer may be formed as a single layer or a multi-layer made of any one selected from among molybdenum (Mo), aluminum (Al), chromium (Cr), gold (Au), titanium (Ti), nickel (Ni), neodymium (Nd), and copper (Cu), or an alloy thereof.

In FIG. 13, the fourth capacitor electrode CE4 may overlap the third capacitor electrode CE3 in the third direction DR3. Because the first interlayer insulating film 141 has certain permittivity, a second capacitor C2 may be formed by the third capacitor electrode CE3, the fourth capacitor electrode CE4, and the first interlayer insulating film 141 disposed therebetween.

In FIG. 14, the bridge electrode BE may overlap a first bridge connection electrode BCE1, a $k^{th}$ PWM emission line PWELk, a second bridge connection electrode BCE2, a first horizontal power line HVDL, a third bridge connection electrode BCE3, and a $k^{th}$ sweep signal line SWPLk in the third direction DR3.

In one or more embodiments, a first source metal layer may be disposed on a second interlayer insulating film 142. The first source metal layer may include an initialization voltage line VIL, a $k^{th}$ scan initialization line GILk, a $k^{th}$ scan write line GWLk, the $k^{th}$ PWM emission line PWELk, the first horizontal power line HVDL, a gate-off voltage line VGHL, the $k^{th}$ sweep signal line SWPLk, a $k^{th}$ scan control line GCLk, a $k^{th}$ PAM emission line PAELk, a test signal line TSTL, and a third power line VSL. In addition, the first source metal layer may include first and second data connection electrodes DCE1 and DCE2, first to eighth connection electrodes CCE1 to CCE8, and first to fourth bridge connection electrodes BCE1 to BCE4. The first source metal layer may be formed as a single layer or a multi-layer made of one selected from among molybdenum (Mo), aluminum (Al), chromium (Cr), gold (Au), titanium (Ti), nickel (Ni), neodymium (Nd), and copper (Cu), or an alloy thereof.

In one or more embodiments, the $k^{th}$ scan write line GWLk may be connected to the first gate connection electrode GCE1 through a first gate contact hole GCT1 and a third gate contact hole GCT3 passing through the first interlayer insulating film 141 and the second interlayer insulating film 142. The $k^{th}$ scan initialization line GILk may be connected to a second gate connection electrode GCE2 through a second gate contact hole GCT2 passing through the first interlayer insulating film 141 and the second interlayer insulating film 142. The kth scan control line GCLk may be connected to a third gate connection electrode GCE3 through an eighth contact hole CT8 passing through the first interlayer insulating film 141 and the second interlayer insulating film 142. The kth PAM emission line PAELk may be connected to a fifth gate connection electrode GCE5 through a nineteenth contact hole CT19 passing through the first interlayer insulating film 141 and the second interlayer insulating film 142. The kth PWM emission line PWELk may be connected to a sixth gate connection electrode GCE6 through a fourteenth contact hole CT14 passing through the first interlayer insulating film 141 and the second interlayer insulating film 142.

In one or more embodiments, the initialization voltage line VIL may be connected to a second sub-drain electrode D32 and a sixth sub-drain electrode D102 through a first power contact hole VCT1 passing through the gate insulating film 130, the first interlayer insulating film 141, and the second interlayer insulating film 142. The initialization voltage line VIL may be connected to a tenth sub-drain electrode D162 and the eighteenth drain electrode D18 through a ninth contact hole CT9 passing through the gate insulating film 130, the first interlayer insulating film 141, and the second interlayer insulating film 142. The initialization voltage line VIL may be connected to the sixth capacitor electrode CE6 through an eighteenth contact hole CT18 passing through the second interlayer insulating film 142. The first horizontal power line HVDL may be connected to the fifth source electrode S5 and the thirteenth source electrode S13 through a second power contact hole VCT2 passing through the gate insulating film 130, the first interlayer insulating film 141, and the second interlayer insulating film 142. The gate-off voltage line VGHL may be connected to the seventh source electrode S7 through a seventh contact hole CT7 passing through the gate insulating film 130, the first interlayer insulating film 141, and the second interlayer insulating film 142. The test signal line TSTL may be connected to the nineteenth gate electrode G19 through a twenty-third contact hole CT23 passing through the first interlayer insulating film 141 and the second interlayer insulating film 142. The third power line VSL may be connected to the nineteenth drain electrode D19 through a twenty-fourth contact hole CT24 passing through the gate insulating film 130, the first interlayer insulating film 141, and the second interlayer insulating film 142.

In one or more embodiments, the first data connection electrode DCE1 may be connected to the second source electrode S2 through a first data contact hole DCT1. The second data connection electrode DCE2 may be connected to the ninth source electrode S9 through a third data contact hole DCT3.

In one or more embodiments, the first connection electrode CCE1 may be connected to the first gate electrode G1 through a first contact hole CT1 and may be connected to a first sub-source electrode S31 and a fourth sub-drain electrode D42 through a second contact hole CT2.

In one or more embodiments, the second connection electrode CCE2 may be connected to the thirteenth drain electrode D13 through a third contact hole CT3, may be connected to the fourteenth drain electrode D14 through a fourth contact hole CT4, and may be connected to the fourth capacitor electrode CE4 through a fifteenth contact hole CT15.

The third connection electrode CCE3 may be connected to the nineteenth source electrode S19 through a twenty-first contact hole CT21 passing through the gate insulating film 130, the first interlayer insulating film 141, and the second interlayer insulating film 142 (see FIG. 16).

In one or more embodiments, the fourth connection electrode CCE4 may be connected to the sixth drain electrode D6 through a tenth contact hole CT10 and may be connected to a fourth gate connection electrode GCE4 through a seventeenth contact hole CT17.

The fifth connection electrode CCE5 may be connected to the twelfth source electrode S12 and the fourteenth source electrode S14 through an eleventh contact holes CT11 passing through the gate insulating film 130, the first interlayer insulating film 141, and the second interlayer insulating film 142 (see FIG. 13).

The sixth connection electrode CCE6 may be connected to the eighth gate electrode G8 through a twelfth contact hole CT12 passing through the first interlayer insulating film 141 and the second interlayer insulating film 142 and may be connected to a fifth sub-source electrode S101 and an eighth sub-drain electrode D112 through a thirteenth contact hole CT13 passing through the gate insulating film 130, the first interlayer insulating film 141, and the second interlayer insulating film 142 (see FIG. 13).

The seventh connection electrode CCE7 may be connected to the seventeenth drain electrode D17 through sixteenth contact holes CT16 passing through the gate insulating film 130, the first interlayer insulating film 141, and the second interlayer insulating film 142 and may be connected to the eighteenth drain electrode D18 through a twenty-sixth contact hole CT26 passing through the gate insulating film 130, the first interlayer insulating film 141, and the second interlayer insulating film 142 (see FIG. 15).

The eighth connection electrode CCE8 may be connected to the fifteenth drain electrode D15 and the seventeenth source electrode S17 through twenty-fifth contact holes CT25 passing through the gate insulating film 130, the first interlayer insulating film 141, and the second interlayer insulating film 142 (see FIG. 15).

The first bridge connection electrode BCE1 may be connected to the eighth drain electrode D8 through first bridge contact holes BCT1 passing through the gate insulating film 130, the first interlayer insulating film 141, and the second interlayer insulating film 142 may be connected to the bridge electrode BE through a second bridge contact hole BCT2 passing through the second interlayer insulating film 142 (see FIGS. 11 and 14).

The second bridge connection electrode BCE2 may be connected to the eighth drain electrode D8 through third bridge contact holes BCT3 passing through the gate insulating film 130, the first interlayer insulating film 141, and the second interlayer insulating film 142 and may be connected to the bridge electrode BE through a fourth bridge contact hole BCT4 passing through the second interlayer insulating film 142 (see FIGS. 11 and 14).

The third bridge connection electrode BCE3 may be connected to the eighth drain electrode D8 through fifth bridge contact holes BCT5 passing through the gate insulating film 130, the first interlayer insulating film 141, and the second interlayer insulating film 142 and may be connected to the bridge electrode BE through a sixth bridge contact hole BCT6 passing through the second interlayer insulating film 142 (see FIGS. 11 and 14).

The fourth bridge connection electrode BCE4 may be connected to the fifteenth drain electrode D15 through a seventh bridge contact holes BCT7 passing through the gate insulating film 130, the first interlayer insulating film 141, and the second interlayer insulating film 142 and may be connected to the bridge electrode BE through an eighth bridge contact hole BCT8 passing through the second interlayer insulating film 142 (see FIGS. 11 and 15).

A first planarization film 160 may be disposed on the first source metal layer. The first planarization film 160 may be formed as an organic film made of acrylic resin, epoxy resin, phenolic resin, polyamide resin, polyimide resin, or the like. The first planarization film 160 may be referred to as a fourth insulating film.

A second source metal layer may be disposed on the first planarization film 160. The second source metal layer may include a $j^{th}$ data line DLj, a first vertical power line VVDL, and a first PAM data line RDL. In addition, the second source metal layer may include a first anode connection electrode ANDE1 and a second power connection electrode VDCE. The second source metal layer may be formed as a single layer or a multi-layer made of any one selected from among molybdenum (Mo), aluminum (Al), chromium (Cr), gold (Au), titanium (Ti), nickel (Ni), neodymium (Nd), and copper (Cu), or an alloy thereof.

In one or more embodiments, the $j^{th}$ data line DLj may be connected to the first data connection electrode DCE1 through a second data contact hole DCT2 passing through the first planarization film 160. The first PAM data line RDL may be connected to the second data connection electrode DCE2 through a fourth data contact hole DCT4 passing through the first planarization film 160. The first vertical power line VVDL may be connected to the first horizontal power line HVDL through a third power contact hole VCT3 passing through the first planarization film 160. The third power contact hole VCT3 may overlap the second power contact hole VCT2 in the third direction DR3.

The first anode connection electrode ANDE1 may be connected to the seventh connection electrode CCE7 through a twentieth contact hole CT20 passing through the first planarization film 160 and may be connected to the third connection electrode CCE3 through a twenty-second contact hole CT22 passing through the first planarization film 160 (see FIG. 16). In one or more embodiments, the second power connection electrode VDCE may be connected to the fifth connection electrode CCE5 through a fourth power contact hole VCT4 passing through the first planarization film 160.

In one or more embodiments, a second planarization film 180 may be disposed on the second source metal layer. The second planarization film 180 may be formed as an organic film made of acrylic resin, epoxy resin, phenolic resin, polyamide resin, polyimide resin, or the like. The second planarization film 180 may be referred to as a fifth insulating film.

In one or more embodiments, a third source metal layer may be disposed on the second planarization film 180. The third source metal layer may include a first sub-power line VDL21 and a second anode connection electrode ANDE2 (see FIGS. 13-16). Referring to FIG. 13, the first sub-power line VDL21 may be connected to the second power connection electrode VDCE through a fifth power contact hole VCT5 passing through the second planarization film 180. Accordingly, the second power connection electrode VDCE may receive a second power voltage "VDD2" (see FIG. 4) through the first sub-power line VDL21. Referring to FIG. 16, the second anode connection electrode ANDE2 may be connected to the first anode connection electrode ANDE1 through a contact hole passing through the second planarization film 180. The third source metal layer may be formed as a single layer or a multi-layer made of any one selected from among molybdenum (Mo), aluminum (Al), chromium (Cr), gold (Au), titanium (Ti), nickel (Ni), neodymium (Nd), and copper (Cu), or an alloy thereof.

In one or more embodiments, a third planarization film 190 may be disposed on the third source metal layer. The third planarization film 190 may be formed as an organic film made of acrylic resin, epoxy resin, phenolic resin, polyamide resin, polyimide resin, or the like. The third planarization film 190 may be referred to as a sixth insulating film.

In one or more embodiments, a fourth source metal layer may be disposed on the third planarization film 190. The fourth source metal layer may include a second sub-power line VSL_1, a third sub-power line VSL_2, a first pixel electrode AND1, and a second pixel electrode AND2. Referring to FIG. 13, the second sub-power line VSL_1 and the first pixel electrode AND1 may be formed as a single layer or a multi-layer made of any one selected from among molybdenum (Mo), aluminum (Al), chromium (Cr), gold (Au), titanium (Ti), nickel (Ni), neodymium (Nd), and copper (Cu), or an alloy thereof. The third sub-power line VSL_2 and the second pixel electrode AND2 may include a transparent metal material TCO such as indium tin oxide (ITO) or indium zinc oxide (IZO). In one or more embodiments, the second sub-power line VSL_1 and the third sub-power line VSL_2 may be connected to the third power line VSL to receive a third power voltage "VSS" (see FIG. 4).

A protective film PAS may be disposed on the fourth source metal layer. The protective film PAS may be formed as a silicon nitride layer, a silicon oxynitride layer, a silicon oxide layer, a titanium oxide layer, or an aluminum oxide layer. The protective film PAS may expose a portion of an upper surface of the pixel electrode AND (e.g., AND1, AND2) without covering the portion of the upper surface (see FIG. 16).

Referring to FIG. 16, the light-emitting element EL may be disposed on the portion of the pixel electrode AND not covered by the protective film PAS. A contact electrode CAND may be disposed between the light-emitting element EL and the pixel electrode AND.

The light-emitting element EL may be an inorganic light-emitting diode element. The light-emitting element EL may include a first semiconductor layer, the active layer, and a second semiconductor layer that are sequentially stacked.

The first semiconductor layer may be disposed on the contact electrode CAND. The first semiconductor layer may be doped with a first conductivity type dopant such as magnesium (Mg), zinc (Zn), calcium (Ca), barium (Ba), or the like. For example, the first semiconductor layer may be p-GaN doped with p-type Mg.

The active layer may be disposed on the first semiconductor layer. The active layer may emit light through a combination of electron-hole pairs according to an electric signal applied through the first semiconductor layer and the second semiconductor layer. The active layer may include a material having a single or multi-quantum well structure. When the active layer includes a material having a multi-quantum well structure, the active layer may have a structure in which a plurality of well layers and a plurality of barrier layers are alternately stacked. Alternatively, the active layer may have a structure in which a semiconductor material having large band gap energy and a semiconductor material having small band gap energy are alternately stacked with each other and may include other Group III to Group V semiconductor materials according to a wavelength band of emitted light.

The second semiconductor layer may be disposed on the active layer. The second semiconductor layer may be doped with a second conductivity type dopant such as silicon (Si), germanium (Ge), tin (Sn), selenium (Se), or the like. For example, the second semiconductor layer may be n-GaN doped with n-type Si.

In addition, in one or more embodiments, a fourth planarization layer for planarizing a stepped portion caused by the light-emitting element EL may be disposed. The fourth planarization layer may be disposed to be around (e.g., surround) side surfaces of the light-emitting element EL and may expose an upper surface of the light-emitting element EL without covering the upper surface.

In one or more embodiments, a common electrode to which a common voltage is applied may be disposed on the light-emitting element EL and the fourth planarization layer. The common electrode may be made of a TCO, such as ITO or IZO, which is capable of transmitting light.

Figure 17:
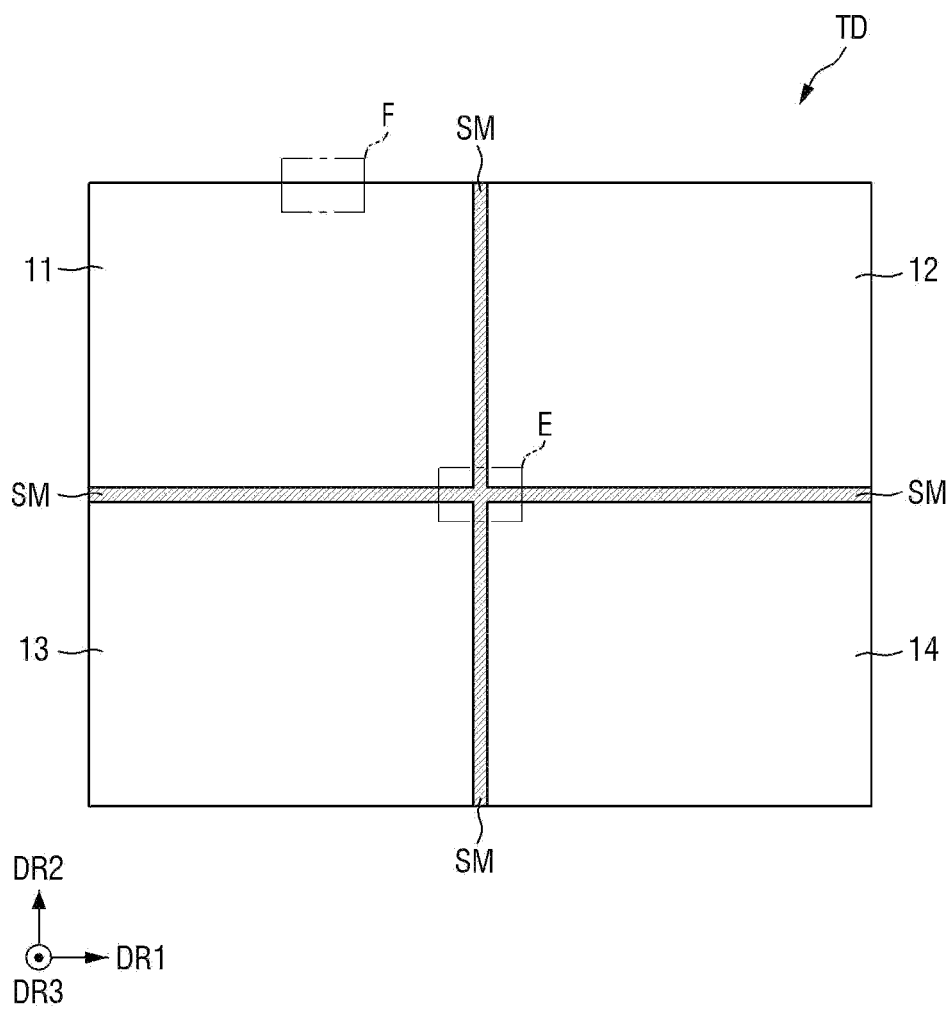
FIG. 17 is a perspective view illustrating a tiled display device including a plurality of display devices according to one or more embodiments.

FIG. 17 is a perspective view illustrating a tiled display device including a plurality of display devices according to one or more embodiments.

Referring to FIG. 17, a tiled display device TD may include a plurality of display devices 11, 12, 13, and 14, and a connection member SM. For example, the tiled display device TD may include a first display device 11, a second display device 12, a third display device 13, and a fourth display device 14.

The plurality of display devices 11, 12, 13, and 14 may be arranged in a grid shape. The plurality of display devices 11, 12, 13, and 14 may be arranged in a matrix form in M rows and N columns (here, M is a positive integer and N is a positive integer). For example, the first display device 11 and the second display device 12 may be adjacent to each other in a first direction DR1. The first display device 11 and the third display device 13 may be adjacent to each other in a second direction DR2. The third display device 13 and the fourth display device 14 may be adjacent to each other in the first direction DR1. The second display device 12 and the fourth display device 14 may be adjacent to each other in the second direction DR2.

However, the number and arrangement of the plurality of display devices 11, 12, 13, and 14 in the tiled display device TD are not limited to those shown in FIG. 17. The number and arrangement of the display devices 11, 12, 13, and 14 in the tiled display device TD may be determined according to the size of each of a display device 10 and the tiled display device TD and the shape of the tiled display device TD.

The plurality of display devices 11, 12, 13, and 14 may have the same size, but the present disclosure is not limited thereto. For example, the plurality of display devices 11, 12, 13, and 14 may have different sizes.

The plurality of display devices 11, 12, 13, and 14 may each have a rectangular shape including long sides and short sides. The plurality of display devices 11, 12, 13, and 14 may be disposed such that the long sides or the short sides are connected to each other. Some or all of the plurality of display devices 11, 12, 13, and 14 may be disposed at an edge of the tiled display device TD and may form one side of the tiled display device TD. At least one display device of the plurality of display devices 11, 12, 13, and 14 may be disposed at at least one corner of the tiled display device TD and may form two adjacent sides of the tiled display device TD. At least one display device of the plurality of display devices 11, 12, 13, and 14 may be surrounded by other display devices.

Each of the plurality of display devices 11, 12, 13, and 14 may be substantially the same as the display device 10 described with reference to FIG. 1. Therefore, descriptions of each of the plurality of display devices 11, 12, 13, and 14 will be omitted.

The connection member SM may include a coupling member or an adhesive member. In this case, the plurality of display devices 11, 12, 13, and 14 may be connected to each other through the coupling member or the adhesive member of the connection member SM. The connection member SM may be disposed between the first display device 11 and the second display device 12, between the first display device 11 and the third display device 13, between the second display device 12 and the fourth display device 14, and between the third display device 13 and the fourth display device 14.

Figure 18:
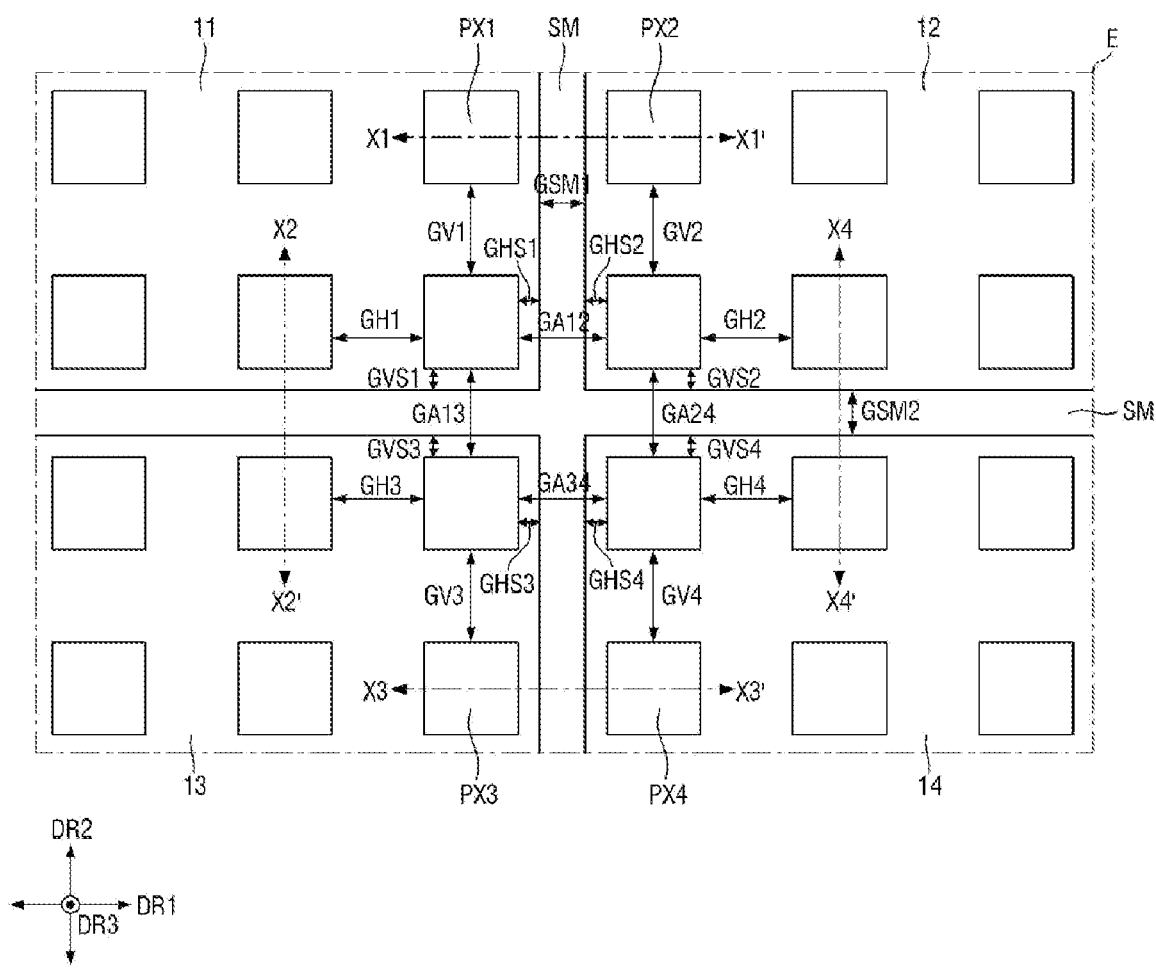
FIG. 18 is an enlarged layout illustrating an area E of FIG. 17 in detail.

FIG. 18 is an enlarged layout illustrating an area E of FIG. 17 in detail.

Referring to FIG. 18, the connection member SM may have a planar shape such as a cross or a plus sign in a central area of the tiled display device TD in which the first display device 11, the second display device 12, the third display device 13, and the fourth display device 14 are adjacent to each other. The connection member SM may be disposed between the first display device 11 and the second display device 12, between the first display device 11 and the third display device 13, between the second display device 12 and the fourth display device 14, and between the third display device 13 and the fourth display device 14.

The first display device 11 may include first pixels PX1 arranged in a matrix form along the first direction DR1 and the second direction DR2 to display an image. The second display device 12 may include second pixels PX2 arranged in a matrix form along the first direction DR1 and the second direction DR2 to display an image. The third display device 13 may include third pixels PX3 arranged in a matrix form along the first direction DR1 and the second direction DR2 to display an image. The fourth display device 14 may include fourth pixels PX4 arranged in a matrix form along the first direction DR1 and the second direction DR2 to display an image.

A minimum distance between adjacent first pixels PX1 in the first direction DR1 may be defined as a first horizontal separation distance GH1, and a minimum distance between adjacent second pixels PX2 in the first direction DR1 may be defined as a second horizontal separation distance GH2. The first horizontal separation distance GH1 and the second horizontal separation distance GH2 may be substantially the same.

The connection member SM may be disposed between the first pixel PX1 and the second pixel PX2 that are adjacent to each other in the first direction DR1. A minimum distance GA12 between the first pixel PX1 and the second pixel PX2 adjacent to each other in the first direction DR1 may be the sum of a minimum distance GHS1 between the first pixel PX1 and the connection member SM in the first direction DR1, a minimum distance GHS2 between the second pixel PX2 and the connection member SM in the first direction DR1 and a width GSM1 of the connection member SM in the first direction DR1.

The minimum distance GA12 between the first pixel PX1 and the second pixel PX2 adjacent to each other in the first direction DR1, the first horizontal separation distance GH1, and the second horizontal separation distance GH2 may be substantially the same. To this end, the minimum distance GHS1 between the first pixel PX1 and the connection member SM in the first direction DR1 may be shorter than the first horizontal separation distance GH1, and the minimum distance GHS2 between the second pixel PX2 and the connection member SM in the first direction DR1 may be shorter than the second horizontal separation distance GH2. In addition, the width GSM1 of the connection member SM in the first direction DR1 may be less than the first horizontal separation distance GH1 or the second horizontal separation distance GH2.

A minimum distance between adjacent third pixels PX3 in the first direction DR1 may be defined as a third horizontal separation distance GH3, and a minimum distance between adjacent fourth pixels PX4 in the first direction DR1 may be defined as a fourth horizontal separation distance GH4. The third horizontal separation distance GH3 and the fourth horizontal separation distance GH4 may be substantially the same.

The connection member SM may be disposed between the third pixel PX3 and the fourth pixel PX4 that are adjacent to each other in the first direction DR1. A minimum distance GA34 between the third pixel PX3 and the fourth pixel PX4 adjacent to each other in the first direction DR1 may be the sum of a minimum distance GHS3 between the third pixel PX3 and the connection member SM in the first direction DR1, a minimum distance GHS4 between the fourth pixel PX4 and the connection member SM in the first direction DR1 and the width GSM1 of the connection member SM in the first direction DR1.

The minimum distance GA34 between the third pixel PX3 and the fourth pixel PX4 adjacent to each other in the first direction DR1, the third horizontal separation distance GH3, and the fourth horizontal separation distance GH4 may be substantially the same. To this end, the minimum distance GHS3 between the third pixel PX3 and the connection member SM in the first direction DR1 may be shorter than the third horizontal separation distance GH3, and the minimum distance GHS4 between the fourth pixel PX4 and the connection member SM in the first direction DR1 may be shorter than the fourth horizontal separation distance GH4. In addition, the width GSM1 of the connection member SM in the first direction DR1 may be less than the third horizontal separation distance GH3 or the fourth horizontal separation distance GH4.

A minimum distance between adjacent first pixels PX1 in the second direction DR2 may be defined as a first vertical separation distance GV1, and a minimum distance between adjacent third pixels PX3 in the second direction DR2 may be defined as a third vertical separation distance GV3. The first vertical separation distance GV1 and the third vertical separation distance GV3 may be substantially the same.

The connection member SM may be disposed between the first pixel PX1 and the third pixel PX3 that are adjacent to each other in the second direction DR2. A minimum distance GA13 between the first pixel PX1 and the third pixel PX3 adjacent to each other in the second direction DR2 may be the sum of a minimum distance GVS1 between the first pixel PX1 and the connection member SM in the second direction DR2, a minimum distance GVS3 between the third pixel PX3 and the connection member SM in the second direction DR2, and a width GSM2 of the connection member SM in the second direction DR2.

The minimum distance GA13 between the first pixel PX1 and the third pixel PX3 adjacent to each other in the second direction DR2, the first vertical separation distance GV1, and the third vertical separation distance GV3 may be substantially the same. To this end, the minimum distance GVS1 between the first pixel PX1 and the connection member SM in the second direction DR2 may be shorter than the first vertical separation distance GV1, and the minimum distance GVS3 between the third pixel PX3 and the connection member SM in the second direction DR2 may be shorter than the third vertical separation distance GV3. In addition, the width GSM2 of the connection member SM in the second direction DR2 may be less than the first vertical separation distance GV1 or the third vertical separation distance GV3.

A minimum distance between adjacent second pixels PX2 in the second direction DR2 may be defined as a second vertical separation distance GV2, and a minimum distance between adjacent fourth pixels PX4 in the second direction DR2 may be defined as a fourth vertical separation distance GV4. The second vertical separation distance GV2 and the fourth vertical separation distance GV4 may be substantially the same.

The connection member SM may be disposed between the second pixel PX2 and the fourth pixel PX4 that are adjacent to each other in the second direction DR2. A minimum distance GA24 between the second pixel PX2 and the fourth pixel PX4 adjacent to each other in the second direction DR2 may be the sum of a minimum distance GVS2 between the second pixel PX2 and the connection member SM in the second direction DR2, a minimum distance GVS4 between the fourth pixel PX4 and the connection member SM in the second direction DR2, and a width GSM2 of the connection member SM in the second direction DR2.

The minimum distance GA24 between the second pixel PX2 and the fourth pixel PX4 adjacent to each other in the second direction DR2, the second vertical separation distance GV2, and the fourth vertical separation distance GV4 may be substantially the same. To this end, the minimum distance GVS2 between the second pixel PX2 and the connection member SM in the second direction DR2 may be shorter than the second vertical separation distance GV2, and the minimum distance GVS4 between the fourth pixel PX4 and the connection member SM in the second direction DR2 may be shorter than the fourth vertical separation distance GV4. In addition, the width GSM2 of the connection member SM in the second direction DR2 may be less than the second vertical separation distance GV2 or the fourth vertical separation distance GV4.

As shown in FIG. 18, in order to prevent the connection member SM from appearing between images displayed by the plurality of display devices 11, 12, 13, and 14, a minimum distance between pixels of adjacent display devices may be substantially the same as the minimum distance between pixels of each of the display devices.

Figure 19:
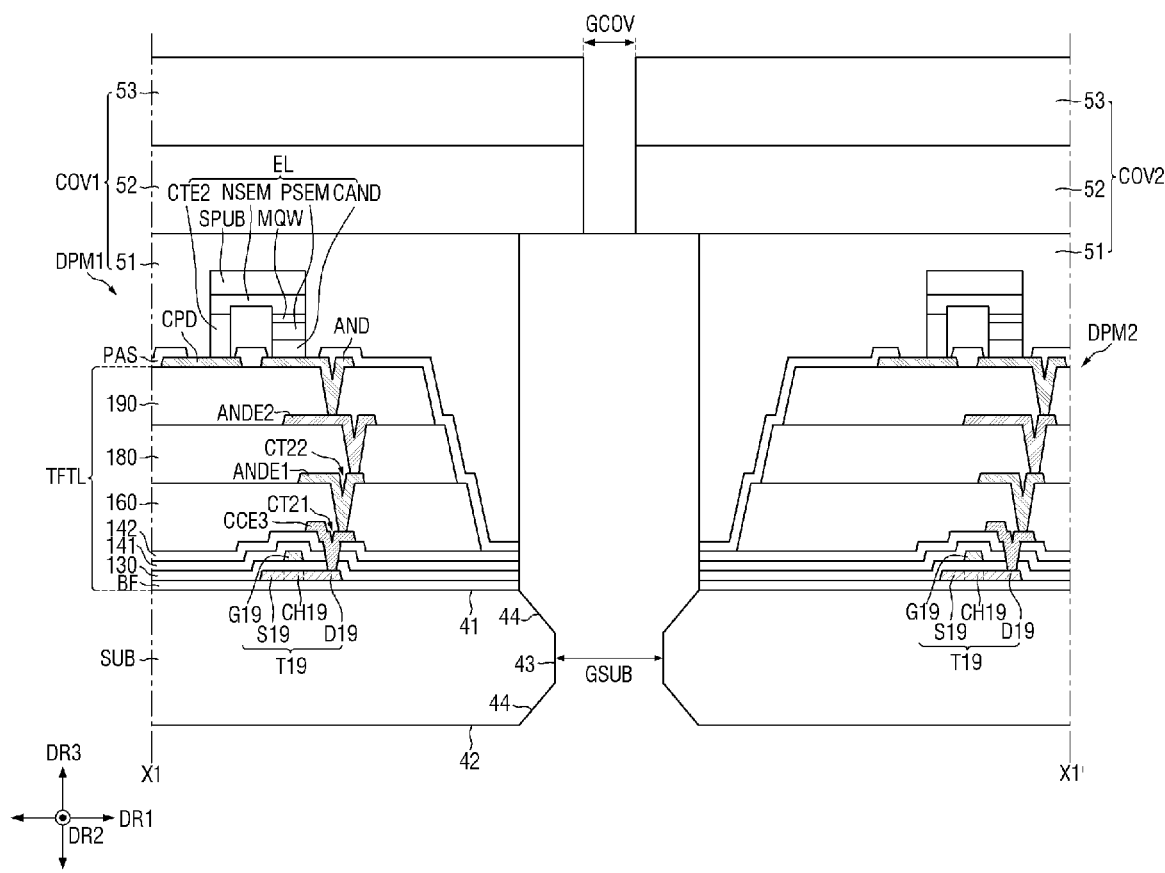
FIG. 19 is a cross-sectional view taken along the line X1-X1' of FIG. 18 which illustrates an example of a tiled display device.

FIG. 19 is a cross-sectional view taken along the line X1-X1' of FIG. 18 that illustrates an example of a tiled display device.

Referring to FIG. 19, a first display device 11 includes a first display module DPM1 and a first front cover COV1. A second display device 12 includes a second display module DPM2 and a second front cover COV2.

Each of the first display module DPM1 and the second display module DPM2 includes a substrate SUB, a thin film transistor layer TFTL, and a light-emitting element layer. A light-emitting element EL of the light-emitting element layer may be disposed on a pixel electrode AND, and a contact electrode CAND may be disposed between the light-emitting element EL and the pixel electrode AND. The light-emitting element EL may include a first semiconductor layer PSEM, an active layer MQW, and a second semiconductor layer NSEM. The first semiconductor layer PSEM, the active layer MQW, and the second semiconductor layer NSEM may be disposed on a base substrate BSUB. The second semiconductor layer NSEM of the light-emitting element EL may be connected to a cathode pad electrode CPD with a second contact electrode CTE2 interposed therebetween. The thin film transistor layer TFTL and the light-emitting element EL have been described in detail above with reference to FIGS. 13 to 16. In FIG. 19, descriptions overlapping those of the embodiment of FIGS. 13 to 16 will be omitted.

The substrate SUB may include a first surface 41 on which the thin film transistor layer TFTL is disposed, a second surface 42 opposite to the first surface, and a first side surface 43 disposed between the first surface 41 and the second surface 42. The first surface 41 may be a front surface or an upper surface of the substrate SUB, and the second surface 42 may be a rear surface or a lower surface of the substrate SUB.

In addition, the substrate SUB may further include a chamfer surface 44 disposed between the first surface 41 and the first side surface 43 and between the second surface 42 and the first side surface 43. The thin film transistor layer TFTL and the light-emitting element layer may not be disposed on the chamfer surface 44. Due to the chamfer surface 44, the substrate SUB of the first display device 11 and the substrate of the second display device 12 may be prevented from colliding with each other to be damaged.

The chamfer surface 44 may also be disposed between the first surface 41 and each of the other side surfaces excluding the first side surface 43 and between the second surface 42 and each of the other side surfaces excluding the first side surface 43. For example, when the first display device 11 and the second display device 12 have a rectangular planar shape as shown in FIG. 18, the chamfer surface 44 may be disposed between the first surface 41 and each of a second side surface, a third side surface, and a fourth side surface of the substrate SUB and between the second surface 42 and each of the second side surface, the third side surface, and the fourth side surface.

The first front cover COV1 may be disposed on the chamfer surface 44 of the substrate SUB. That is, the first front cover COV1 may protrude further than the substrate SUB in a first direction DR1 and a second direction DR2. Therefore, a distance GSUB between the substrate SUB of the first display device 11 and the substrate SUB of the second display device 12 may be longer than a distance GCOV between the first front cover COV1 and the second front cover COV2.

Each of the first front cover COV1 and the second front cover COV2 may include an adhesive member 51, a light transmittance adjustment layer 52 disposed on the adhesive member 51, and an anti-glare layer 53 disposed on the light transmittance adjustment layer 52.

The adhesive member 51 of the first front cover COV1 serves to attach the light-emitting element layer of the first display module DPM1 and the first front cover COV1. The adhesive member 51 of the second front cover COV2 serves to attach the light-emitting element layer of the second display module DPM2 and the second front cover COV2. The adhesive member 51 may be a transparent adhesive member capable of transmitting light. For example, the adhesive member 51 may be an optically clear adhesive film or an optically clear resin.

The anti-glare layer 53 may be designed to diffusely reflect external light to prevent the external light from being reflected without any change to degrade image visibility. Accordingly, a contrast ratio of images displayed by the first display device 11 and the second display device 12 may be increased due to the anti-glare layer 53.

The light transmittance adjustment layer 52 may be designed to reduce transmittance of external light or light reflected from the first display module DPM1 and the second display module DPM2. Accordingly, the distance GSUB between the substrate SUB of the first display module DPM1 and the substrate SUB of the second display module DPM2 may be prevented from being viewed from the outside.

The anti-glare layer 53 may be implemented as a polarization plate, and the light transmittance adjustment layer 52 may be implemented as a phase delay layer, but one or more embodiments of the present specification are not limited thereto.

Because an example of a tiled display device that is taken along the line X2-X2', line X3-X3', and line X4-X4' of FIG. 18 is substantially the same as an example of the tiled display device that is taken along the line X1-X1' described with reference to FIG. 19, descriptions thereof will be omitted.

Figure 20:
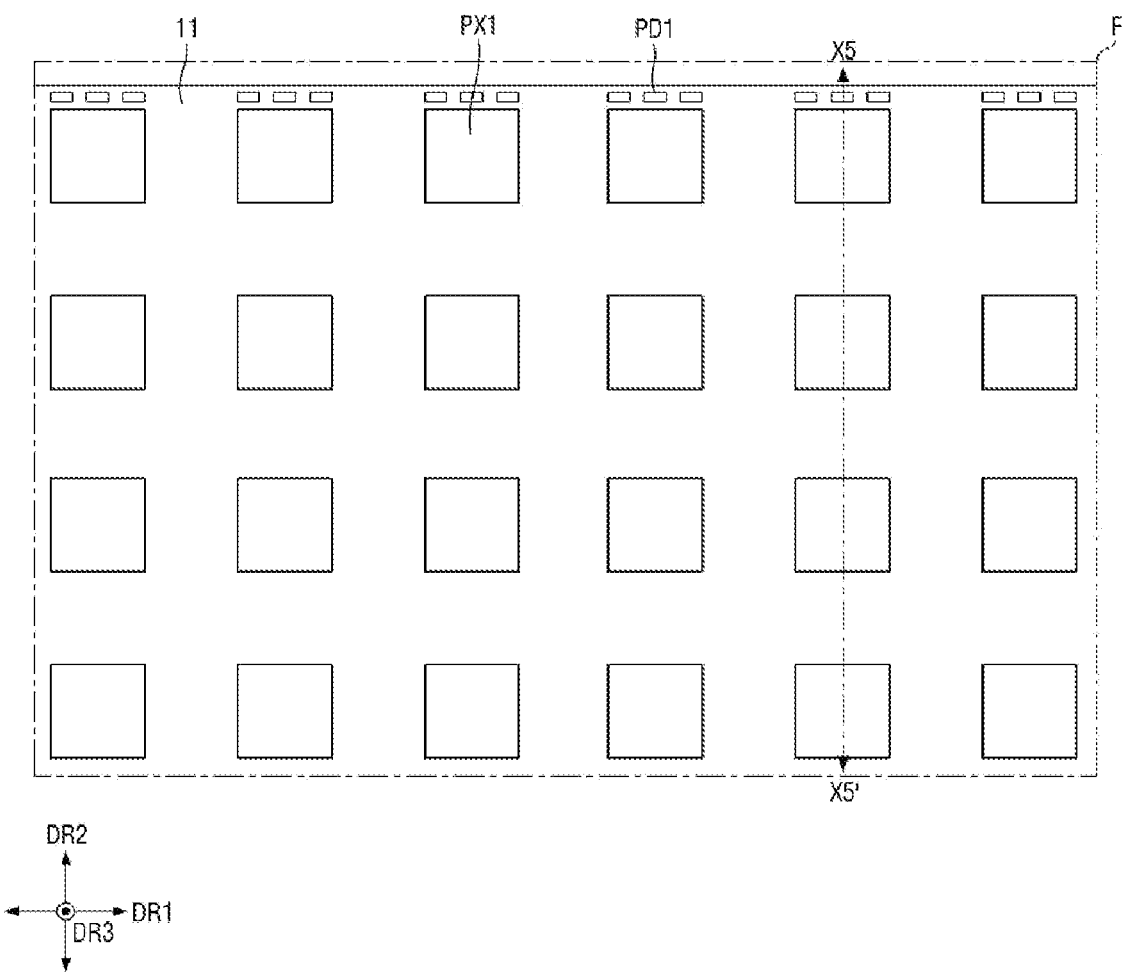
FIG. 20 is an enlarged layout illustrating an area F of FIG. 17 in detail.
Figure 21:
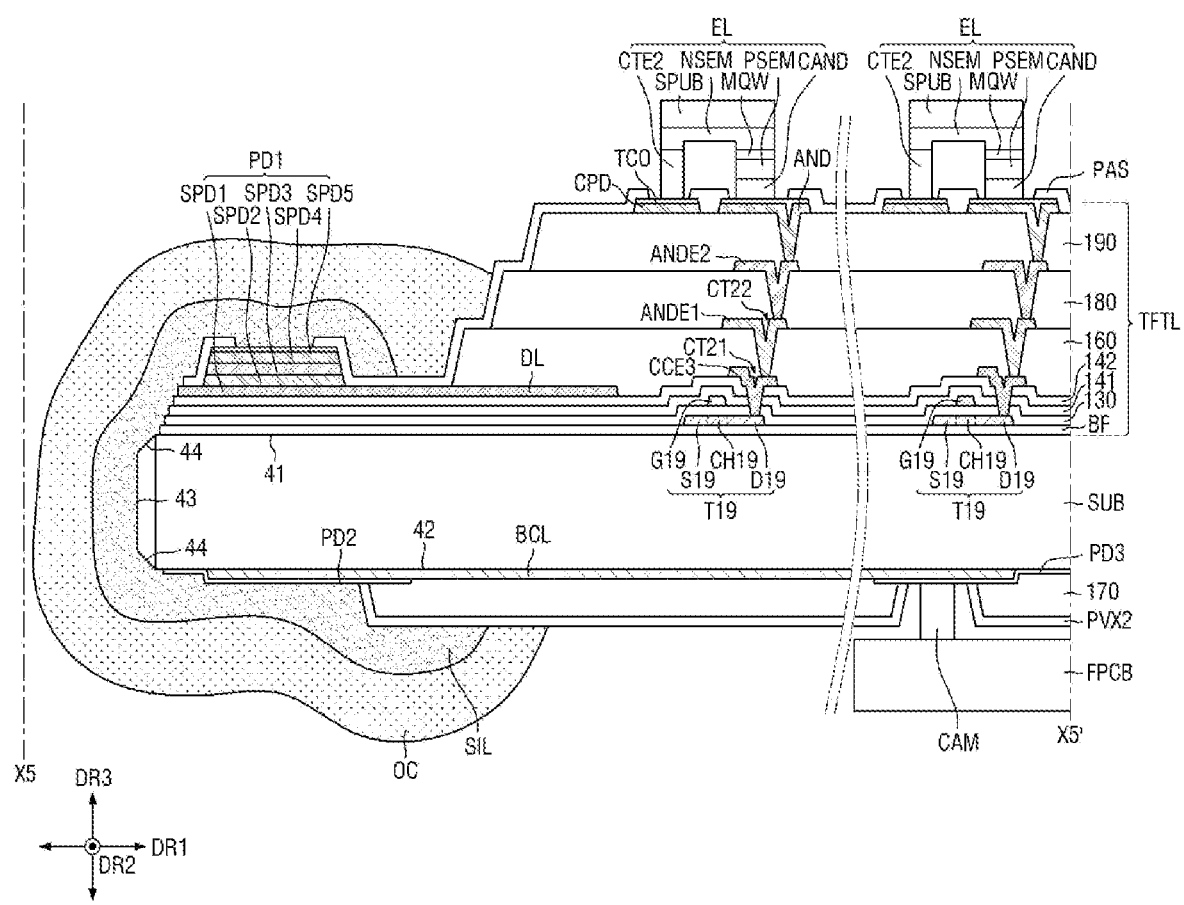
FIG. 21 is a cross-sectional view taken along the line X5-X5' of FIG. 20 that illustrates an example of a tiled display device.

FIG. 20 is an enlarged layout illustrating an area F of FIG. 17 in detail. FIG. 21 is a cross-sectional view taken along the line X5-X5' of FIG. 20 that illustrates an example of a tiled display device. In FIG. 21, descriptions overlapping those of the embodiment of FIGS. 13 to 16 will be omitted.

In FIG. 20, first pads PD1 disposed at an upper side of a first display device 11 and second subpixels GP of a first pixel PX1 are shown.

Referring to FIG. 20, the first pads PD1 may be disposed on an upper edge of the first display device 11. When data lines DL of the first display device 11 extend in a second direction DR2, the first pads PD1 may be disposed at upper and lower edges of the first display device 11. Alternatively, when the data lines DL of the first display device 11 extend in a first direction DR1, the first pads PD1 may be disposed at left and right edges of the first display device 11.

Referring to FIG. 21, each of the first pads PD1 may be connected to the data line DL. In addition, each of the first pads PD1 may be connected to a side line SIL. The side line SIL may be disposed on one side surface and a lower surface (or a rear surface) of a substrate SUB. The side line SIL may be connected to a rear connection line BCL on the lower surface of the substrate SUB.

The first pads PD1 may be disposed on a second interlayer insulating film 142. The first pads PD1 may be exposed without being covered by a first planarization film 160 and a second planarization film 180.

The first pad PD1 may include first to fifth sub-pads SPD1, SPD2, SPD3, SPD4, and SPD5. The second sub-pad SPD2 may be disposed on the first sub-pad SPD1, and the third sub-pad SPD3 may be disposed on the second sub-pad SPD2. The fourth sub-pad SPD4 may be disposed on the third sub-pad SPD3, and the fifth sub-pad SPD5 may be disposed on the fourth sub-pad SPD4. Although it is described that the first sub-pad SPD1 is included in a first source metal layer, the second sub-pad SPD2 is included in a second source metal layer, a third sub-pad SPD3 is included in a third source metal layer, the fourth sub-pad SDP4 is included in a fourth source metal layer, and the fifth sub-pad SPD5 is included in a transparent metal layer including a transparent metal material TCO, one or more embodiments of the present disclosure are not limited thereto.

The rear connection line BCL may be disposed on the lower surface of the substrate SUB. The rear connection line BCL may be formed as a single layer or a multi-layer made of any one selected from among molybdenum (Mo), aluminum (Al), chromium (Cr), gold (Au), titanium (Ti), nickel (Ni), neodymium (Nd), and copper (Cu), or an alloy thereof.

A second pad PD2 may be disposed at one end portion of the rear connection line BCL, and a third pad PD3 may be disposed at the other end portion of the rear connection line BCL. The second pad PD2 and the third pad PD3 may be made of a transparent conductive oxide such as ITO or IZO.

A fourth planarization film 170 may be disposed on the rear connection line BCL and the rear surface of the substrate SUB. The fourth planarization film 170 may be formed as an organic film made of acrylic resin, epoxy resin, phenolic resin, polyamide resin, polyimide resin, or the like.

A second protective film PVX2 may be disposed on the fourth planarization film 170. The second protective film PVX2 may be formed as an inorganic film, for example, a silicon nitride layer, a silicon oxynitride layer, a silicon oxide layer, a titanium oxide layer, or an aluminum oxide layer.

The side line SIL may be disposed on a first surface 41, a second surface 42, a first side surface 43, and first chamfer surfaces 44 of the substrate SUB. The side line SIL may be disposed on the first pad PD1 disposed at an edge of the first surface 41 of the substrate SUB and connected to the first pad PD1. The side line SIL may be disposed on the second pad PD2 disposed at an edge of the second surface 42 of the substrate SUB and connected to the second pad PD2. The side line SIL may be in contact with the first chamfer surfaces 44 and the first side surface 43 of the substrate SUB.

An overcoat layer OC may be disposed on the first surface 41, the first chamfer surfaces 44, the first side surface 43, and the second surface 42 of the substrate SUB. The overcoat layer OC may be disposed to cover the side line SIL. The overcoat layer OC may be formed as an organic film made of acrylic resin, epoxy resin, phenolic resin, polyamide resin, polyimide resin, or the like.

A circuit board FPCB may be disposed on the rear surface of the substrate SUB. The circuit board FPCB may be connected to the third pad PD3, which is exposed without being covered by the fourth planarization film 170 and the second protective film PVX2, using a conductive adhesive member CAM. The circuit board FPCB may be connected to the third pad PD3 through the conductive adhesive member CAM. The conductive adhesive member CAM may be an anisotropic conductive film or an anisotropic conductive paste.

Figure 22:
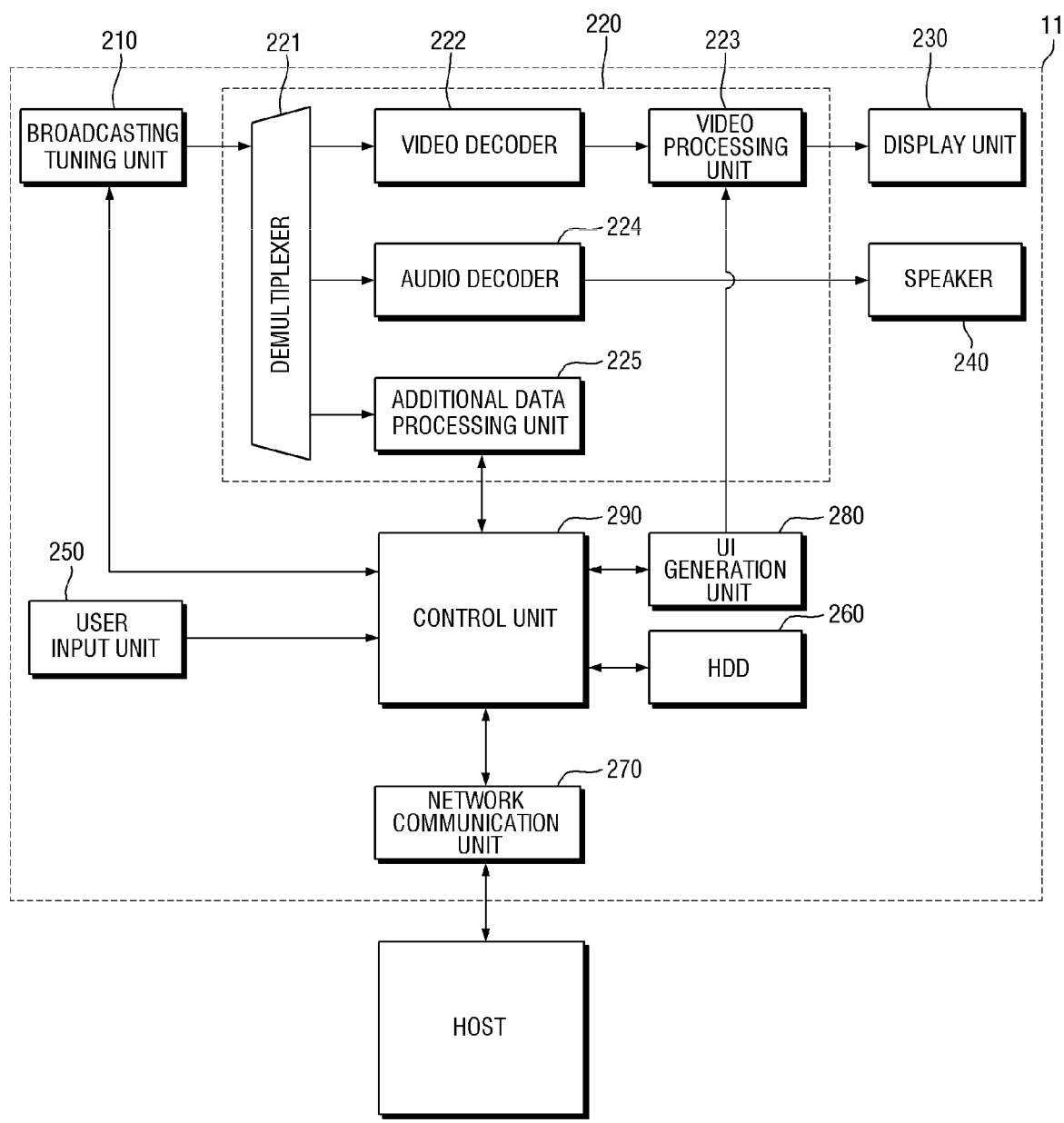
FIG. 22 is a block diagram illustrating a tiled display device according to one or more embodiments.

FIG. 22 is a block diagram illustrating a tiled display device according to one or more embodiments.

In FIG. 22, a first display device 11 and a host system HOST are illustrated for convenience of description.

Referring to FIG. 22, a tiled display device TD according to one or more embodiments may include the host system HOST, a broadcast tuning unit 210, a signal processing unit 220, a display unit 230, a speaker 240, a user input unit 250, a hard disk drive (HDD) 260, a network communication unit 270, a user interface (UI) generation unit 280, and a control unit 290.

The host system HOST may be implemented as any one of a TV system, a home theater system, a set-top box, a navigation system, a digital versatile disc (DVD) player, a Blu-ray player, a PC, a mobile phone system, and a tablet PC.

A command of a user may be input to the host system HOST in various formats. For example, a command may be input to the host system HOST through a touch of the user. Alternatively, a command of the user may be input to the host system HOST through a keyboard input or a button input of a remote controller.

The host system HOST may receive original video data corresponding to an original image from the outside. The host system HOST may divide the original video data according to the number of display devices. For example, in response to the first display device 11, a second display device 12, a third display device 13, and a fourth display device 14, the host system HOST may divide the original video data into first video data corresponding to a first image, second video data corresponding to a second image, third video data corresponding to a third image, and fourth video data corresponding to a fourth image. The host system HOST may transmit the first video data to the first display device 11, may transmit the second video data to the second display device 12, may transmit the third video data to the third display device 13, and may transmit the fourth video data to the fourth display device 14.

The first display device 11 may display the first image according to the first video data, the second display device 12 may display the second image according to the second video data, the third display device 13 may display the third image according to the third video data, and the fourth display device 14 may display the fourth image according to the fourth video data. Accordingly, the user may watch the original image in which the first to fourth images displayed on the first to fourth display devices 11, 12, 13, and 14 are combined.

The first display device 11 may include the broadcast tuning unit 210, the signal processing unit 220, the display unit 230, the speaker 240, the user input unit 250, the HDD 260, the network communication unit 270, the UI generation unit 280, and the control unit 290.

The broadcast tuning unit 210 may receive a broadcast signal of a corresponding channel through an antenna by tuning a certain channel frequency under the control of the control unit 290. The broadcast tuning unit 210 may include a channel detection module and a radio frequency (RF) demodulation module.

The broadcast signal demodulated by the broadcast tuning unit 210 is processed by the signal processing unit 220 and outputs to the display unit 230 and the speaker 240 via the signal processing unit 220. Here, the signal processing unit 220 may include a demultiplexer 221, a video decoder 222, a video processing unit 223, an audio decoder 224, and an additional data processing unit 225.

The demultiplexer 221 separates the demodulated broadcast signal into a video signal, an audio signal, and additional data. The separated video signal, audio signal, and additional data are restored by the video decoder 222, the audio decoder 224, and the additional data processing unit 225, respectively. In this case, the video decoder 222, the audio decoder 224, and the additional data processing unit 225 restore the video signal, the audio signal, and the additional data in a decoding format corresponding to an encoding format when the broadcast signal is transmitted.

In one or more embodiments, the decoded video signal is converted according to a vertical frequency, resolution, an aspect ratio, and the like, which meet an output standard of the display unit 230, by the video processing unit 223, and the decoded audio signal is output to the speaker 240.

The display unit 230 includes a display panel 100 on which an image is displayed and a panel driver for controlling the driving of the display panel 100. A detailed block diagram of the display panel 100 and the panel driver has been described in detail above with reference to FIG. 4.

The user input unit 250 may receive a signal transmitted by the host system HOST. The user input unit 250 may be provided to input data related to selection of a channel transmitted by the host system HOST and selection and operation of a UI menu as well as data related to user selection and input of a command related to communication with other display devices 12 to 14.

The HDD 260 may store operating system (OS) programs, various software programs, recorded broadcast programs, videos, photos, and other pieces of data and may include a storage medium such as a hard disk or a nonvolatile memory.

The network communication unit 270 may perform short-distance communication with the host system HOST and other display devices 12 to 14 and may be implemented as a communication module including an antenna pattern capable of implementing mobile communication, data communication, Bluetooth, RF, Ethernet, and the like.

The network communication unit 270 may also transmit/receive wireless signals to/from at least one of a base station, an external mobile terminal, and a server through an antenna pattern to be described below on a mobile communication network that is constructed according to technical standards or communication methods for mobile communications (for example, a global system for mobile communication (GSM), code division multi access (CDMA), code division multi access 2000 (CDMA2000), enhanced voice-data optimized or enhanced voice-data only (EV-DO), wideband CDMA (WCDMA), high speed downlink packet access (HSDPA), high speed uplink packet access (HSUPA), long term evolution (LTE), and long term evolution-advanced (LTE-A)).

The network communication unit 270 may transmit/receive a wireless signal on a communication network according to wireless Internet technologies through the antenna pattern to be described below. The wireless Internet technologies may include, for example, a wireless LAN (WLAN), wireless-fidelity (Wi-Fi), Wi-Fi direct, digital living network alliance (DLNA), wireless broadband (WiBro), world interoperability for microwave access (WiMAX), HSDPA, HSUPA, LTE, and LTE-A. The antenna pattern transmits/receives data according to at least one wireless Internet technology among the above-described Internet technologies and Internet technologies that are not listed above.

The UI generation unit 280 may generate a UI menu for communication with the host system HOST and other display devices 12 to 14 and may be implemented using an algorithm code and an on-screen display integrated circuit (OSD IC). The UI menu for communication with the host system HOST and other display devices 12 to 14 may be a menu for designating a counterpart digital TV desiring communication and selecting a desired function.

The control unit 290 may serve to perform the overall control of the first display device 1 and to control communication of the host system HOST and the second to fourth display devices 12, 13, and 14 and may be implemented as a microcontroller unit (MCU) that stores a corresponding algorithm code for control and executes the stored algorithm code.

The control unit 290 controls and transmits corresponding control commands and data to the host system HOST and the second to fourth display devices 12, 13, and 14 through the network communication unit 270 according to an input and selection through the user input unit 250. Of course, when certain control commands and data are input from the host system HOST and the second to fourth display devices 12, 13, and 14, the control unit 290 performs an operation according to the corresponding control commands.

Because a block diagram of the second display device 12, a block diagram of the third display device 13, and a block diagram of the fourth display device 14 are substantially the same as a block diagram of the first display device 11 described with reference to FIG. 4, descriptions thereof will be omitted.

However, the aspects and features of embodiments of the present disclosure are not restricted to the one set forth herein. The above and other aspects of the present disclosure will become more apparent to one of daily skill in the art to which the present disclosure pertains by referencing the claims, with functional equivalents thereof to be included therein.

What is claimed is:

1. A display device comprising:
a scan write line configured to receive a scan write signal;
a scan initialization line configured to receive a scan initialization signal;
a sweep signal line configured to receive a sweep signal;
a first data line configured to receive a first data voltage;
a second data line configured to receive a second data voltage; and
a subpixel connected to the scan write line, the scan initialization line, the sweep signal line, the first data line, and the second data line, wherein:
the subpixel comprises a light-emitting element, a first pixel driver comprising a first transistor configured to generate a control current according to the first data voltage of the first data line, a second pixel driver comprising an eighth transistor configured to generate a driving current applied to the light-emitting element according to the second data voltage of the second data line, and a third pixel driver configured to control a period in which the driving current is applied to the light-emitting element according to the control current of the first pixel driver;
the third pixel driver comprises a fifteenth transistor electrically connected to one electrode of the eighth transistor; and
the display device further comprises a bridge electrode connecting the one electrode of the eighth transistor and one electrode of the fifteenth transistor that are spaced from each other, the bridge electrode being at a different layer from at least one of the eighth transistor or the fifteenth transistor, wherein:
the one electrode of the eighth transistor is connected to the bridge electrode through a first bridge connection electrode;
the one electrode of the fifteenth transistor is connected to the bridge electrode through a fourth bridge connection electrode, and
the first bridge connection electrode is located between the sweep signal line and the scan write line.

2. The display device of claim 1, further comprising:
a scan control line configured to receive a scan control signal; and
a gate-off voltage line configured to receive a gate-off voltage,
wherein the scan control line, the sweep signal line, and the gate-off voltage line are located between the one electrode of the eighth transistor and the one electrode of the fifteenth transistor.

3. The display device of claim 2, wherein the first pixel driver further comprises a seventh transistor configured to connect the sweep signal line to the gate-off voltage line according to the scan control signal, and
wherein the bridge electrode overlaps the sweep signal line, the gate-off voltage line, and the scan control line.

4. The display device of claim 1, wherein:
the scan write line and the scan initialization line extend in a first direction;

the first data line and the second data line extend in a second direction intersecting the first direction; and
the bridge electrode extends in the second direction.

5. The display device of claim 1, further comprising:
a second emission line configured to receive a second emission signal; and
a scan control line configured to receive a scan control signal, wherein:
the third pixel driver comprises a seventeenth transistor comprising a gate electrode connected to the second emission line and an eighteenth transistor configured to connect a first electrode of the light-emitting element to an initialization voltage line according to the scan control signal; and
one electrode of the seventeenth transistor is spaced from one electrode of the eighteenth transistor.

6. The display device of claim 5, further comprising a seventh connection electrode electrically connecting the one electrode of the seventeenth transistor and the one electrode of the eighteenth transistor.

7. The display device of claim 6, wherein the seventh connection electrode is electrically connected to the first electrode of the light-emitting element.

8. The display device of claim 5, further comprising an eighth connection electrode connecting the other electrode of the fifteenth transistor and the one electrode of the seventeenth transistor.

9. The display device of claim 1, further comprising:
a first emission line configured to receive a first emission signal;
a second power line configured to receive a second power voltage;
a fifth connection electrode connected to the second power line to receive the second power voltage; and
a twelfth transistor configured to connect the second power line to the eighth transistor according to the first emission signal,
wherein one electrode of the twelfth transistor is connected to the fifth connection electrode through a plurality of contact holes.

10. The display device of claim 9, wherein:
the first emission line extends in a first direction; and
the other electrode of the twelfth transistor extends in a second direction intersecting the first direction to overlap the first emission line.

11. The display device of claim 1, wherein the light-emitting element is a flip chip type micro light-emitting diode element.

12. A tiled display device comprising:
a plurality of display devices; and
a connection member located between the plurality of display devices, wherein:
a first display device of the plurality of display devices comprises a substrate, a scan write line configured to receive a scan write signal, a scan initialization line configured to receive a scan initialization signal, a sweep signal line configured to receive a sweep signal, a first data line configured to receive a first data voltage, a second data line configured to receive a second data voltage configured to receive, and a subpixel connected to the scan write line, the scan initialization line, the sweep signal line, the first data line, and the second data line, wherein the scan write line, the scan initialization line, the sweep signal line, the first data line, and the second data line are on a first surface of the substrate;
the subpixel comprises a light-emitting element, a first pixel driver comprising a first transistor configured to generate a control current according to the first data voltage of the first data line, a second pixel driver comprising an eighth transistor configured to generate a driving current applied to the light-emitting element according to the second data voltage of the second data line, and a third pixel driver configured to control a period in which the driving current is applied to the light-emitting element according to the control current of the first pixel driver, wherein the third pixel driver comprises a fifteenth transistor electrically connected to one electrode of the eighth transistor; and
the first display device further comprises:
a bridge electrode connecting the one electrode of the eighth transistor and one electrode of the fifteenth transistor that are spaced from each other, the bridge electrode being at a different layer from at least one of the eighth transistor or the fifteenth transistor;
a scan control line configured to receive a scan control signal; and
a gate-off voltage line configured to receive a gate-off voltage, and
wherein the scan control line, the sweep signal line, and the gate-off voltage line are located between the one electrode of the eighth transistor and the one electrode of the fifteenth transistor.

13. The tiled display device of claim 12, wherein the light-emitting element is a flip chip type micro light-emitting diode element.

14. The tiled display device of claim 12, wherein the substrate comprises glass.

15. The tiled display device of claim 12, wherein the first display device further comprises:
a pad on the first surface of the substrate; and
a side line on the first surface of the substrate, a second surface opposite to the first surface, and one side surface between the first surface and the second surface and connected to the pad.

16. The tiled display device of claim 15, wherein:
the first display device further comprises a connection line on the second surface of the substrate and a flexible film connected to the connection line through a conductive adhesive member; and
the side line is connected to the connection line.

17. The tiled display device of claim 12, wherein the plurality of display devices is arranged in a matrix form in M rows and N columns.

* * * * *